United States Patent
Hotta

(10) Patent No.: US 11,011,499 B2
(45) Date of Patent: May 18, 2021

(54) STACKED DEVICE, STACKED STRUCTURE, AND METHOD OF MANUFACTURING STACKED DEVICE

(71) Applicant: FUJIFILM Corporation, Tokyo (JP)

(72) Inventor: Yoshinori Hotta, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/534,464

(22) Filed: Aug. 7, 2019

(65) Prior Publication Data
US 2019/0363068 A1  Nov. 28, 2019

Related U.S. Application Data

(63) Continuation of application No. PCT/JP2018/008902, filed on Mar. 8, 2018.

(30) Foreign Application Priority Data

Mar. 21, 2017 (JP) .............................. JP2017-054444
Sep. 5, 2017 (JP) .............................. JP2017-170074

(51) Int. Cl.
*H01L 21/76* (2006.01)
*H01L 25/00* (2006.01)
(Continued)

(52) U.S. Cl.
CPC .......... *H01L 25/0657* (2013.01); *H01L 24/32* (2013.01); *H01L 25/50* (2013.01); *H01L 2224/32148* (2013.01)

(58) Field of Classification Search
CPC ..... H01L 25/0657; H01L 25/50; H01L 24/32; H01L 2224/32148; H01L 2224/80896; H01L 2224/80895
(Continued)

(56) References Cited

U.S. PATENT DOCUMENTS

2010/0044856 A1* 2/2010 Sri-Jayantha ........... H01L 23/10
257/717
2010/0163090 A1* 7/2010 Liu ..................... H01L 23/3675
136/224
(Continued)

FOREIGN PATENT DOCUMENTS

JP  2002-170924 A  6/2002
JP  2003-109691 A  4/2003
(Continued)

OTHER PUBLICATIONS

Notification of Reason for Refusal dated Aug. 20, 2020, from the Korean Intellectual Property Office in Application No. 10-2019-7024581.
(Continued)

*Primary Examiner* — Sheikh Maruf
(74) *Attorney, Agent, or Firm* — Sughrue Mion, PLLC

(57) ABSTRACT

A stacked device includes a stacked structure in which a plurality of semiconductors are electrically connected to each other, the semiconductor includes a surface on which a plurality of terminals are provided, the plurality of terminals include a terminal that bonds and electrically connects the semiconductors to each other and a terminal that bonds the semiconductors to each other and does not electrically connect the semiconductors to each other, an area ratio of the plurality of terminals on the surface of the semiconductor is 40% or higher, and an area ratio of the terminals that bond and electrically connect the semiconductors to each other among the plurality of terminals is lower than 50%.

11 Claims, 17 Drawing Sheets

(51) Int. Cl.
*H01L 25/065* (2006.01)
*H01L 23/00* (2006.01)

(58) Field of Classification Search
USPC .......................................................... 257/686
See application file for complete search history.

(56) References Cited

U.S. PATENT DOCUMENTS

| | | | |
|---|---|---|---|
| 2011/0018119 A1* | 1/2011 | Kim .................. | H01L 24/17 257/690 |
| 2011/0101349 A1* | 5/2011 | Oda .................. | H01L 23/3675 257/48 |
| 2011/0215457 A1* | 9/2011 | Park .................. | H01L 23/3677 257/686 |
| 2011/0291261 A1* | 12/2011 | Fleischman ........ | H01L 24/06 257/737 |
| 2011/0304036 A1* | 12/2011 | Son ................... | H01L 23/3675 257/693 |
| 2012/0056333 A1* | 3/2012 | Sasaki ............... | H01L 24/94 257/777 |
| 2012/0313259 A1* | 12/2012 | Sasaki ............... | H01L 25/0657 257/777 |
| 2013/0020723 A1* | 1/2013 | Sasaki ............... | H01L 23/5389 257/777 |
| 2013/0285248 A1* | 10/2013 | Yin .................... | H01L 23/49866 257/762 |
| 2013/0308278 A1 | 11/2013 | Matsumoto | |
| 2015/0155255 A1* | 6/2015 | Aoki .................. | H01L 23/49894 257/737 |
| 2015/0200008 A1* | 7/2015 | Ozawa ............... | H01L 23/49838 365/185.08 |
| 2015/0221584 A1* | 8/2015 | Lopez ................ | H01L 24/40 257/676 |
| 2015/0278417 A1* | 10/2015 | Matsumoto ........ | G06F 30/367 703/14 |
| 2015/0279759 A1* | 10/2015 | Miyakoshi ......... | H01L 24/13 257/738 |
| 2016/0027715 A1* | 1/2016 | Watanabe ........... | H01L 23/3733 361/719 |
| 2016/0079208 A1* | 3/2016 | Heo ................... | H01L 23/3677 257/737 |
| 2019/0027457 A1* | 1/2019 | Lin .................... | H01L 24/83 |
| 2019/0051634 A1* | 2/2019 | Park .................. | H01L 25/043 |
| 2020/0381379 A1* | 12/2020 | Chen ................. | H01L 24/32 |

FOREIGN PATENT DOCUMENTS

| | | | |
|---|---|---|---|
| JP | 2003109691 A | * | 4/2003 |
| JP | 2013-521661 A | | 6/2013 |
| JP | 2013-229548 A | | 11/2013 |
| JP | 2013-243263 A | | 12/2013 |
| JP | 2015-106617 A | | 6/2015 |
| JP | 2015-135875 A | | 7/2015 |
| JP | 2015-195368 A | | 11/2015 |
| JP | 2016-025294 A | | 2/2016 |

OTHER PUBLICATIONS

International Search Report dated Jun. 5, 2018, issued by the International Searching Authority in corresponding application No. PCT/JP2018/008902.
Written Opinion dated Jun. 5, 2018, issued by the International Searching Authority in corresponding application No. PCT/JP2018/008902.
International Preliminary Report on Patentability dated Sep. 24, 2019, issued by the International Bureau in corresponding application No. PCT/JP2018/008902.
Office Action dated May 19, 2020 in Japanese Application No. 2019-507524.
Office Action dated Dec. 21, 2020 in Taiwanese Application No. 107109355 English Translation.

* cited by examiner

STACKED DEVICE, STACKED STRUCTURE, AND METHOD OF MANUFACTURING STACKED DEVICE

CROSS-REFERENCE TO RELATED APPLICATIONS

This application is a Continuation of PCT International Application No. PCT/JP2018/008902 filed on Mar. 8, 2018, which claims priority under 35 U.S.C. § 119(a) to Japanese Patent Application No. 2017-054444 filed on Mar. 21, 2017 and Japanese Patent Application No. 2017-170074 filed on Sep. 5, 2017. Each of the above application(s) is hereby expressly incorporated by reference, in its entirety, into the present application.

BACKGROUND OF THE INVENTION

1. Field of the Invention

The present invention relates to a stacked device in which a plurality of semiconductor elements or the like are stacked, a stacked structure, and a method of manufacturing the stacked device. In particular, the present invention relates to a stacked device including a terminal that is electrically connected to a semiconductor element or the like and a terminal that is not electrically connected to a semiconductor element or the like, a stacked structure, and a method of manufacturing a stacked device.

2. Description of the Related Art

Currently, the downsizing of an electronic component such as a semiconductor element has been remarkable. For electric connection to a semiconductor element or the like, for example, wire bonding, flip chip bonding, or thermocompression bonding is used.

Further, electronic components have been reduced in size or have been increased in density by laminating and arranging a plurality of semiconductor elements or the like. In a case where semiconductor elements or the like are stacked as described above, heat generated from one semiconductor element causes malfunction of another semiconductor element.

On the other hand, JP2016-025294A and JP2015-195368A disclose a stacked semiconductor package in which heat transfer from a chip in a bottom package to a chip in a top package is alleviated.

The stacked semiconductor package disclosed in JP2016-0252944 includes: a first semiconductor package including a first circuit board and a first semiconductor element mounted on the first circuit board; a second semiconductor package including a second circuit board and a second semiconductor element mounted on the second circuit board, the second semiconductor package being stacked on the first semiconductor package; and a heat transfer material provided over the first semiconductor element and a part of the first circuit board, the part being around the first semiconductor device.

The stacked semiconductor package disclosed in JP 2015-195368A includes: a first semiconductor package including a first circuit board and a first semiconductor element mounted on the first circuit board; a second semiconductor package including a second circuit board and a second semiconductor element mounted on the second circuit board, the second semiconductor package being stacked on the first semiconductor package; a sealing resin sealing the first semiconductor element; a conductive layer located in contact with the sealing resin; and a thermal via connected to the conductive layer and located on the first circuit board.

In addition to JP2016-025294A and JP2015-195368A, as a semiconductor device in which semiconductor elements are 3D stacked, JP2002-170924A describes a stacked semiconductor device including: a plurality of semiconductor devices that are stacked, each of the semiconductor devices including a wiring substrate that includes a conductor layer in an insulating substrate and a semiconductor element that is provided on a surface of the insulating substrate; a plurality of connection terminals that are provided between upper and lower semiconductor devices and on a lower surface of a lowermost semiconductor device and are electrically connected to the conductor layers of the wiring substrates; and a plurality of auxiliary connection terminals that are provided on an outer peripheral portion of the connection terminal group and are not electrically connected to the conductor layers of the wiring substrates.

In addition, JP2013-229548A describes an electronic component-embedded substrate in which heat generated from a semiconductor chip can be efficiently dissipated. The electronic component-embedded substrate described in JP2013-229548A includes: a stacked structure in which a plurality of insulating layers and a plurality of wiring layers each of which includes a wiring pattern are alternately stacked; a semiconductor chip that is placed on a surface of the stacked structure such that a back surface thereof is in contact with the stacked structure; and a first via conductor that penetrates the stacked structure to be in contact with the back surface of the semiconductor chip and the wiring pattern included in each of the wiring layers.

JP2013-521661A describes a configuration in which, in order to improve heat dissipation, a dummy through-silicon via structure having an appropriate depth is positioned over or below a specified active circuit at a predetermined device layer in a 3D stacked integrated circuit.

SUMMARY OF THE INVENTION

In the stacked semiconductor package disclosed in JP2016-025294A and JP2015-195368A, heat transfer from a chip in a bottom package to a chip in a top package is alleviated such that malfunction is suppressed. However, currently, in addition to the alleviation of the heat transfer, it is required to secure a bonding strength between semiconductor elements. In JP2016-025294A, JP2015-195368A, JP2002-170924A, JP2013-229548A, and JP2013-521661A, the alleviation of the heat transfer and the securing of the bonding strength cannot be simultaneously satisfied.

An object of the present invention is to solve the above-described problem based on the technique of the related art and to provide a stacked device in which a bonding strength is secured and heat dissipation is excellent, a stacked structure, and a method of manufacturing a stacked device.

According to a first aspect of the present invention for achieving the above-described object, there is provided a stacked device comprising: a stacked structure in which a plurality of semiconductors are electrically connected to each other, in which the semiconductor includes a surface on which a plurality of terminals are provided, the plurality of terminals include a terminal that bonds and electrically connects the semiconductors to each other and a terminal that bonds the semiconductors to each other and does not electrically connect the semiconductors to each other, an area ratio of the plurality of terminals on the surface of the semiconductor is 40% or higher, and an area ratio of the terminals that bond and electrically connect the semiconductors to each other among the plurality of terminals is lower than 50%.

The semiconductor may include an insulating layer on the surface where the plurality of terminals are provided, and a height from the surface of the semiconductor where the plurality of terminals are provided to a surface of the terminal may be higher than a height from the surface of the semiconductor where the plurality of terminals are provided to a surface of the insulating layer by 200 nm to 1 µm. In addition, the plurality of terminals may be directly bonded to each other.

It is preferable that the plurality of terminals are bonded through an anisotropic conductive member having a conductive path that extends in a stacking direction, and it is preferable that the conductive path has a diameter of 100 nm or less.

The anisotropic conductive member includes an insulating substrate and plural of the conductive paths that penetrate the insulating substrate in a thickness direction and are provided in a state where the conductive paths are electrically insulated from each other.

In addition, it is preferable that the stacked device further comprises an interposer.

According to a second aspect of the present invention, there is provided a stacked structure comprising: a plurality of semiconductors that are electrically connected to each other, in which the semiconductor includes a surface on which a plurality of terminals are provided, the plurality of terminals include a terminal that bonds and electrically connects the semiconductors to each other and a terminal that bonds the semiconductors to each other and does not electrically connect the semiconductors to each other, an area ratio of the plurality of terminals on the surface of the semiconductor is 40% or higher, and an area ratio of the terminals that bond and electrically connect the semiconductors to each other among the plurality of terminals is lower than 50%.

The semiconductor may include an insulating layer on the surface where the plurality of terminals are provided, and a height from the surface of the semiconductor where the plurality of terminals are provided to a surface of the terminal may be higher than a height from the surface of the semiconductor where the plurality of terminals are provided to a surface of the insulating layer by 200 nm to 1 µm. In addition, the plurality of terminals may be directly bonded to each other.

It is preferable that the plurality of terminals are bonded through an anisotropic conductive member having a conductive path that extends in a stacking direction, and it is preferable that the conductive path has a diameter of 100 nm or less.

The anisotropic conductive member includes an insulating plural of the conductive paths that penetrate the insulating substrate in a thickness direction and are provided in a state where the conductive paths are electrically insulated from each other.

In addition, it is preferable that the stacked device further comprises an interposer.

In addition, according to a third aspect of the present invention, there is provided a method of manufacturing the stacked device according to the first aspect, the method comprising: temporarily bonding the respective semiconductors; and collectively bonding all the semiconductors.

According to the present invention, a bonding strength is secured, and heat dissipation is excellent.

DESCRIPTION OF THE PREFERRED EMBODIMENTS

Hereinafter, a stacked device according to the present invention and a method of manufacturing the stacked device will be described in detail based on a preferred embodiment illustrated in the accompanying drawings.

The drawings described below are exemplary drawings for describing the present invention, and the present invention is not limited to the drawings described below.

In the following description, a numerical range indicated by the expression "to" includes numerical values described on both sides. For example, in a case where $\varepsilon$ is a numerical value $\alpha\alpha$ to a numerical value $\beta$, the range $\varepsilon$ is a range including the numerical value $\alpha$ and the numerical value $\beta$, which is expressed by a mathematical symbol $\alpha \leq \varepsilon \leq \beta$.

Unless specified otherwise, the meaning of an angle such as "parallel" or "perpendicular" includes a case where an error range is generally allowable in the technical field. In addition, the meaning of "entire surface" includes a case where an error range is generally allowable in the technical field.

Figure 1:
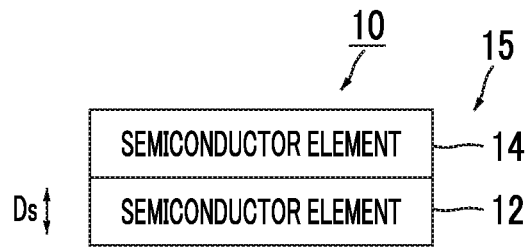
FIG. 1 is a schematic diagram illustrating a first example of a stacked device according to an embodiment of the present invention.
Figure 2:
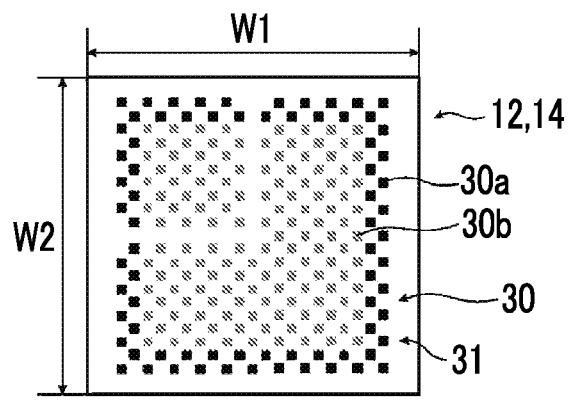
FIG. 2 is a schematic plan view illustrating an example of the arrangement of terminals of semiconductor elements in the stacked device according to the embodiment of the present invention.
Figure 3:
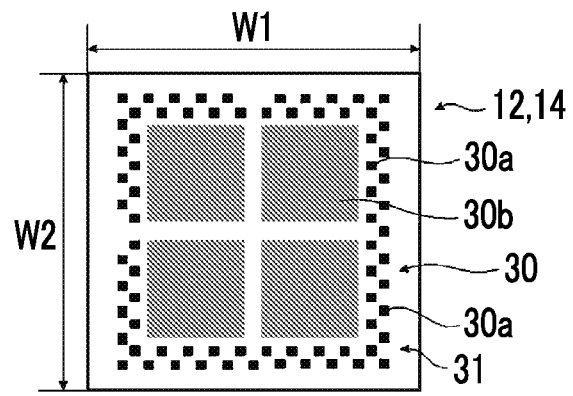
FIG. 3 is a schematic plan view illustrating another example of the arrangement of the terminals of the semiconductor elements in the stacked device according to the embodiment of the present invention.

FIG. 1 is a schematic diagram illustrating a first example of a stacked device according to an embodiment of the present invention. FIG. 2 is a schematic plan view illustrating an example of the arrangement of terminals of semiconductor elements in the stacked device according to the embodiment of the present invention. FIG. 3 is a schematic plan view illustrating another example of the arrangement of the terminals of the semiconductor elements in the stacked device according to the embodiment of the present invention.

The stacked device includes a stacked structure in which a plurality of semiconductors are electrically connected to each other. The stacked device includes a stacked structure according to the embodiment of the present invention as a part or the whole of the configuration. For example, the stacked device is completed as a single device and exhibits a specific function alone.

In the present invention, examples of the semiconductor include a semiconductor element, a circuit element, and a sensor element, and examples of the semiconductor element include a passive element and an active element. This way, in the present invention, the semiconductor does not refer to a semiconductor as a material.

In a stacked device 10 illustrated in FIG. 1, for example, a semiconductor element 12 and a semiconductor element 14 are stacked and bonded in a stacking direction Ds and are directly and electrically connected to each other. For example, the sizes of the semiconductor element 12 and the semiconductor element 14 are the same. The semiconductor element 12 and the semiconductor element 14 that are stacked constitute a stacked structure 15 in which a plurality of semiconductors are electrically connected to each other. The stacked structure 15 exhibits the same effect as the stacked device 10.

FIG. 2 is a schematic plan view illustrating the semiconductor elements 12 and 14 and illustrates a plan view of the semiconductor elements 12 and 14. Each of the semiconductor elements 12 and 14 includes a surface on which a plurality of terminals 30 are provided. The plurality of terminals 30 are bonded in a state where the semiconductors are arranged to face each other. The terminals 30 include: a terminal 30a that bonds and electrically connects the semiconductor elements 12 and 14 to each other and a terminal 30b that bonds the semiconductor elements 12 and 14 to each other and does not electrically connect the semiconductor elements 12 and 14 to each other (bonds but does not electrically connect the semiconductor elements 12 and 14). The terminal 30a is provided to extract a signal of the semiconductor elements 12 and 14 to the outside. The terminal 30b is provided to dissipate heat generated from the semiconductor elements 12 and 14 to the outside and to maintain the bonding strength of the stacked device 10.

"Being directly and electrically connected" described above represents a state where the terminals 30 of the semiconductor element 12 and the terminals 30 of the semiconductor element 14 are directly electrically connected.

In addition, for example, the terminal 30a that bonds and electrically connects the semiconductor elements 12 and 14 to each other and the terminal 30b that does not electrically connect the semiconductor elements 12 and 14 have the same shape and size.

In the semiconductor elements 12 and 14 of the stacked device 10, an area ratio of the terminals 30 on a surface 31 including the terminals 30 in a plan view is 40% or higher.

The area ratio of the terminals 30 on the surface 31 including the terminals 30 in a plan view will also be simply referred to as "area ratio".

In the semiconductor element 12 and the semiconductor element 14, among the plurality of terminals 30, an area ratio of the terminals 30a is lower than 50%, the terminals 30a being the terminals 30 of one semiconductor element 12 or 14 electrically connected to the terminals 30 of another semiconductor element 12 or 14. As a result, in the stacked device 10, the bonding strength is secured, and the heat dissipation is excellent. Further, since the heat dissipation is excellent, an increase in the temperature of the semiconductor such as the semiconductor elements 12 and 14 is suppressed, and the reliability of the stacked device 10 is also improved.

The bonding strength refers to a peel strength of a bonded interface between the semiconductor element 12 and the semiconductor element 14 and is evaluated based on a shear strength.

In a broad sense, the heat dissipation represents properties in which heat generated in a case where the stacked semiconductor elements are driven is dissipated from the stacked element surface. In the present invention, heat dissipation refers to properties in a narrow sense, mainly refers to heat transference between the semiconductor elements in the stacked portion, and is measured and evaluated using a steady state one-dimensional heat flow method.

In the semiconductor elements 12 and 14, the area ratio of the plurality of terminals on the surface on which the plurality of terminals are provided is 40% or higher, and the area ratio of the terminals that bond and electrically connect the semiconductors to each other among the plurality of terminals is lower than 50%. In the semiconductor elements 12 and 14, in a case where the area ratio of the terminals 30 on the surface 31 including the terminals 30 in a plan view is lower than 40%, it is difficult to secure the bonding strength between the semiconductor elements 12 and 14. On the other hand, in a case where the area ratio of the terminals 30a that electrically connect the semiconductor elements 12 and 14 to each other is higher than 50%, the heat dissipation deteriorates.

The arrangements of the terminals 30 in the semiconductor element 12 and the semiconductor element 14 may be the same as each other as long as they satisfy the area ratio of the terminals 30a.

The area ratio of the plurality of terminals on the surface on which the plurality of terminals of the semiconductors are provided refers to a ratio of a total area Sm of the terminals 30 in a plan view to an area S of the surface 31 including the terminals 30 in each of the semiconductor elements 12 and 14. In a case where the area ratio is represented by Sr, Sr=Sm/S. The upper limit value of the area ratio Sr is not particularly limited and is appropriately determined according to the specification or the like of the semiconductor elements 12 and 14.

In the semiconductor elements 12 and 14, in a case where the shape of the semiconductor elements 12 and 14 in a plan view is quadrangular as illustrated in FIG. 2, the area S of the surface (surface including an electrode) on which the plurality of terminals are provided is represented by S=W1× W2, where W1 represents the length of one set of sides parallel to each other, and W2 represents the length of the remaining set of sides parallel to each other.

In addition, the area ratio of the terminals 30a refers to a ratio of a total area Sa of the terminals 30a in a plan view to the total area Sm of the terminals 30 in a plan view. In a case where the area ratio of the terminals 30a is represented by Sd, Sd=Sa/Sm. The lower limit value of the area ratio Sd of the terminals 30a is appropriately determined according to the specification or the like of the semiconductor elements 12 and 14 and is not particularly limited. The lower limit value of the area ratio Sd of the terminals 30a is preferably 1%.

The area of the terminals 30a and the area of the terminals 30b can be obtained by acquiring an image of the terminals 30a and the terminals 30b, acquiring contours of the terminals 30a and contours of the terminals 30b by image analysis, and obtaining areas of ranges surrounded by the contours.

The area ratio Sr and the area ratio Sd of the terminals 30a are defined based on the bonded interface of semiconductor element 12 and the semiconductor element 14. Therefore, in a case where the sizes of the semiconductor elements 12 and 14 are different from each other, the area ratio Sr and the area ratio Sd of the terminals 30a in a smaller semiconductor element as a reference in a plan view are determined.

The terminals 30a and the terminals 30b are not necessarily to have the same shape and size. As long as the area ratio Sd of the terminals 30a is satisfied, the size of the terminals 30b may be more than that of the terminals 30a as illustrated in FIG. 3. In FIG. 3, the same structures in the semiconductor elements 12 and 14 illustrated in FIG. 2 are represented by the same reference numerals, and the detailed description thereof will not be repeated.

Figure 4:
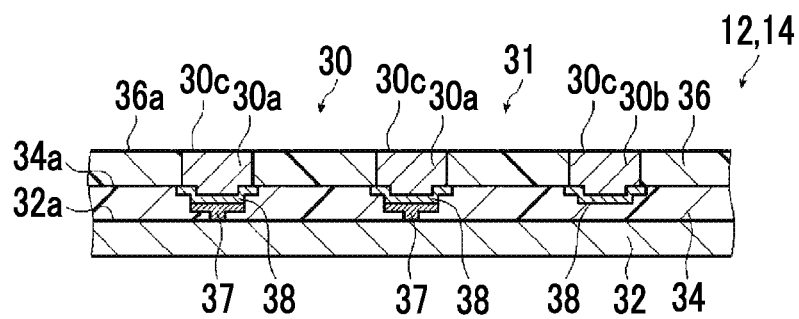
FIG. 4 is a schematic cross-sectional view illustrating an example of a configuration of the terminals of the semiconductor elements in the stacked device according to the embodiment of the present invention.

For example, the terminals 30 may have a configuration illustrated in FIG. 4. As illustrated in FIG. 4, each of the semiconductor elements 12 and 14 includes a semiconductor layer 32, a re-distribution layer 34, and a passivation layer 36. The re-distribution layer 34 and the passivation layer 36 are insulating layers that are electrically insulated from each other. On a surface 32a of the semiconductor layer 32, an element region (not illustrated) in which a circuit or the like that exhibits a specific function is formed is provided. The element region will be described below. The surface 32a of the semiconductor layer 32 corresponds to the surface on which the terminals 30 of the semiconductor are provided.

The re-distribution layer 34 is provided on the surface 32a of the semiconductor layer 32. In the re-distribution layer 34, a wiring 37 that is electrically connected to the element region of the semiconductor layer 32 is provided. A pad 38 is provided in the wiring 37, and the wiring 37 and the pad 38 are electrically connected. Through the wiring 37 and the pad 38, a signal can be transmitted to and received from the element region and a voltage or the like can be supplied to the element region.

On the surface 34a of the re-distribution layer 34, the passivation layer 36 is provided. In the passivation layer 36, the terminal 30a is provided in the pad 38 provided in the wiring 37. The terminal 30a is electrically connected to the semiconductor layer 32.

In addition, in the re-distribution layer 34, the wiring 37 is not provided, and only the pad 38 is provided. The terminal 30b is provided in the pad 38 where the wiring 37 is not provided. The terminal 30b is not electrically connected to the semiconductor layer 32.

An end surface 30c of the terminal 30a and an end surface 30c of the terminal 30b match a surface 36a of the passivation layer 36 and are flush with the surface 36a. The terminal 30a and the terminal 30b protrude from the surface 36a of the passivation layer 36. The terminal 30a and the terminal 30b illustrated in FIG. 4 are made to be flush with the surface 36a of the passivation layer 36, for example, by polishing.

Figure 5:
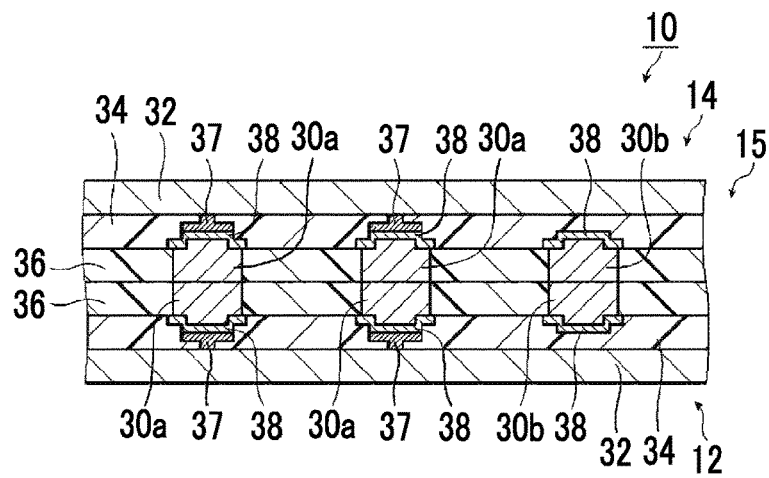
FIG. 5 is a schematic cross-sectional view illustrating the first example of the stacked device according to an embodiment of the present invention.

For example, in a case where the semiconductor element 12 and the semiconductor element 14 having the configuration illustrated in FIG. 4 are bonded to each other, the plurality of terminals may be directly bonded to each other. Alternatively, as illustrated in FIG. 5, the terminals 30a corresponding to each other may be directly connected to each other, and the terminals 30b corresponding to each other may be directly connected to each other. The semiconductor element 12 and the semiconductor element 14 are electrically connected to each other through the terminals 30a and are physically connected to each other through the terminals 30b.

Figure 6:
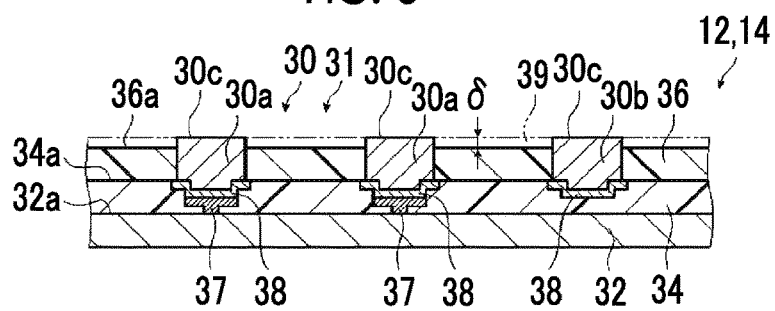
FIG. 6 is a schematic cross-sectional view illustrating another example of the configuration of the terminals of the semiconductor elements in the stacked device according to the embodiment of the present invention.

The terminal 30a and the terminal 30b are not necessarily flush with the surface 36a of the passivation layer 36, and may protrude from the surface 36a of the passivation layer 36 as illustrated in FIG. 6. In this case, a recess amount δ that is the protrusion amount of the terminal 30a and the terminal 30b from the surface 36a of the passivation layer 36 is, for example, 200 nm to 1 μm.

In a case where the recess amount δ is less than 200 nm, the configuration is substantially the same as that illustrated in FIG. 4 where the terminal 30a and the terminal 30b do not protrude, and it is necessary to perform polishing with high accuracy. On the other hand, in a case where the recess amount δ is more than 1 μm, the configuration is the same as a general configuration in which a pad electrode is provided, and it is necessary to perform bonding using a solder ball or the like.

In the configuration illustrated in FIG. 6, the terminal 30a and the terminal 30b protrude from the surface 36a of the passivation layer 36. Therefore, a resin layer 39 may be provided on the surface 36a of the passivation layer 36 in order to protect the terminal 30a and the terminal 30b.

In order to obtain the recess amount δ, an image of a cross-section including the terminal 30a and the terminal 30b in each of the semiconductor elements 12 and 14 is acquired, a contour of the terminal 30a and a contour of the terminal 30b are obtained by image analysis, and the end surface 30c of the terminal 30a and the end surface 30c of the terminal 30b are detected. Next, the distance from the surface 36a of the passivation layer 36 to the end surface 30c of the terminal 30a and the distance from the surface 36a of the passivation layer 36 to the end surface 30c of the terminal 30b are obtained. As a result, the recess amount can be obtained.

The end surface 30c of the terminal 30a and the end surface 30c of the terminal 30b refer to surfaces positioned most distant from the surface 36a of the passivation layer 36 and are generally called upper surfaces.

The semiconductor layer 32 is not particularly limited as long as it is a semiconductor. The semiconductor layer 32 is formed of silicon or the like but is not limited thereto. For example, the semiconductor layer 32 may be formed of silicon carbide, germanium, gallium arsenide, or gallium nitride.

The re-distribution layer 34 is formed of an electrically insulating material such as polyimide.

In addition, the passivation layer 36 is also formed of an electrically insulating material such as silicon nitride (SiN) or polyimide.

The wiring 37 and the pad 38 are formed of a conductive material such as copper, a copper alloy, aluminum, or an aluminum alloy.

As in the case of the wiring 37 and the pad 38, the terminal 30a and the terminal 30b are also formed of a conductive material such as metal or an alloy. Specifically, the terminal 30a and the terminal 30b are formed of, for example, copper, a copper alloy, aluminum, or an aluminum alloy.

The terminal 30a and the terminal 30b are formed of any material as long as the material is conductive, and are not necessarily formed of metal or an alloy. A material used for a component called a terminal or an electrode pad in the semiconductor element field can be appropriately used.

In addition, in the stacked device 10 illustrated in FIG. 1, the semiconductor element 12 and the semiconductor element 14 are stacked, but the embodiment is not limited thereto. As in a stacked device 10 illustrated in FIG. 7, three semiconductor elements 12, 14, and 16 may be stacked and bonded in the stacking direction Ds. The three semiconductor elements 12, 14, and 16 constitute a stacked structure 17.

Figure 8:
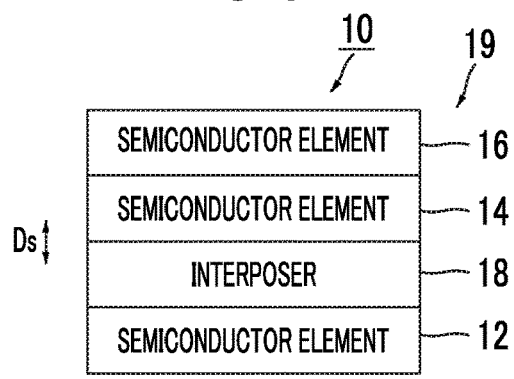
FIG. 8 is a schematic diagram illustrating a third example of the stacked device according to the embodiment of the present invention.

In addition, as in a stacked device 10 illustrated in FIG. 8, one interposer 18 may be further provided in addition to the three semiconductor elements 12, 14, and 16. The three semiconductor elements 12, 14, and 16 and the one interposer 18 constitute a stacked structure 19. In the stacked device 10 illustrated in 8, the interposer 18 is provided between the semiconductor element 12 and the semiconductor element 14 in the stacking direction Ds. The semiconductor element 14 and the semiconductor element 16 are directly bonded.

The terminals 30 of the three semiconductor elements 12, 14, and 16 satisfy the above-described requirements of the terminals 30a and the terminals 30b. Even in the stacked device 10 illustrated in FIG. 7 and the stacked device 10 illustrated in FIG. 8, as in the stacked device 10 illustrated in FIG. 1, the bonding strength is secured, and the heat dissipation is excellent.

The interposer 18 functions for electric connection between the semiconductor elements. In addition, the interposer 18 also functions for electric connection between the semiconductor elements and a wiring substrate or the like. By using the interposer 18, the wiring length and the wiring width can be reduced, the parasitic capacitance can be reduced, and a variation in wiring length or the like can be reduced.

As long as the above-described functions can be implemented, the configuration of the interposer 18 is not particularly limited and can appropriately include well-known components. The interposer 18 can be configured using an organic material such as polyimide, glass, a ceramic, metal, silicon, or polycrystalline silicon.

In addition, the plurality of terminals may be bonded through an anisotropic conductive member having a conductive path that extends in a stacking direction. As in a stacked device 10 illustrated in FIG. 9, the semiconductor element 12 and the semiconductor element 14 may be bonded in the stacking direction Ds and are electrically connected to each other through an anisotropic conductive member 20 having anisotropic conductivity. The anisotropic conductive member 20 has a conductive path that extends in the stacking direction Ds and implements a through silicon via (TSV) function. The semiconductor element 12, the semiconductor element 14, and the anisotropic conductive member 20 constitute the stacked structure 15. Even in the stacked device 10 illustrated in FIG. 9, as in the stacked device 10 illustrated in FIG. 1, the bonding strength is secured, and the heat dissipation is excellent. The anisotropic conductive member 20 can be used as an interposer.

Hereinafter, the anisotropic conductive member 20 will be described.

Figure 10:
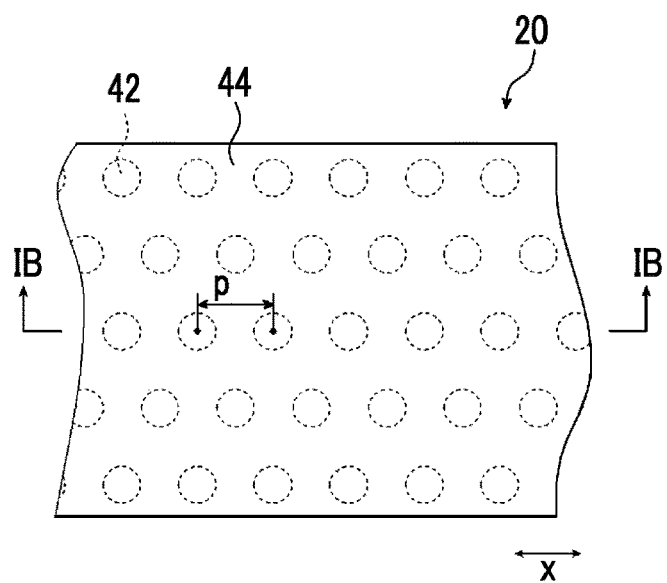
FIG. 10 is a plan view illustrating an example of a configuration of an anisotropic conductive member used in the stacked device according to the embodiment of the present invention.
Figure 11:
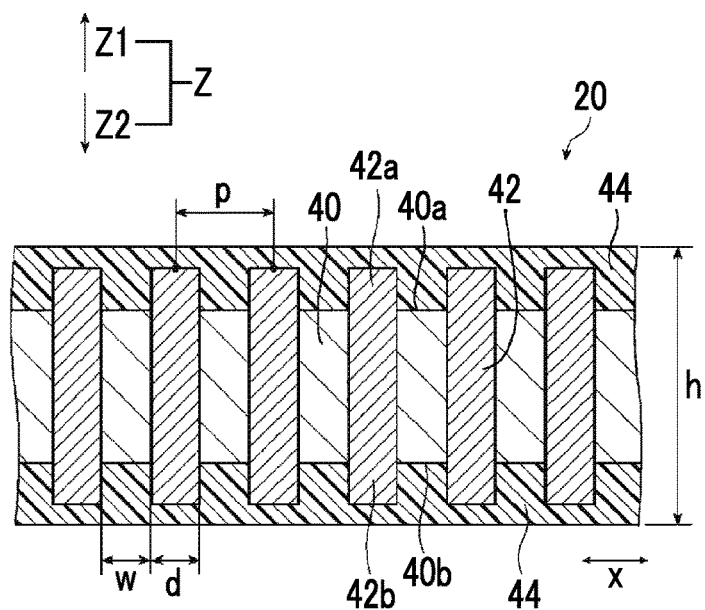
FIG. 11 is a schematic cross-sectional view illustrating the example of the configuration of the anisotropic conductive member used in the stacked device according to the embodiment of the present invention.
Figure 12:
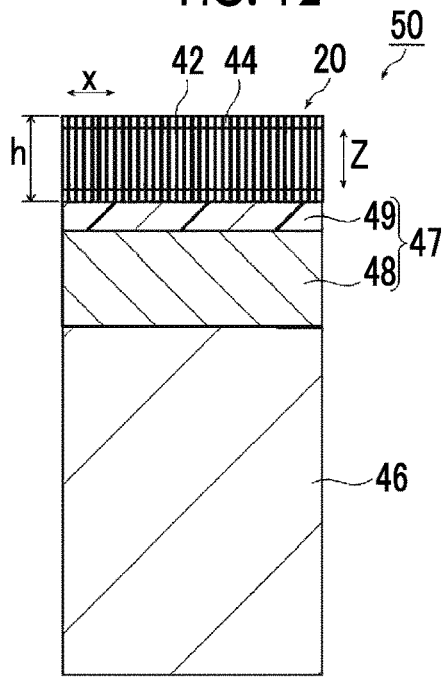
FIG. 12 is a schematic cross-sectional view illustrating an example of a configuration of an anisotropic conductive material.

FIG. 10 is a plan view illustrating an example of a configuration of the anisotropic conductive member used in the stacked device according to the embodiment of the present invention. FIG. 11 is a schematic cross-sectional view illustrating the example of the configuration of the anisotropic conductive member used in the stacked device according to the embodiment of the present invention. FIG. 11 is a cross-sectional view taken along line IB-IB of FIG. 10. In addition, FIG. 12 is a schematic cross-sectional view illustrating an example of a configuration of an anisotropic conductive material.

The anisotropic conductive member 20 illustrated in FIGS. 10 and 11 includes: an insulating substrate 40 that is formed of an inorganic material; and a plurality of conductive paths 42 that penetrate the insulating substrate 40 in a thickness direction Z (refer to FIG. 11), are provided in a state where the conductive paths 42 are electrically insulated from each other, and are formed of a conductive material. The anisotropic conductive member 20 further includes a resin layer 44 that is provided on surfaces 40a and 40b of the insulating substrate 40.

Here, "being electrically insulated from each other" represents that the conductivity between the respective conductive paths present in the insulating substrate is sufficiently low.

In the anisotropic conductive member 20, the conductive paths 42 are electrically insulated from each other, has sufficiently low conductivity in a direction x perpendicular to the thickness direction Z (refer to FIG. 11) of the insulating substrate 40, and has conductivity in the thickness direction Z. This way, the anisotropic conductive member 20 is a member having anisotropic conductivity. The anisotropic conductive member 20 is arranged such that the thickness direction Z matches the stacking direction Ds of the stacked device 10.

As illustrated in FIGS. 10 and 11, the conductive paths 42 are provided to penetrate the insulating substrate 40 in the thickness direction Z in a state where they are electrically insulated from each other. Reference numeral Z1 represents a direction from the back surface to the front surface in FIG. 10, and reference numeral Z2 represents a direction from the front surface to the back surface in FIG. 10.

Further, as illustrated in FIG. 11, the conductive path 42 may include a protrusion portion 42a and a protrusion portion 42b that protrude from the surfaces 40a and 40b of the insulating substrate 40. The anisotropic conductive member 20 may further include the resin layer 44 that is provided on the surface 40a and the back surface 40b of the insulating substrate 40. The resin layer 44 has viscosity and imparts bondability. The length of the protrusion portion 42a and the protrusion portion 42b is preferably 6 nm or more and more preferably 30 nm to 500 nm.

In addition, in FIGS. 12 and 11, the resin layer 44 is provided on the surfaces 40a and 40b of the insulating substrate 40, but the embodiment is not limited thereto. The resin layer 44 may be provided on at least one surface of the insulating substrate 40.

Likewise, the protrusion portion 42a and the protrusion portion 42b are provided at opposite ends of the conductive path 42 of FIGS. 12 and 11, but the embodiment is not limited thereto. The protrusion portion may be provided on at least the surface of the insulating substrate 40 where the resin layer 44 is provided.

A thickness h of the anisotropic conductive member 20 illustrated in FIG. 12 is, for example, 30 μm or less. In addition, a total thickness variation (TTVV) of the anisotropic conductive member 20 is preferably 10 μm or less.

Here, the thickness h of the anisotropic conductive member 20 refers to an average value that is obtained by observing the anisotropic conductive member 20 using a field emission scanning electron microscope at a magnification of 200,000-power, acquiring a contour shape of the anisotropic conductive member 20, and obtaining the average of values measured at ten points of a region corresponding to the thickness h.

In addition, the total thickness variation (TTV) of the anisotropic conductive member 20 is a value obtained by dicing the anisotropic conductive member 20 for each support 46 and observing a cross-sectional shape of the anisotropic conductive member 20.

The anisotropic conductive member 20 is provided on the support 46 as illustrated in FIG. 12 for transfer, conveyance, transport, storage, and the like. A release layer 47 is provided between the support 46 and the anisotropic conductive member 20. The support 46 and the anisotropic conductive member 20 adhere to each other to be separable by the release layer 47. A material in which the anisotropic conductive member 20 is provided over the support 46 through the release layer 47 is referred to as "anisotropic conductive material 50".

The support 46 supports the anisotropic conductive member 20 and is configured with, for example, a silicon substrate. As the support 46, in addition to a silicon substrate, for example, a ceramic substrate such as SiC, SiN, GaN, or alumina ($Al_2O_3$), a glass substrate, a fiber-reinforced plastic substrate, or a metal substrate can be used. Examples of the fiber-reinforced plastic substrate include a flame retardant type 4 (FR-4) substrate that is a printed wiring substrate.

In addition, as the support 46, a flexible and transparent support can be used. Examples of the flexible and transparent support 46 include a plastic film such as polyethylene terephthalate (PET), polycycloolefin, polycarbonate, an acrylic resin, polyethylene naphthalate (PEN), polyethylene (PE), polypropylene (PP), polystyrene, polyvinyl chloride, polyvinylidene chloride, or triacetyl cellulose (TAC).

Here, "transparent" represents that a transmittance to light having a wavelength used for alignment is 80% or higher. Therefore, a transmittance in the entire visible range of 400 to 800 nm may be low but is preferably 80% or higher. The transmittance is measured using a spectrophotometer.

It is preferable that the release layer 47 is a layer in which a support layer 48 and a release agent 49 are laminated. The release agent 49 is in contact with the anisotropic conductive member 20, and the support 46 and the anisotropic conductive member 20 are separated from the release layer 47 as an origin. For example, by heating the anisotropic conductive material 50 to a predetermined temperature, the adhesion force of the release agent 49 is weakened, and the support 46 is removed from the anisotropic conductive member 20.

As the release agent 49, for example, REVALPHA (registered trade name; manufactured by Nitto Denko Corporation) or SOMATAC (registered trade name; manufactured by Somar Corporation) can be used.

Figure 9:
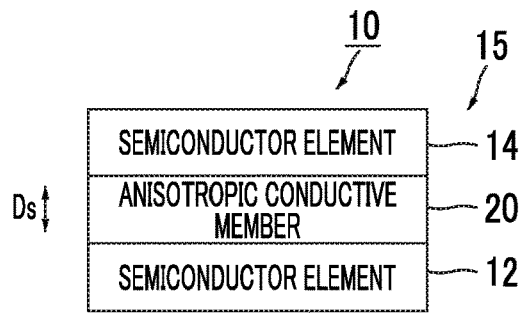
FIG. 9 is a schematic diagram illustrating a fourth example of the stacked device according to the embodiment of the present invention.
Figure 13:
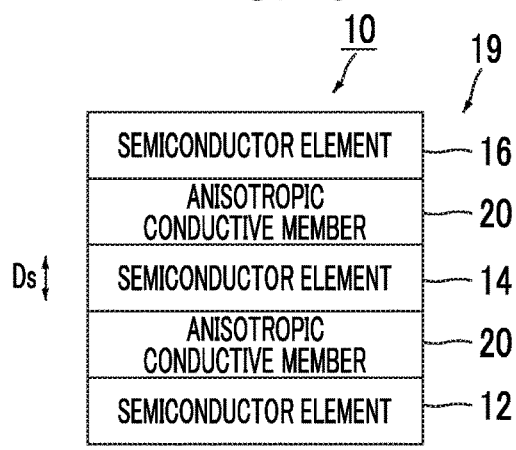
FIG. 13 is a schematic diagram illustrating a fifth example of the stacked device according to the embodiment of the present invention.

In addition to the configuration illustrated in FIG. 9, for example, as in the stacked device 10 illustrated in FIG. 13, the semiconductor element 12, the semiconductor element 14, and the semiconductor element 16 may be stacked and bonded in the stacking direction Ds through the anisotropic conductive member 20 such that they are electrically connected to each other. The three semiconductor elements 12, 14, and 16 and the two anisotropic conductive members 20 constitute the stacked structure 19.

Figure 14:
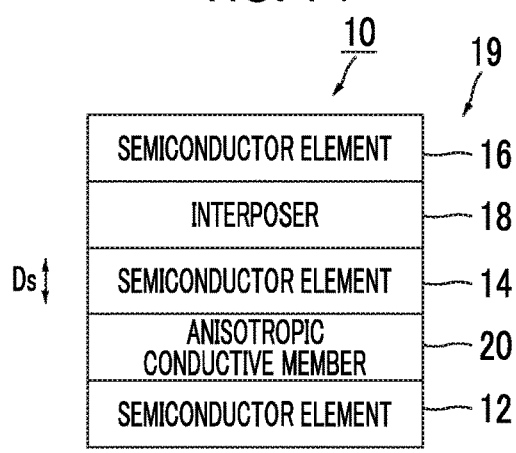
FIG. 14 is a schematic diagram illustrating a sixth example of the stacked device according to the embodiment of the present invention.

In addition, for example, as in the stacked device 10 illustrated in FIG. 14, the semiconductor element 12, the semiconductor element 14, and the semiconductor element 16 may be stacked and bonded in the stacking direction Ds using the interposer 18 and the anisotropic conductive member 20 such that they are electrically connected to each other. The three semiconductor elements 12, 14, and 16, the one interposer 18, and the one anisotropic conductive member 20 constitute the stacked structure 19.

Even in the stacked device 10 illustrated in FIG. 13 and the stacked device 10 illustrated in FIG. 14, as in the stacked device 10 illustrated in FIG. 1, the bonding strength is secured, and the heat dissipation is excellent.

Figure 15:
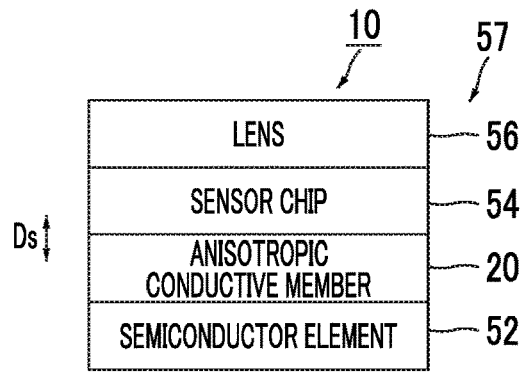
FIG. 15 is a schematic diagram illustrating a seventh example of the stacked device according to the embodiment of the present invention.

In addition, as in the stacked device 10 illustrated in FIG. 15, the stacked device according to the embodiment may function as an optical sensor. In the stacked device 10 illustrated in FIG. 15, a semiconductor element 52 and a sensor chip 54 are stacked in the stacking direction Ds through the anisotropic conductive member 20. In addition, a lens 56 is provided on the sensor chip 54. The semiconductor element 52, the sensor chip 54, and the anisotropic conductive member 20 constitute a stacked structure 57. Even in the optical sensor such as the stacked device 10 illustrated in FIG. 15, as in the stacked device 10 illustrated in FIG. 1, the bonding strength is secured, and the heat dissipation is excellent.

In the semiconductor element 52, a logic circuit is formed, and a configuration thereof is not particularly limited as long as a signal obtained from the sensor chip 54 can be processed.

The sensor chip 54 includes an optical sensor that detects light. The optical sensor is not particularly limited as long as it can detect light. For example, a charge coupled device (CCD) image sensor or a complementary metal oxide semiconductor (CMOS) image sensor is used.

In the stacked device 10 illustrated in FIG. 15, the semiconductor element 52 and the sensor chip 54 are connected through the anisotropic conductive member 20, but the embodiment is not limited thereto. The semiconductor element 52 and the sensor chip 54 may be directly bonded to each other.

The configuration of the lens 56 is not particularly limited as long as light can be collected on the sensor chip 54. For example, a lens called a microlens is used.

Each of the semiconductor element 12, the semiconductor element 14, and the semiconductor element 16 includes the above-described semiconductor layer 32 and the element region (not illustrated).

The element region is a region where various element component circuits such as a capacitor, a resistor, or a coil are formed in order to function as an electronic element. Examples of the element region include a region where a memory circuit such as a flash memory or a logical circuit such as a microprocessor and a field programmable gate array (FPGA) are formed and a region a communication module such as an RFID tag and a wiring are formed. In addition to the above-described examples, an oscillator circuit or a micro electro mechanical system (MEMS) may be formed in the element region. Examples of the MEMS include a sensor, an actuator, and an antenna. Examples of the sensor include various sensors for acceleration, sound, light, and the like.

As described above, the element component circuits and the like are formed in the element region, and the re-distribution layer 34 (refer to FIG. 4) is provided in the semiconductor element as described above.

The stacked device includes, for example, a combination of a semiconductor element including a logical circuit and a semiconductor element including a memory circuit. In addition, all the semiconductor elements may include a memory circuit, or all the semiconductor elements may include a logical circuit. In addition, the combination of the semiconductor elements in the stacked device 10 may be a sensor, an actuator, an antenna, or the like, a memory circuit, and a logical circuit, and is appropriately determined according to the use or the like of the stacked device 10.

Hereinafter, a method of manufacturing the stacked device will be described.

[Method of Manufacturing Stacked Device]

A first example of the method of manufacturing the stacked device will be described.

Figure 16:
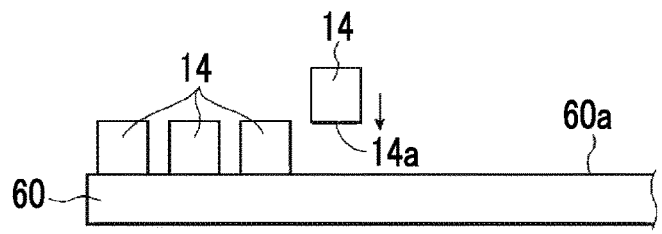
FIG. 16 is a schematic diagram illustrating one step of a first example of a method of manufacturing the stacked device according to the embodiment of the present invention.
Figure 17:
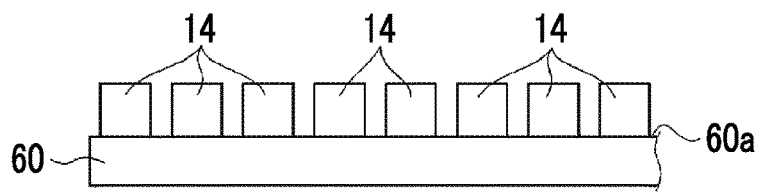
FIG. 17 is a schematic diagram illustrating one step of the first example of a method of manufacturing the stacked device according to the embodiment of the present invention.
Figure 18:
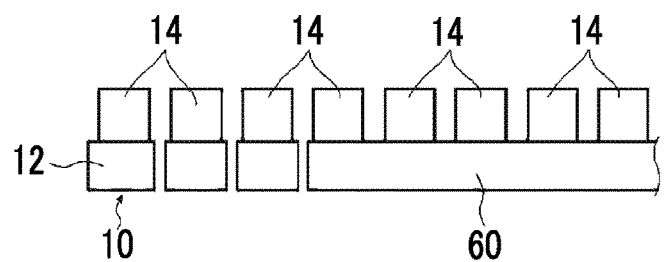
FIG. 18 is a schematic diagram illustrating one step of the first example of a method of manufacturing the stacked device according to the embodiment of the present invention.

FIGS. 16 to 18 are schematic diagrams illustrating the first example of the method of manufacturing the stacked device according to the embodiment of the present invention in the order of steps.

In the first example of the method of manufacturing the stacked device illustrated in FIGS. 16 to 18, the same structures in the stacked device 10 illustrated in FIG. 1 and the semiconductor elements 12 and 14 illustrated in FIGS. 2 and 4 are represented by the same reference numerals, and the detailed description thereof will not be repeated.

The first example of the method of manufacturing the stacked device relates to a chip-on wafer and is a method of manufacturing the stacked device 10 illustrated in FIG. 1.

First, a first semiconductor wafer 60 including a plurality of element regions (not illustrated) is prepared. The plurality of element regions are provided on a surface 60a of the first semiconductor wafer 60. In the element region, an alignment mark (not illustrated) for alignment and the terminals 30a and the terminals 30b illustrated in FIG. 2 are provided. The first semiconductor wafer 60 is cut into individual element regions, and each of the element regions becomes the semiconductor element 12. The semiconductor element 14 is bonded to the element region to form the stacked device 10.

A plurality of semiconductor elements 14 are prepared. An element region is also provided on a surface 14a of each of the semiconductor elements 14. In the element region, an alignment mark (not illustrated) for alignment and the terminals 30a and the terminals 30b illustrated in FIG. 2 are provided.

Each of the semiconductor elements 14 is arranged such that the surface 14a on which the terminals 30a and the terminals 30b are provided faces the first semiconductor wafer 60.

Next, using the alignment mark of the first semiconductor wafer 60 and the alignment mark of the semiconductor element 14, the first semiconductor wafer 60 and the semiconductor element 14 are aligned.

The alignment using the alignment marks is performed by simultaneously imaging the alignment mark of the first semiconductor wafer 60 and the alignment marks of the semiconductor element 14, and obtaining position information of the alignment mark of the first semiconductor wafer and position information of the alignment mark of the semiconductor element 14 based on the image of the alignment mark of the first semiconductor wafer 60 and the image of the alignment mark of the semiconductor element 14.

The configuration of the alignment is not particularly limited as long as digital image data can be obtained for an image or a reflected image of the alignment mark of the first semiconductor wafer 60 and an image or a reflected image of the alignment mark of the semiconductor element 14. For example, a well-known imaging device can be appropriately used.

After aligning the first semiconductor wafer 60 and the semiconductor element 14, the semiconductor element 14 is placed on the element region of the first semiconductor wafer 60 and is temporarily bonded. By performing this process on all the semiconductor elements 14, all the semiconductor elements 14 are temporarily bonded to the element regions of the first semiconductor wafer 60 as illustrated in FIG. 17.

The temporary bonding refers to a process of aligning a semiconductor element or a semiconductor wafer to a target to be bonded and fixing the aligned semiconductor element or the aligned semiconductor wafer to the target.

Next, by performing bonding wider predetermined conditions in a state where all the semiconductor elements 14 are temporarily bonded to the element regions of the first semiconductor wafer 60, all the semiconductor elements 14 are bonded to the element regions of the first semiconductor water 60. As a result, in the semiconductor elements 14 and the first semiconductor wafer 60, the terminals 30a are bonded to each other and the terminals 30b are bonded to each other. The process of bonding the targets such that the semiconductor elements 14 are bonded to the first semiconductor wafer 60 is referred to as main bonding.

By collectively performing the main bonding on all the targets, the tact time can be reduced, and the productivity can be improved.

A bonding method is not particularly limited to the above-described method. For example, direct bond interconnect (DBI) or surface activated bond (SAB) can be used.

In the above-described DBI, a silicon oxide film is stacked on the semiconductor elements 14 and the first semiconductor wafer 60, and chemical machine polishing is performed thereon. Next, the silicon oxide film interface is activated by a plasma treatment, and the semiconductor elements 14 and the first semiconductor wafer 60 are brought into contact with each other such that they are bonded to each other.

In the above-described SAB, respective bonding surfaces of the semiconductor elements 14 and the first semiconductor wafer 60 are activated by a surface treatment in a vacuum. In this state, the semiconductor elements 14 and the first semiconductor wafer 60 are brought into contact with each other in a normal temperature environment such that they are bonded to each other. As the surface treatment, ion irradiation of inert gas such as argon or neutral atom beam irradiation is used.

During the temporary bonding, manufacturing loss can be reduced by checking whether or not each of the first semiconductor wafer 60 and the semiconductor elements 14 is a non-defective product or a defective product in advance and bonding only the semiconductor elements 14 as the non-defective products to non-defective portions in the first semiconductor wafer 60. A semiconductor element as a quality-guaranteed non-defective product is referred to as a known good die (KGD).

Next, as illustrated in FIG. 18, the first semiconductor wafer 60 to which the semiconductor elements 14 are bonded is singulated per element region, for example, by dicing or laser scribing. As a result, the stacked device 10 in which the semiconductor element 12 and the semiconductor element 14 are bonded to each other can be obtained.

The singulation is not limited to dicing, and laser scribing may also be used.

In addition, in the step of bonding the semiconductor element 12 to the element region, the plurality of semiconductor elements 14 are temporarily bonded and then are collectively bonded. However, the embodiment is not limited to this example. Depending on bonding methods, the temporary bonding may not be performed. In this case, the temporary bonding of the semiconductor element 12 is not necessarily performed. Further, the semiconductor elements 14 may be bonded to the element regions of the first semiconductor wafer 60 one by one.

The transport, picking, and the like of the semiconductor elements 14 and the first semiconductor wafer 60, the temporary bonding, and the main bonding can be realized by using a well-known semiconductor element manufacturing device.

For the temporary bonding of bonding the individual semiconductor elements including the semiconductor elements 14 and the first semiconductor water 60 to each other, various devices manufactured by Toray Engineering Co., Ltd., Shibuya Corporation, Shinkawa Ltd., Yamaha Motor Co., Ltd. and the like can be used.

As a device used for the main bonding, for example, various wafer bonding devices manufactured by Mitsubishi Heavy Industries Machine Tools Co., Ltd., Bondtech Co., Ltd., PMT Corporation, Ayumi Industry Co., Ltd., Tokyo Electron Ltd. (TEL), EVG, SUSS Microtec SE, (SUSS). Musashino Engineering Co., Ltd. can be used.

Examples of control factors during each of the temporary bonding and the main bonding include an atmosphere during bonding, a heating temperature, a pressure (load), and a treatment time, and conditions suitable for a device such as a semiconductor element to be used can be selected.

The atmosphere during bonding starts from the air and can be selected from an inert atmosphere such as a nitrogen atmosphere and a vacuum state.

The heating temperature can be selected from a temperature range of 100° C. to 400° C., and the temperature increase rate can also be selected according to the performance of a heating stage from 10° C./min to 10° C./min or a heating method. The same can also be applied to cooling. In addition, heating can also be performed stepwise, and bonding can also be performed while sequentially increasing the heating temperature in stages.

Depending on the properties and the like of a resin sealing agent, the pressure (load) can be increased rapidly or stepwise.

During bonding, the atmosphere, the holding time of heating or pressurization, and the change time can be appropriately set. In addition, the order of bonding can be appropriately set. For example, the order may be as follows. The first pressurization is performed in a vacuum state. Next, in a state where the temperature is increased by performing heating, the second pressurization is performed, and the pressure is maintained for a predetermined time, in a state where the temperature becomes a predetermined temperature or lower by performing cooling immediately after a decrease in pressure, the pressure returns to the atmospheric pressure.

Figure 19:
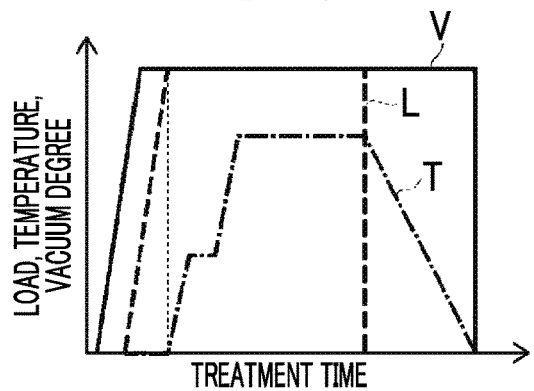
FIG. 19 is a graph illustrating a first example of main bonding conditions.
Figure 25:
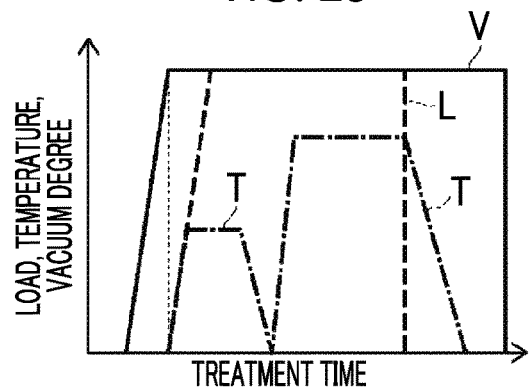
FIG. 25 is a graph illustrating a seventh example of the main bonding conditions.

The above-described order can be switched in various ways. After increasing the pressure in the air, heating may be performed in a vacuum state, or evacuation, pressurization, and heating may be performed in one go. Examples of these combinations are illustrated in FIGS. 19 and 25.

In addition, by using a mechanism for controlling an in-plane pressure distribution and a heating distribution individually, the yield of bonding can be improved.

The temporary bonding can also be changed as described above. For example, by performing the temporary bonding under an inert atmosphere, the oxidation of an electrode surface of a semiconductor element can be suppressed. Further, bonding can also be performed while applying ultrasonic waves.

FIGS. 19 to 25 are graphs illustrating a first example to a seventh example of main bonding conditions. FIGS. 19 to 25 illustrate the atmosphere during bonding, the heating temperature, the pressure (load), and the treatment time, and reference numeral V represents a vacuum degree. Reference numeral L represents a load, and reference numeral T represents a temperature. In FIGS. 19 to 25, an increase in vacuum degree represents a decrease in pressure.

Figure 20:
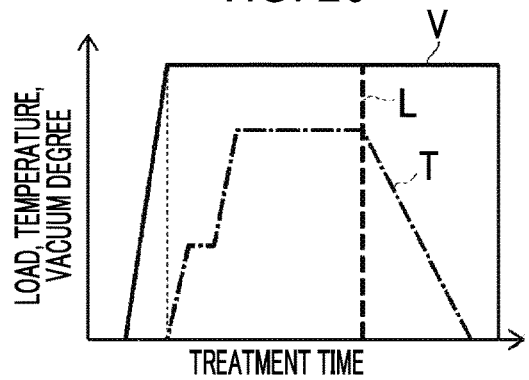
FIG. 20 is a graph illustrating a second example of the main bonding conditions.
Figure 21:
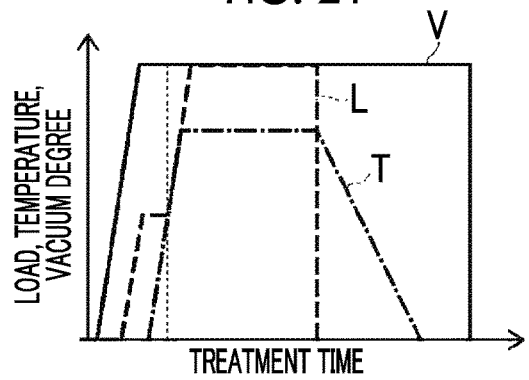
FIG. 21 is a graph illustrating a third example of the main bonding conditions.
Figure 22:
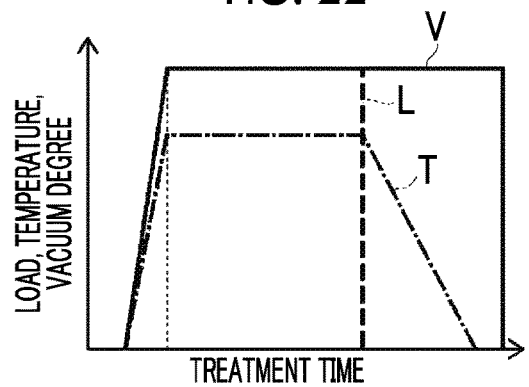
FIG. 22 is a graph illustrating a fourth example of the main bonding conditions.
Figure 23:
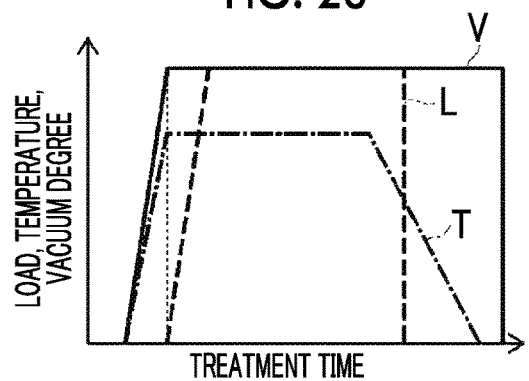
FIG. 23 is a graph illustrating a fifth example of the main bonding conditions.
Figure 24:
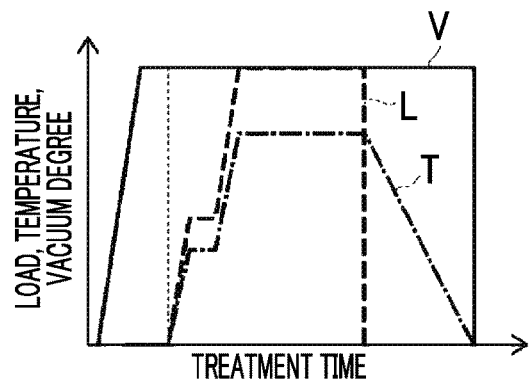
FIG. 24 is a graph illustrating a sixth example of the main bonding conditions.

Regarding the atmosphere during bonding, the heating temperature, and the load, for example, as illustrated in FIGS. 19 to 21, the temperature may be increased after applying a load in a state where the pressure is decreased. In addition, as illustrated in FIGS. 22, 24, and 25, a timing at which the load is applied and a timing at which the temperature is increased may be adjusted to be the same. As illustrated in FIG. 23, the load may be applied after increasing the temperature. In addition, as illustrated in FIGS. 22 and 23, a timing at which the pressure is decreased and a timing at which the temperature is increased may be adjusted to be the same.

The temperature may be increased stepwise as illustrated in FIGS. 19, 20, and 24 or may be increased in two steps as illustrated in FIGS. 25. The load may also be applied stepwise as illustrated in FIGS. 21 and 24.

In addition, regarding a timing at which the pressure is decreased, the load may be applied after decreasing the pressure as illustrated in FIGS. 19, 21, 23, 24, and 25, and a timing at which the pressure is decreased and a timing at which the load is applied may be adjusted to be the same as illustrated in FIGS. 20 and 22. In this case, a decrease in pressure and bonding are performed at the same time.

A second example of the method of manufacturing the stacked device will be described.

Figure 26:
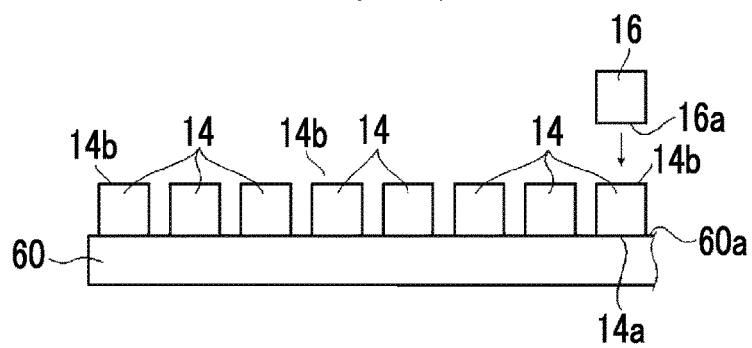
FIG. 26 is a schematic diagram illustrating one step of a second example of the method of manufacturing the stacked device according to the embodiment of the present invention.
Figure 27:
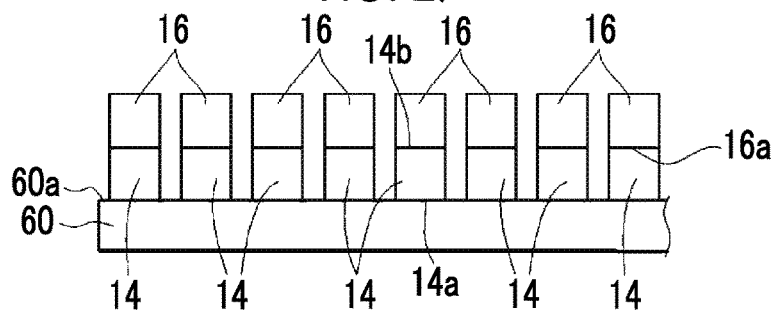
FIG. 27 is a schematic diagram illustrating one step of the second example of the method of manufacturing the stacked device according to the embodiment of the present invention.
Figure 28:
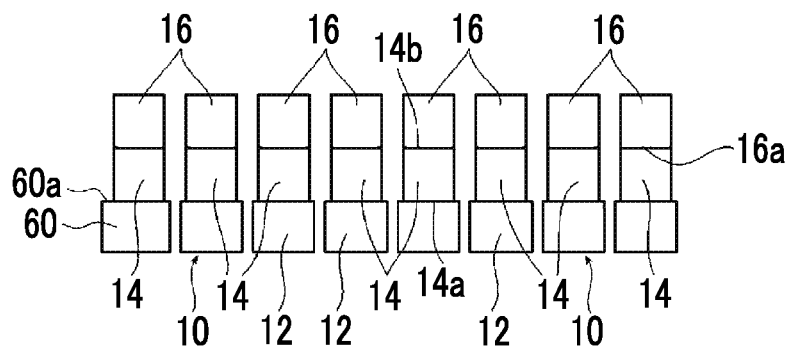
FIG. 28 is a schematic diagram illustrating one step of the second example of the method of manufacturing the stacked device according to the embodiment of the present invention.

FIGS. 26 to 28 are schematic diagrams illustrating the second example of the method of manufacturing the stacked device according to the embodiment of the present invention in the order of steps.

Figure 7:
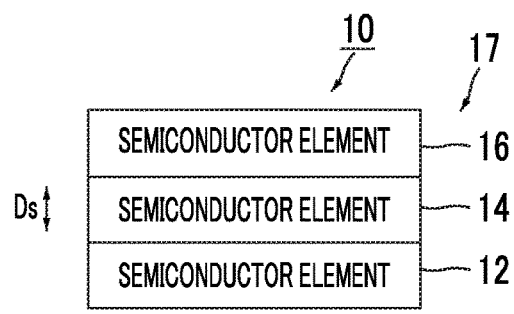
FIG. 7 is a schematic diagram illustrating a second example of the stacked device according to the embodiment of the present invention.

The second example of the method of manufacturing the stacked device relates to a chip-on wafer and is a method of manufacturing the stacked device 10 illustrated in FIG. 7.

The second example of the method of manufacturing the stacked device is the same as the first example of the method of manufacturing the stacked device, except that the three semiconductor elements 12, 14, and 16 are stacked. Therefore, the detailed description of the method common to the first example of the method of manufacturing the stacked device will not be repeated.

In the semiconductor element 14, the alignment mark (not illustrated) is provided on a back surface 14b, and the terminals 30a and the terminals 30b are provided. The terminals 30a of the back surface 14b are electrically connected to the element region of the surface 14a.

In addition, in the semiconductor element 16, an element region (not illustrated) is provided on a surface 16a, and an alignment mark (not illustrated) is provided in the element region.

As illustrated in FIG. 26, in a state where all the semiconductor elements 14 are temporarily bonded to the element regions of the first semiconductor wafer 60, the semiconductor element 16 is aligned with respect to the semiconductor element 14 using the alignment mark of the back surface 14b of the semiconductor element 14 and the alignment mark of the semiconductor element 16.

Next, as illustrated in FIG. 27, the semiconductor elements 16 are temporarily bonded to the back surfaces 14b of the semiconductor elements 14. Next, in a state where all the semiconductor elements 14 are temporarily bonded to the element regions of the first semiconductor wafer 60 and the semiconductor elements 16 are temporarily bonded to all the semiconductor elements 14, main bonding is performed under predetermined conditions. This way, the semiconductor elements 14 and the semiconductor elements 16 are bonded, and the semiconductor elements 14 are bonded to the element regions of the first semiconductor wafer 60. As a result, in the semiconductor elements 14, the semiconductor elements 16, and the first semiconductor water 60, the terminals 30a are bonded to each other and the terminals 30b are bonded to each other.

Next, as illustrated in FIG. 28, the first semiconductor wafer 60 to which the semiconductor elements 14 and the semiconductor elements 16 are bonded is singulated per element region, for example, by dicing or laser scribing. As a result, the stacked device 10 in which the semiconductor element 12, the semiconductor element 14, and the semiconductor element 16 are bonded to each other can be obtained.

In the second example of the method of manufacturing the stacked device, the semiconductor elements 16 may be bonded in a state Where all the semiconductor elements 14 are bonded to the element regions of the first semiconductor wafer 60.

A third example of the method of manufacturing the stacked device will be described.

Figure 29:
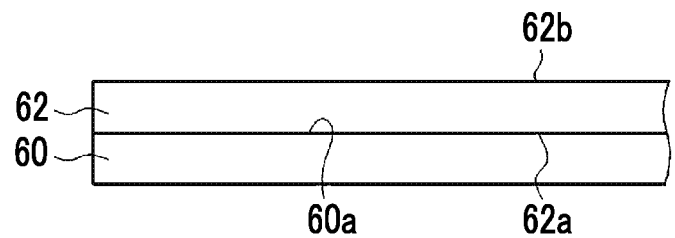
FIG. 29 is a schematic diagram illustrating one step of a third example of the method of manufacturing the stacked device according to the embodiment of the present invention.
Figure 30:
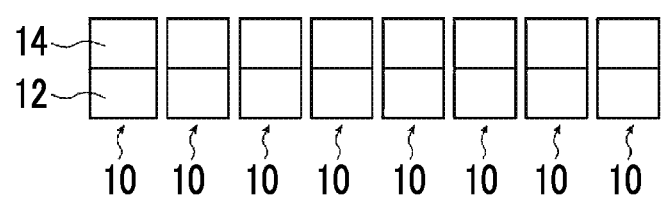
FIG. 30 is a schematic diagram illustrating one step of the third example of the method of manufacturing the stacked device according to the embodiment of the present invention.

FIGS. 29 to 30 are schematic diagrams illustrating the third example of the method of manufacturing the stacked device according to the embodiment of the present invention in the order of steps.

The third example of the method of manufacturing the stacked device relates to a wafer-on wafer and is a method of manufacturing the stacked device 10 illustrated in FIG. 1.

The third example of the method of manufacturing the stacked device is the same as the first example of the method of manufacturing the stacked device, except that a second semiconductor wafer 62 is used instead of the semiconductor elements 14. Therefore, the detailed description of the method common to the first example of the method of manufacturing the stacked device will not be repeated.

First, the first semiconductor wafer 60 and the second semiconductor wafer 62 including a plurality of element regions (not illustrated) are prepared. The element regions are provided on a surface 62a of the second semiconductor wafer 62.

Next, the surface 60a of the first semiconductor wafer 60 and the surface 62a of the second semiconductor wafer 62 are arranged to face each other. Using the alignment mark of the first semiconductor wafer 60 and an alignment mark of the second semiconductor wafer 62, the second semiconductor wafer 62 is aligned with respect to the first semiconductor wafer 60.

Next, as illustrated in FIG. 29, the surface 60a of the first semiconductor wafer 60 and the surface 62a of the second semiconductor wafer 62 are arranged to face each other, and the first semiconductor wafer 60 and the second semiconductor water 62 are bonded to each other using the above-described method. In this case, main bonding may be performed after temporary bonding, or only main bonding may be performed.

Next, as illustrated in FIG. 30, in a state where the first semiconductor wafer 60 and the second semiconductor wafer 62 are bonded to each other, the first semiconductor wafer 60 and the second semiconductor wafer 62 are singulated per element region, for example, by dicing or laser scribing. As a result, the stacked device 10 in which the semiconductor element 12 and the semiconductor element 14 are bonded to each other can be obtained. This way, even in a case where a wafer-on wafer is used, the stacked device 10 can be obtained.

Since the details of the singulation are as described above, the detailed description thereof will not be repeated.

In addition, in a state where the first semiconductor wafer 60 and the second semiconductor wafer 62 are bonded to each other as illustrated in FIG. 30, in a case where it is necessary to reduce the thickness of one semiconductor wafer among the first semiconductor wafer 60 and the second semiconductor wafer 62, the thickness of this semiconductor wafer can be reduced by chemical mechanical polishing (CMP).

In the third example of the method of manufacturing the stacked device, the two-layer structure in which the semiconductor element 12 and the semiconductor element 14 are stacked has been described, but the embodiment is not limited thereto. Of course, the stacked structure may include three or more layers. In this case, on a back surface 62b of the second semiconductor wafer 62, an alignment mark (not illustrated), the terminals 30a, and the terminals 30b are provided. The terminals 30a and the terminals 30b of the back surface 62b are electrically connected to the element regions of the surface 62a. By configuring the second semiconductor wafer 62 as described above, a third semiconductor wafer (not illustrated) can be aligned and bonded, and the stacked device 10 including three or more layers can be obtained.

A fourth example of the method of manufacturing the stacked device will be described.

Figure 31:
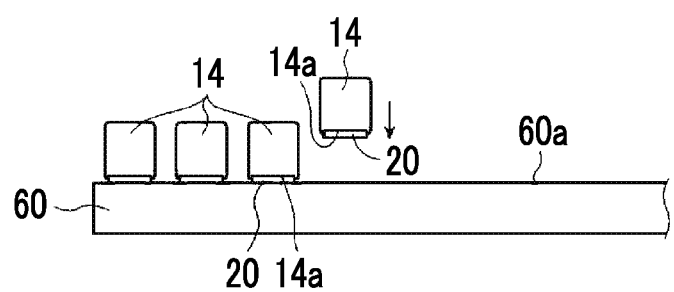
FIG. 31 is a schematic diagram illustrating one step of a fourth example of the method of manufacturing the stacked device according to the embodiment of the present invention.
Figure 32:
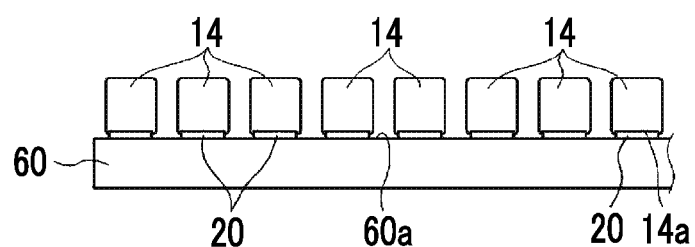
FIG. 32 is a schematic diagram illustrating one step of the fourth example of the method of manufacturing the stacked device according to the embodiment of the present invention.
Figure 33:
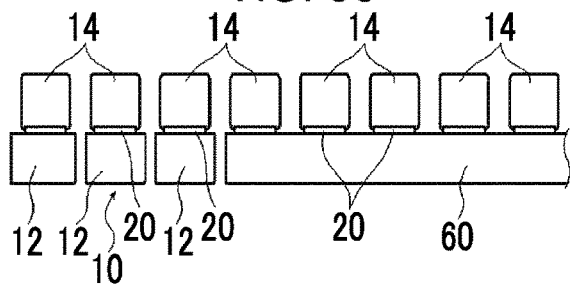
FIG. 33 is a schematic diagram illustrating one step of the fourth example of the method of manufacturing the stacked device according to the embodiment of the present invention.

FIGS. 31 to 33 are schematic diagrams illustrating the fourth example of the method of manufacturing the stacked device according to the embodiment of the present invention in the order of steps.

The fourth example of the method of manufacturing the stacked device relates to a chip-on wafer and is a method of manufacturing the stacked device 10 illustrated in FIG. 9.

The fourth example of the method of manufacturing the stacked device is the same as the first example of the method of manufacturing the stacked device, except that the semiconductor element 12 and the semiconductor element 14 are stacked and bonded through the anisotropic conductive member 20. Therefore, the detailed description of the method common to the first example of the method of manufacturing the stacked device will not be repeated.

First, the semiconductor element 14 in which the anisotropic conductive member 20 is provided on the surface 14a is prepared.

Next, the semiconductor element 14 is arranged such that the anisotropic conductive member 20 faces the first semiconductor wafer 60. Next, using the alignment mark of the semiconductor element 14 and the alignment mark of the first semiconductor wafer 60, the semiconductor element 14 is aligned with respect to the first semiconductor wafer 60.

Next, the semiconductor element 14 is placed on the element region of the first semiconductor wafer 60 through the anisotropic conductive member 20. Next, for example, by applying a predetermined pressure, heating the semiconductor element 14 at a predetermined temperature, and holding the semiconductor element 14 at the temperature for a predetermined time, the semiconductor element 14 is temporarily bonded using the resin layer 44 (refer to FIG. 11). By performing this process on all the semiconductor elements 14, all the semiconductor elements 14 are temporarily bonded to the element regions of the first semiconductor wafer 60 as illustrated in FIG. 32.

The use of the resin layer 44 for the temporary bonding is one method, and a method described below may also be used for the temporary bonding. For example, the semiconductor element 14 may be temporarily bonded to the element region of the first semiconductor wafer 60 by supplying a sealing resin or the like to the first semiconductor wafer 60 using a dispenser or the like, or the semiconductor element 14 may be temporarily bonded to the element region using an insulating resin film (non-conductive film (NCF)) supplied to the first semiconductor wafer 60 in advance.

Next, in a state where all the semiconductor elements 14 are temporarily bonded to the element regions of the first semiconductor wafer 60, a predetermined pressure is applied to the semiconductor elements 14, the semiconductor elements 14 are heated at a predetermined temperature, and the semiconductor elements 14 are held at the temperature for a predetermined time such that all the plurality of semiconductor elements 14 are collectively bonded to the element regions of the first semiconductor wafer 60. This bonding is called main bonding as described above. As a result, the terminals 30a and the terminals 30b of the semiconductor element 14 are bonded to the anisotropic conductive member 20, and the terminals 30a and the terminals 30b of the first semiconductor wafer 60 are bonded to the anisotropic conductive member 20.

Next, as illustrated in FIG. 33, the first semiconductor wafer 60 to which the semiconductor elements 14 are bonded through the anisotropic conductive member 20 is singulated per element region, for example, by dicing or laser scribing. As a result, the stacked device 10 in which the semiconductor element 12, the anisotropic conductive member 20, and the semiconductor element 14 are bonded to each other can be obtained.

In a case where the temporary bonding strength is weak during the temporary bonding, misalignment occurs in a transport step and a step before bonding. Therefore, the temporary bonding strength is important.

In addition, a temperature condition in the temporary bonding process is not particularly limited and is preferably 0° C. to 300° C., more preferably 10° C. to 200° C., and still more preferably normal temperature (23° C.) to 100° C.

Likewise, a pressurization condition in the temporary bonding process is not particularly limited and is preferably 10 MPa or lower, more preferably 5 MPa or lower, and still more preferably 1 MPa or lower.

A temperature condition in the main bonding is not particularly limited, is preferably higher than the temperature in the temporary bonding, and specifically is more preferably 150° C. to 350° C. and still more preferably 200° C. to 300° C.

In addition, a pressurization condition in the main bonding is not particularly limited and is preferably 30 MPa or lower and more preferably 0.1 MPa to 20 MPa.

In addition, the time in the main bonding is not particularly limited and is preferably 1 second to 60 minutes and more preferably 5 seconds to 10 minutes.

By performing the main bonding under the above-described conditions, the resin layer flows through the electrodes of the semiconductor element 14 and is not likely to remain in the bonding portion.

As described above, by collectively performing the bonding of the plurality of semiconductor elements 14 in the main bonding, the tact time can be reduced, and the productivity can be improved.

In the fourth example of the method of manufacturing the stacked device, the semiconductor element 14 in which the anisotropic conductive member 20 is provided on the surface 14a is used, but the embodiment is not limited thereto. The semiconductor element 14 in which the anisotropic conductive member 20 is not provided may be bonded to the first semiconductor wafer 60 in which the anisotropic conductive member 20 is provided on the surface 60a.

A fifth example of the method of manufacturing the stacked device will be described.

Figure 34:
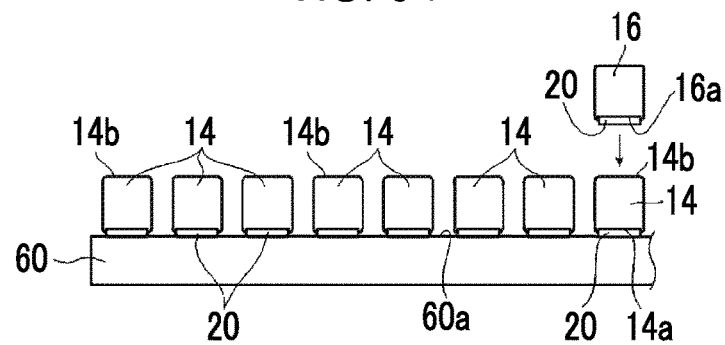
FIG. 34 is a schematic diagram illustrating one step of a fifth example of the method of manufacturing the stacked device according to the embodiment of the present invention.
Figure 35:
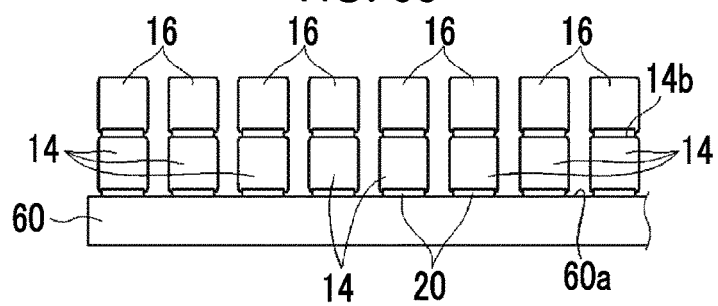
FIG. 35 is a schematic diagram illustrating one step of the fifth example of the method of manufacturing the stacked device according to the embodiment of the present invention.
Figure 36:
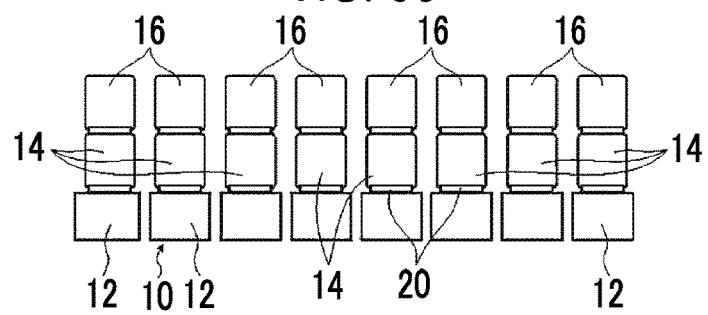
FIG. 36 is a schematic diagram illustrating one step of the fifth example of the method of manufacturing the stacked device according to the embodiment of the present invention.

FIGS. 34 to 36 are schematic diagrams illustrating the fifth example of the method of manufacturing the stacked device according to the embodiment of the present invention in the order of steps.

The fifth example of the method of manufacturing the stacked device is the same as the second example of the method of manufacturing the stacked device, except that the three semiconductor elements 12, 14, and 16 are stacked and bonded through the anisotropic conductive members 20. Therefore, the detailed description of the method common to the second example of the method of manufacturing the stacked device will not be repeated.

As described above, in the semiconductor element 14, the alignment mark (not illustrated) is provided on the back surface 14b, and the terminals 30a and the terminals 30b are provided. Further, in the semiconductor element 14, the anisotropic conductive member 20 is provided on the surface 14a. In addition, even in the semiconductor element 16, the anisotropic conductive member 20 is provided on the surface 16a.

As illustrated in FIG. 34, in a state where all the semiconductor elements 14 are temporarily bonded to the element regions of the first semiconductor wafer 60 through the anisotropic conductive members 20, the semiconductor element 16 is aligned with respect to the semiconductor element 14 using the alignment mark of the back surface 14b of the semiconductor element 14 and the alignment mark of the semiconductor element 16.

Next, as illustrated in FIG. 35, the semiconductor elements 16 are temporarily bonded to the back surfaces 14b of the semiconductor elements 14 through the anisotropic conductive member 20. Next, in a state where all the semiconductor elements 14 are temporarily bonded to the element regions of the first semiconductor wafer 60 through the anisotropic conductive members 20 and the semiconductor elements 16 are temporarily bonded to the all the semiconductor elements 14 through the anisotropic conductive members 20, main bonding is performed under predetermined conditions. As a result, the semiconductor elements 14 and the semiconductor elements 16 are bonded through the anisotropic conductive members 20, and the semiconductor elements 14 and the first semiconductor wafer 60 are bonded through the anisotropic conductive members 20. The terminals 30a and the terminals 30b of the semiconductor elements 14, the semiconductor elements 16, and the first semiconductor wafer 60 are bonded to the anisotropic conductive members 20.

Next, as illustrated in FIG. 36, the first semiconductor wafer 60 to which the semiconductor elements 14 and the semiconductor elements 16 are bonded through the anisotropic conductive members 20 is simulated per element region, for example, by dicing or laser scribing. As a result, the stacked device 10 in which the semiconductor element 12, the semiconductor element 14, and the semiconductor element 16 are bonded to each other through the anisotropic conductive members 20 can be obtained.

A sixth example of the method of manufacturing the stacked device will be described.

Figure 37:
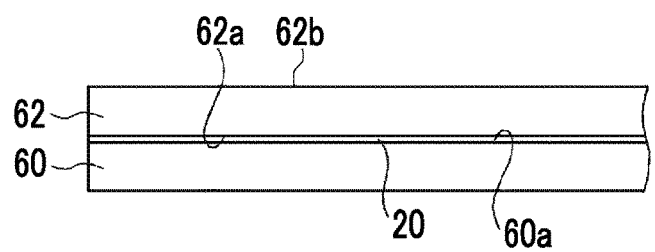
FIG. 37 is a schematic diagram illustrating one step of a sixth example of the method of manufacturing the stacked device according to the embodiment of the present invention.
Figure 38:
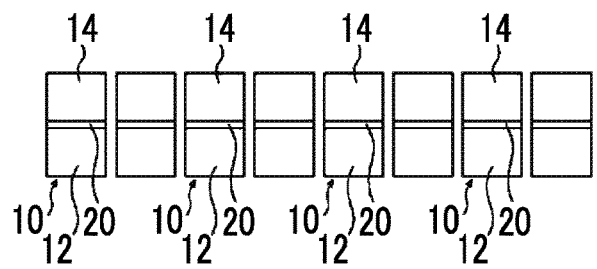
FIG. 38 is a schematic diagram illustrating one step of the sixth example of the method of manufacturing the stacked device according to the embodiment of the present invention.

FIGS. 37 and 38 are schematic diagrams illustrating the sixth example of the method of manufacturing the stacked device according to the embodiment of the present invention in the order of steps.

The sixth example of the method of manufacturing the stacked device relates to a wafer-on wafer and is a method of manufacturing the stacked device 10 illustrated in FIG. 9.

The sixth example of the method of manufacturing the stacked device is the same as the third example of the method of manufacturing the stacked device, except that the first semiconductor wafer 60 and the second semiconductor water 62 are bonded through the anisotropic conductive member 20. Therefore, the detailed description of the method common to the third example of the method of manufacturing the stacked device will not be repeated. In addition, since the details of the anisotropic conductive member 20 are as described above, the detailed description thereof will not be repeated.

First, the first semiconductor wafer 60 and the second semiconductor wafer 62 are prepared. The anisotropic conductive member 20 is provided on any one of the surface 60a of the first semiconductor wafer 60 or the surface 62a of the second semiconductor wafer 62.

Next, the surface 60a of the first semiconductor wafer 60 and the surface 62a of the second semiconductor wafer 62 are arranged to face each other. Using the alignment mark of the first semiconductor wafer 60 and the alignment mark of the second semiconductor wafer 62, the second semiconductor wafer 62 is aligned with respect to the first semiconductor wafer 60.

Next, as illustrated in FIG. 37, the surface 60a of the first semiconductor wafer 60 and the surface 62a of the second semiconductor wafer 62 are arranged to face each other, and the first semiconductor wafer 60 and the second semiconductor wafer 62 are bonded to each other through the anisotropic conductive member 20 using the above-described method. In this case, main bonding may be performed after temporary bonding, or only main bonding may be performed.

Next, as illustrated in FIG. 38, in a state where the first semiconductor wafer 60 and the second semiconductor wafer 62 are bonded to each other through the anisotropic conductive member 20, the first semiconductor wafer 60 and the second semiconductor wafer 62 are singulated per element region, for example, by dicing or laser scribing. As a result, the stacked device 10 in which the semiconductor element 12 and the semiconductor element 14 are bonded to each other through the anisotropic conductive member 20 can be obtained. This way, even in a case where a wafer-on wafer is used, the stacked device 10 can be obtained.

Since the details of the singulation are as described above, the detailed description thereof will not be repeated.

In addition, in a state where the first semiconductor wafer 60 and the second semiconductor wafer 62 are bonded to each other as illustrated in FIG. 38, in a case where it is necessary to reduce the thickness of one semiconductor wafer among the first semiconductor wafer 60 and the second semiconductor wafer 62, the thickness of this semiconductor wafer can be reduced by chemical mechanical polishing (CMP).

In the sixth example of the method of manufacturing the stacked device, the two-layer structure in which the semiconductor element 12 and the semiconductor element 14 are stacked has been described, but the embodiment is not limited thereto. Of course, the stacked structure may include three or more layers as described above. In this case, as in the third example of the method of manufacturing the stacked device 10, the alignment mark (not illustrated), the terminals 30a, and the terminals 30b are provided on the back surface 62b of the second semiconductor wafer 62 such that the stacked device 10 including three or more layers can be obtained.

As described above, with the configuration of the stacked device 10 in which the anisotropic conductive member 20 is provided, even in a case where a semiconductor element has unevenness, the protrusion portion 42a and the protrusion portion 42b can function as a buffer layer to absorb the unevenness. Since the protrusion portion 42a and the protrusion portion 42b function as a buffer layer, high surface quality is not required for a surface of a semiconductor element where an element region is provided. Therefore, a smoothing treatment such as polishing is not required, the production cost can be reduced, and the production time can also be reduced.

In addition, the stacked device 10 can be manufactured using a chip-on wafer. Therefore, by bonding only semiconductor chips as non-defective products to non-detective portions in the semiconductor wafer, the yield can be maintained, and manufacturing loss can be reduced.

Further, as described above, the resin layer 44 has viscosity and can be used as a temporary bonding agent during temporary bonding. By using the resin layer 44, main bonding can be collectively performed.

The semiconductor element 14 in which the anisotropic conductive member 20 is provided can be formed using the anisotropic conductive member 20 of the anisotropic conductive material 50 illustrated in FIG. 12 and a semiconductor wafer including a plurality of element regions (not illustrated). In the element region, as described above, an alignment mark (not illustrated) for alignment and the terminals 30a and the terminals 30b illustrated in FIG. 2 are provided. In the anisotropic conductive material 50, the anisotropic conductive member 20 is formed in a pattern corresponding to the element regions.

Next, by applying a predetermined pressure, heating the anisotropic conductive material 50 at a predetermined temperature, and holding the anisotropic conductive material 50 at the temperature for a predetermined time, the anisotropic conductive member 20 of the anisotropic conductive material 50 is bonded to the element regions of the semiconductor wafer.

Next, by removing the support 46 from the anisotropic conductive material 50, only the anisotropic conductive member 20 is bonded to the semiconductor wafer. In this case, by heating the anisotropic conductive material 50 to a predetermined temperature, the adhesion force of the release agent 49 of the release layer 47 is decreased, and the support 46 is removed from the release layer 47 of the anisotropic conductive material 50 as an origin. Next, the semiconductor wafer is singulated per element region to obtain the plurality of semiconductor elements 14.

The semiconductor element 14 in which the anisotropic conductive member 20 is provided has been described as an example. However, regarding the semiconductor element 16 in which the anisotropic conductive member 20 is provided and the second semiconductor wafer 62 in which the anisotropic conductive member 20 is provided, the anisotropic conductive member 20 can be provided using the same method as that of the semiconductor element 14 in which the anisotropic conductive member 20 is provided.

Regarding the bonding of the semiconductor device, the configuration in which one semiconductor element is bonded to another semiconductor element has been described, but the embodiment is not limited thereto. A one-to-plurality configuration in which a plurality of semiconductor elements are bonded to one semiconductor element may be adopted. In addition, a plurality-to-plurality configuration in which a plurality of semiconductor elements are bonded to a plurality of semiconductor element may be adopted.

Figure 39:
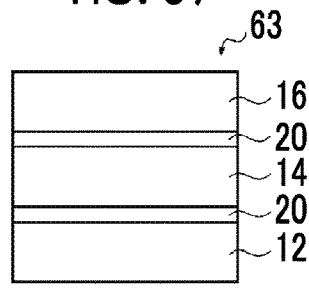
FIG. 39 is a schematic diagram illustrating an eighth example of the stacked device according to the embodiment of the present invention.
Figure 40:
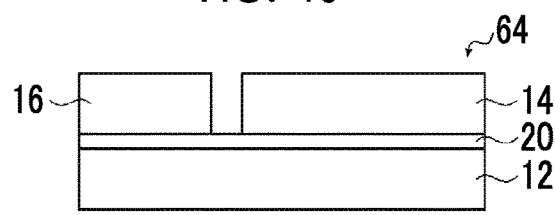
FIG. 40 is a schematic diagram illustrating a ninth example of the stacked device according to the embodiment of the present invention.
Figure 41:
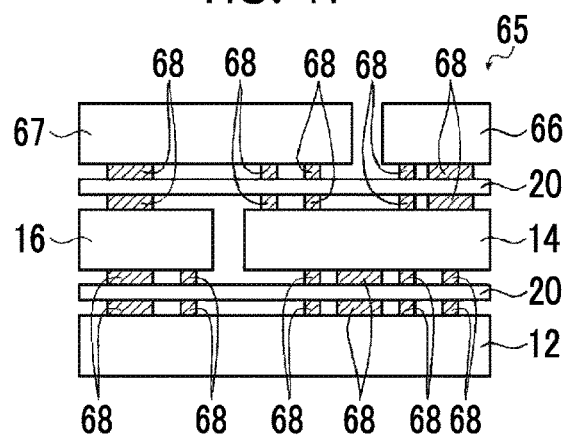
FIG. 41 is a schematic diagram illustrating a tenth example of the stacked device according to the embodiment of the present invention.
Figure 42:
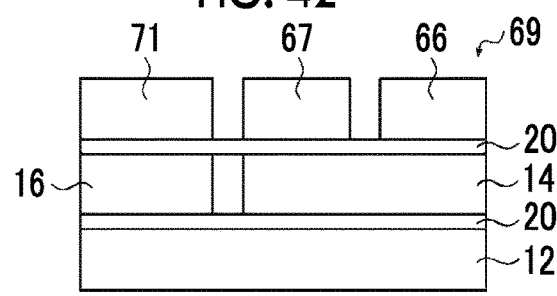
FIG. 42 is a schematic diagram illustrating an eleventh example of the stacked device according to the embodiment of the present invention.
Figure 43:
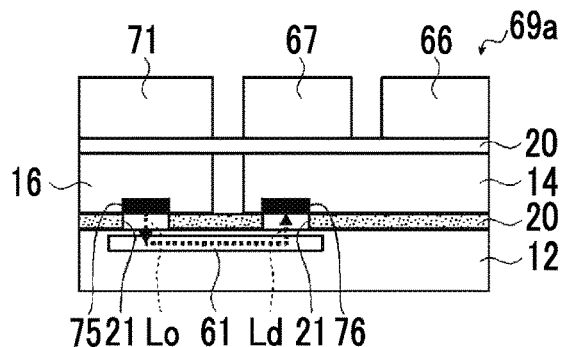
FIG. 43 is a schematic diagram illustrating a twelfth example of the stacked device according to the embodiment of the present invention.

FIG. 39 is a schematic diagram illustrating an eighth example of the stacked device according to the embodiment of the present invention. FIG. 40 is a schematic diagram illustrating a ninth example of the stacked device according to the embodiment of the present invention. FIG. 41 is a schematic diagram illustrating a tenth example of the stacked device according to the embodiment of the present invention. FIG. 42 is a schematic diagram illustrating an eleventh example of the stacked device according to the embodiment of the present invention. FIG. 43 is a schematic diagram illustrating a twelfth example of the stacked device according to the embodiment of the present invention.

As the one-to-plurality configuration, for example, a stacked device 63 in which the semiconductor element 12, the semiconductor element 14, and the semiconductor element 16 are bonded and electrically connected to each other using the anisotropic conductive members 20, respectively, as illustrated in FIG. 39 can be used. The semiconductor element 12 may have an interposer function. In the stacked device 63, semiconductor element wafers may be used instead of the semiconductor element 12, the semiconductor element 14, and the semiconductor element 16.

In addition, as the plurality-to-plurality configuration, for example, as illustrated in FIG. 40, a stacked device 64 in which the semiconductor element 14 and the semiconductor element 16 are bonded and electrically connected to one semiconductor element 12 using the anisotropic conductive member 20 can be used. The semiconductor element 12 may have an interposer function.

In addition, for example, a plurality of devices such as a logic chip including a logical circuit and a memory chip can also be stacked on a device having an interposer function. In addition, in this case, even the electrode sizes of the devices are different from each other, the devices can be bonded.

In the stacked device 65 illustrated in FIG. 41, the sizes of electrodes 68 are not the same, and electrodes 68 having different sizes are mixed. However, the semiconductor element 14 and the semiconductor element 16 are bonded and electrically connected to one semiconductor element 12 using the anisotropic conductive member 20. Further, a semiconductor element 66 is bonded and electrically connected to the semiconductor element 14 using the anisotropic conductive member 20. Further, a semiconductor element 67 is bonded and electrically connected to the semiconductor element 14 and the semiconductor element 16 using the anisotropic conductive member 20.

In addition, a stacked device 69 illustrated in FIG. 42 can also be adopted. In the stacked device 69, the semiconductor element 14 and the semiconductor element 16 are bonded and electrically connected to one semiconductor element 12 using the anisotropic conductive member 20. Further, the semiconductor element 66 and the semiconductor element 67 are bonded and electrically connected to the semiconductor element 14 using the anisotropic conductive member 20, and a semiconductor element 71 is bonded and electrically connected to the semiconductor element 16 using the anisotropic conductive member 20.

In the above-described configuration, by stacking a light-emitting element such as a vertical cavity surface emitting laser (VCSEL) and a light-receiving element such as a complementary metal oxide semiconductor (CMOS) image sensor on a device surface including an optical waveguide, the embodiment is also applicable to silicon photonics assuming a high frequency.

For example, a stacked device 69a illustrated in FIG. 43 can also be adopted. In the stacked device 69a, the semiconductor element 14 and the semiconductor element 16 are bonded and electrically connected to one semiconductor element 12 using the anisotropic conductive member 20. Further, the semiconductor element 66 and the semiconductor element 67 are bonded and electrically connected to the semiconductor element 14 using the anisotropic conductive member 20, and the semiconductor element 71 is bonded and electrically connected to the semiconductor element 16 using the anisotropic conductive member 20. An optical waveguide 61 is provided in the semiconductor element 12. A light-emitting element 75 is provided in the semiconductor element 16, and a light-receiving element 76 is provided in the semiconductor element 14. Light Lo output from the light-emitting element 75 of the semiconductor element 16 passes through the optical waveguide 61 of the semiconductor element 12 and is emitted to the light-receiving element 76 of the semiconductor element 14 as outgoing light Ld. As a result, the embodiment is applicable to the above-described silicon photonics.

In the anisotropic conductive member 20, a hole 21 is formed at a portion corresponding to an optical path of the light Lo and the outgoing light Ld.

A specific assembly step of 3D stacking using the stacked structure will be described.

In order to realize 3D stacking, it is necessary that a wiring for electrical connection in a stacking direction is formed in a device to be stacked. This wiring for the connection in the stacking direction is called a through silicon via (TSV). Devices including TSV are classified into three kinds including a via first TSV, a via middle TSV, and a via last TSV. A TSV that is formed before forming a transistor of a device is called a via first TSV. A TSV that is formed before forming a re-distribution layer and after forming a transistor is called a via middle TSV. A TSV that is formed after forming a re-distribution layer is called a via last TSV. Regardless of the method used for formation of a TSV, it is necessary to thin a silicon substrate to perform a penetration process.

A method of bonding a semiconductor chip or a wafer to which TSV is applied will be described together with an example of a use configuration of the stacked structure.

Representative examples of the via first TSV or the via middle TSV include a stacked memory chip called a high bandwidth memory (HBM) or a hybrid memory cube (HMC). In this example, a memory region and a TSV region are formed on the same die, a substrate wafer is thinned, a TSV is formed, an electrode called a microbump is formed on a surface of the via, and stacking and bonding are performed.

Examples of the via last include a step of bonding a semiconductor chip or a wafer not including a metal bump using an insulating adhesive or an insulating oxide and subsequently forming a TSV.

In the related art, after forming interlayer bonding, a hole is formed using a BOSCH method or a laser drilling method, nuclei for plating are formed on a wall surface by sputtering or the like, metal is filled by plating, and the filled metal is electrically bonded to a wiring portion of each layer.

However, since the filled metal is formed by the growth of the nuclei for plating, the bonding between the filled metal and the wiring portion is not necessarily secured. On the other hand, in a case where bumps are connected to each other using the anisotropic conductive member, a conductive path of the anisotropic conductive member directly forms bonding between the bumps. Therefore, electrical connection is strengthened, and signal connection is further improved. At this time, by providing an electrode that does not contribute to signal transfer on a semiconductor chip surface or a wafer surface, the area of a bonding portion increases, and resistance to shearing stress can be improved. In addition, since heat transfer between layers is improved, heat is likely to be diffused to the entire stacked structure. Due to this mechanism, connection strength and heat dissipation are further improved.

Example of a bonding method that is applicable to any of the via first TSV, the via middle TSV, and the via last TSV include metal diffusion bonding, oxide film direct bonding, metal bump bonding, and eutectic bonding.

The metal diffusion bonding or the oxide film direct bonding has excellent bondability under low pressure and low temperature conditions. On the other hand, cleanliness to a bonding surface is required to be at the same level as that immediately after surface cleaning by Ar etching. In addition, regarding flatness, for example, the arithmetic average roughness Ra is required to be 1 nm or less. Therefore, during bonding, strict atmosphere control and flatness control are required. In addition, product groups of semiconductor devices that are manufactured by different manufacturers or by different factories of the same manufacturer, may have different kinds or different wiring rules. In a case where these product groups of semiconductor devices are 3D stacked, the most severe accuracy or control is required.

On the other hand, the bondability of metal bump bonding or eutectic bonding is excellent even in a case where some defects are present or a redundant process is present. In addition, due to deformation or flowing of a bump or a solder, the cleanliness or flatness of a device surface during bonding of different devices may be lower than that of metal diffusion bonding or oxide film direct bonding.

Examples of problems of these bonding methods include a problem that the bonding strength is lower than that of metal diffusion bonding and oxide film direct bonding and a problem that, every time stacking is repeated, a bonded portion is reheated such that device failure may occur. The document (AIST Technical Report, Mar. 8, 2013: "Multifunctional High Density 3D Integration Technology, (2) Evaluation and Analysis Technology Development for Next-Generation 3D Integration, <(2)-B Research Development of Thermal/Stacking Bonding Technology>" proposes a method of avoiding the effect of temperature history by performing temporary fixing using an organic resin during stacking, stacking all the layers, and then collectively heating and bonding the layers. By forming an electrode that does not contribute to signal transfer, heat dissipation is improved. Therefore, the application of the stacked structure to a configuration in which an organic resin layer having low thermal conductivity is used is particularly useful.

Next, a case where the anisotropic conductive member constituting the stacked structure is used for the above-described bonding will be described.

In the anisotropic conductive member used in the stacked structure, it is preferable that a resin layer is formed on at least one surface, and it is more preferable that a resin layer is formed on both surfaces.

In addition, it is preferable that the resin layer 44 of the anisotropic conductive member includes a thermosetting resin. The formed resin layer suppresses misalignment after stacking as a temporary bonding layer. Since temporary bonding can be performed at a low temperature within a short period of time, adverse effects on a device can be reduced. From the viewpoint of suppressing misalignment caused by heat in the process, the thickness of the resin layer is preferably 100 nm to 1000 nm, the thermal conductivity of the anisotropic conductive member in the thickness direction is preferably 20 to 100 W/(m·K), and the coefficient of thermal expansion (CTE) of the anisotropic conductive member is preferably 5 ppm to 10 ppm.

It is preferable that the anisotropic conductive member is supplied in a form where it is held by a support through a releasable adhesive layer. A material of the support is not particularly limited, and a material such as silicon or glass is preferable from the viewpoint that it is not likely to be bent and can secure a given level of flatness.

The releasable adhesive layer may also be an adhesive layer having low adhesiveness but is preferably an adhesive layer of which the adhesiveness deteriorates by heating or light irradiation. Examples of the adhesive layer of which the adhesiveness deteriorates by heating include REVALPHA (registered trade name; manufactured by Nitto Denko Corporation) and SOMATAC (registered trade name; manufactured by Somar Corporation). Examples of the adhesive layer of which the adhesiveness deteriorates by light irradiation include materials that can be used as a general dicing tape and a light release layer (manufactured by 3M).

In the anisotropic conductive member, a pattern may be formed at a stage where it is held by the support. Examples of the pattern formation include formation of an uneven pattern, singulation, and formation of a hydrophilic or hydrophobic pattern. It is preferable that a hydrophilic or hydrophobic pattern is formed, and it is more preferable that a hydrophilic or hydrophobic pattern is singulated.

The anisotropic conductive member includes a conductive material. Therefore, for bonding, an electrode only has to be formed on a surface of a bonding target, and a special metal bump such as a micro gold cone bump or a special technique such as MONSTER PAC Core Technology developed by CONNECTEC JAPAN Corporation, Tohoku MicroTec Co., Ltd., and HIST Masahiro AOYAGI Research Group is not required. In particular, even in a case where the surface flatness of a bonding target is low, bonding can be performed. Therefore, it is preferable that the anisotropic conductive member includes a protrusion on a surface, and it is more preferable that the anisotropic conductive member includes the protrusion portion 42a, that is, a protrusion formed of a conductive material.

In addition, in the stacked structure including the terminals having the area ratio according to the present invention, the interlayer thermal conduction is excellent. Therefore, heat is likely to be diffused to the entire stacked structure, and thus the heat dissipation is particularly excellent.

Next, a stacking method of the stacked structure will be described.

Examples of a configuration of stacking different semiconductor chips include a chip on chip (COC) method, a chip on wafer (COW) method, and a wafer on wafer (WOW) method. The COC method is a method in which a semiconductor chip is stacked on a semiconductor chip fixed to a substrate and has advantageous effects in that, for example, semiconductor chips having different sizes can be stacked and non-detective semiconductor chips can be selected before stacking. However, in a case where a large number of semiconductor chips are stacked, alignment is required for every stacking process, and thus the cost is high. The COW method is a method in which a semiconductor chip is stacked on a substrate wafer. However, in a case where a large number of semiconductor chips are stacked, alignment is required for every stacking process as in the COC method, and thus the cost is high. The WOW method is a method in which wafers are bonded to each other and has advantageous effects in that, for example, the bonding time can be reduced and the alignment can be easily performed. However, non-defective semiconductor chips can be selected, and thus the yield of a multilayer stacked structure is likely to decrease.

In order to reduce the time of alignment, a method called self-alignment in which collective alignment is performed on a wafer is considered. For example, such a technique is disclosed in JP2005-150385A or JP2014-057019A. However, these documents merely disclose a technique of aligning positions of fixed semiconductor chips, and it is necessary to further perform any one of the above-described bonding methods in order to electrically bond layers to each other. In order to apply metal diffusion bonding or oxide film direct bonding, it is necessary to accurately control the heights of all the arranged semiconductor chips, and the cost is high. On the other hand, in a case where metal bump bonding or eutectic bonding is applied, a method of performing heating and bonding per stacking process requires countermeasures against the reheating of a bonding portion, and a method of stacking all the layers and then collectively heating and bonding the stacked layers requires measures for suppressing misalignment of semiconductor chips during stacking and measures for heat dissipation.

In order to solve the above-described problems, 3D stacking using the anisotropic conductive member is useful.

Accordingly, it is preferable that the anisotropic conductive member is used for every bonding process of the stacked structure, and the stacked structure may include bonding using a method of the related art. Examples of the stacked structure including bonding using a method of the related art include a configuration in which the stacked structure including bonding using the anisotropic conductive member includes hybrid bonding between an optical semiconductor and an application specific integrated circuit (ASIC) and a configuration in which the stacked structure including bonding using the anisotropic conductive member includes surface activation bonding between a memory and an ASIC. The bonding using a method of the related art has an advantageous effect in that devices manufactured according to different rules can be easily stacked.

Examples of the 3D stacking using the anisotropic conductive member include the following configuration.

First, a first semiconductor chip group is inspected and singulated, and a first non-defective semiconductor chip group is selected.

The first non-defective semiconductor chip group is arranged on a first substrate through a first anisotropic conductive member and is temporarily bonded. The temporary bonding can be performed using a device such as a flip chip bonder. The first substrate is not particularly limited, and examples thereof include a device including a transistor and a substrate including a wiring layer and a through electrode.

A stacking-target semiconductor chip group is inspected and singulated, and a stacking-target non-defective semiconductor chip group is selected. The stacking-target semiconductor chip group is not particularly limited, and examples thereof include a configuration including a through electrode and a configuration in which a back surface of a semiconductor chip including a buried via is removed. Examples of a method of removing the back surface include wafer backgrinding, CMP, and chemical etching. In particular, a removal method such as chemical etching having low transverse stress is preferable.

The stacking-target non-defective semiconductor chip group is aligned at a position of a second substrate corresponding to the arrangement of the first non-defective semiconductor chip group on the first substrate.

After aligning the first substrate and the second substrate, a second anisotropic conductive member is interposed between the first substrate and the second substrate, and the first non-defective semiconductor chip group and the stacking-target non-defective semiconductor chip group are temporarily bonded through the second anisotropic conductive member. Next, the second substrate is removed from the stacking-target non-defective semiconductor chip group.

A structure including the first non-defective semiconductor chip group, the second anisotropic conductive member, and the stacking-target non-defective semiconductor chip group is set as a new first non-defective semiconductor chip group, and the second anisotropic conductive member and the stacking-target semiconductor chip group are repeatedly stacked until a structure including a predetermined number of layers is formed.

After forming the structure including the predetermined number of layers, the layers are collectively heated and pressurized for main bonding. As a result, a 3D bonding structure is obtained.

The obtained 3D bonding structure is sealed using a method such as compression bonding, and a desired element is obtained by singulation. By performing singulation, a process such as thinning, re-distribution, or electrode formation may be performed.

Other examples include: a configuration in which the stacking-target semiconductor chip group is bonded to the first non-defective semiconductor chip group through the second anisotropic conductive member and then is singulated; a configuration in which an anisotropic conductive member on which a pattern is formed is used as the first or second anisotropic conductive member; and a configuration an anisotropic conductive member on which a pattern is formed is used as an adhesive for arranging the stacking-target semiconductor chip group on the second substrate and is released from an interface between the second substrate and the anisotropic conductive member.

In addition, other examples include the following configuration.

First, the first anisotropic conductive member is provided on a surface of the first substrate. The first substrate may have a configuration in which a metal oxide semiconductor (MOS) is present or a configuration in which a MOS is not present.

The first semiconductor chip group is inspected and singulated, and the first non-detective semiconductor chip group is selected.

The second anisotropic conductive member is provided on a surface of the support through a temporary bonding layer of which adhesiveness deteriorates by a treatment. A material of the support is not particularly limited and is preferably silicon or glass. As the temporary bonding layer of which adhesiveness deteriorates by a treatment, a temporary bonding layer of which the adhesiveness deteriorates by heating or a temporary bonding layer of which the adhesiveness deteriorates by light irradiation is preferable.

A pattern is provided on the second anisotropic conductive member. As the pattern, a singulated hydrophilic or hydrophobic pattern is preferable. In a case where the hydrophilic or hydrophobic pattern is singulated, the anisotropic conductive member can be easily transferred to the first non-detective semiconductor chip group in a subsequent step. A method of singulation is not particularly limited, and examples thereof include a dicing method, a laser irradiation method, a stealth dicing method, a wet etching method, and a dry etching method.

Due to a self-assembly technique using the pattern, the first non-defective semiconductor chip group is arranged and temporarily bonded to the support through the second anisotropic conductive member. Examples of the self-assembly technique include a method including: forming liquid droplets including an activator on a mounting region of a substrate; placing a semiconductor chip group on the liquid droplets; aligning an element on the mounting region; drying the liquid droplets; bonding the element and the mounting substrate through a curable resin layer; and cleaning the activator. This technique is disclosed in JP2005-150385A or JP2014-057019A. During the self-assembly, an electrode may be used as an alignment mark.

The first substrate and the first non-defective semiconductor chip group are temporarily bonded through the first anisotropic conductive member. Next, by performing a treatment for deteriorating the adhesiveness of the temporary bonding layer, the temporary bonding layer is released from an interface between the second anisotropic conductive member and the support.

A structure including the first substrate, the first anisotropic conductive member, and the first non-detective semiconductor chip group is set as a new first substrate, the second anisotropic conductive member is set as a new first anisotropic conductive member, and the first non-defective semiconductor chip group and the second anisotropic conductive member are repeatedly stacked until a structure including a predetermined number of layers is formed.

After forming the structure including the predetermined number of layers, the layers are collectively treated for main bonding under conditions of a higher pressure and a higher temperature than those of the conditions used in the temporary bonding. As a result, a 3D bonding structure is obtained. The temporary bonding layer may remain in the stacked structure. Therefore, it is preferable that the temporary bonding layer is formed of a material that causes a curing reaction to progress under the main bonding conditions.

The obtained 3D bonding structure is sealed using a method such as compression bonding, and a desired stacked device is obtained by singulation. By performing singulation, a process such as thinning, re-distribution, or electrode formation may be performed.

As described above, temporary bonding and main bonding can be separated by using the anisotropic conductive member. Therefore, it is not necessary to perform a high-temperature process such as solder reflow multiple times, and the risk of device failure can be reduced. In addition, as described above, in the configuration in which the anisotropic conductive member including the resin layer on the surface is used, the resin layer can alleviate the influence of process conditions on a bonding portion. In addition, in the configuration in which the anisotropic conductive member including the protrusion on the surface, even in a case where the surface flatness of a bonding target is low, bonding can be performed. Therefore, a planarization process can be made simple.

Hereinafter, the 3D stacking using the stacked structure will be described in more detail using FIGS. 44 to 59.

Figure 44:
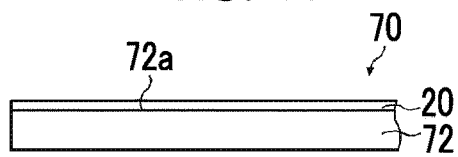
FIG. 44 is a schematic diagram illustrating one step of a seventh example of the method of manufacturing the stacked device according to the embodiment of the present invention.
Figure 54:
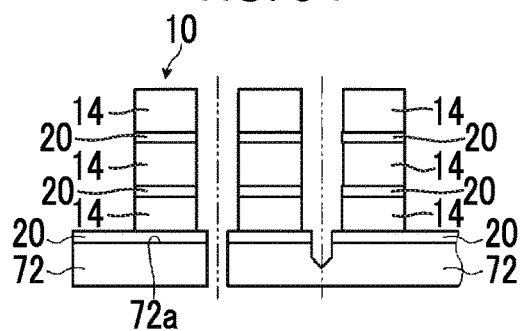
FIG. 54 is a schematic diagram illustrating one step of the seventh example of the method of manufacturing the stacked device according to the embodiment of the present invention.

FIGS. 44 and 54 are schematic diagrams illustrating a seventh example of the method of manufacturing the stacked device according to the embodiment of the present invention in the order of steps.

Figure 55:
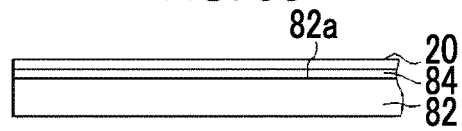
FIG. 55 is a schematic diagram illustrating one step of a method of manufacturing a stacked structure used in the seventh example of the method of manufacturing the stacked device according to the embodiment of the present invention.
Figure 56:
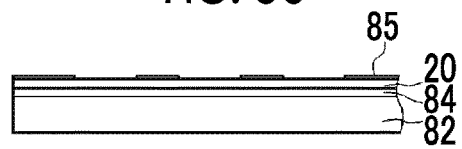
FIG. 56 is a schematic diagram illustrating one step of the method of manufacturing the stacked structure used in the seventh example of the method of manufacturing the stacked device according to the embodiment of the present invention.
Figure 57:
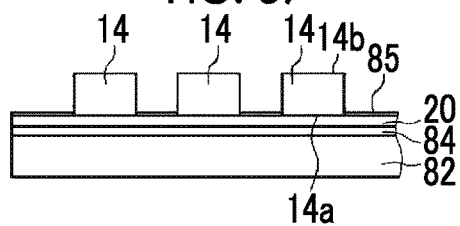
FIG. 57 is a schematic diagram illustrating one step of the method of manufacturing the stacked structure used in the seventh example of the method of manufacturing the stacked device according to the embodiment of the present invention.

FIGS. 55 to 57 are schematic diagrams illustrating a method of manufacturing the stacked structure used in the seventh example of the method of manufacturing the stacked device according to the embodiment of the present invention in the order of steps.

Figure 58:
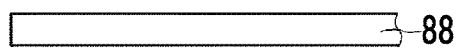
FIG. 58 is a schematic diagram illustrating one step of the method of manufacturing the stacked structure used in the seventh example of the method of manufacturing the stacked device according to the embodiment of the present invention.
Figure 59:
FIG. 59 is a schematic diagram illustrating one step of the method of manufacturing the stacked structure used in the seventh example of the method of manufacturing the stacked device according to the embodiment of the present invention.

FIGS. 58 and 59 are schematic diagrams illustrating a method of manufacturing the stacked structure used in the seventh example of the method of manufacturing the stacked device according to the embodiment of the present invention in the order of steps.

The seventh example of the method of manufacturing the stacked device relates to 3D stacking, in which the same anisotropic conductive member as that of the fifth example of the method of manufacturing the stacked device is used. Therefore, the detailed description of the method common to the fifth example of the method of manufacturing the stacked device will not be repeated.

First, as illustrated in FIG. 44, a first stacked substrate 70 in which the anisotropic conductive member 20 is provided on the entire region of a surface 72a of a semiconductor wafer 72 is prepared. For example, the semiconductor wafer 72 can be made to have the same configuration as that of the first semiconductor wafer 60 including a plurality of element regions (not illustrated). As the semiconductor wafer 72, the above-described interposer 18 can also be used.

Figure 45:
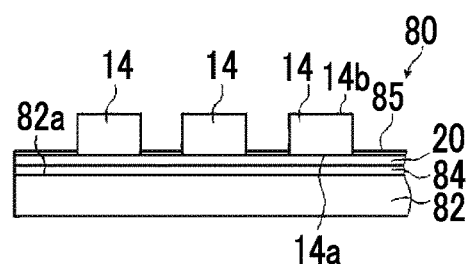
FIG. 45 is a schematic diagram illustrating one step of the seventh example of the method of manufacturing the stacked device according to the embodiment of the present invention.

In addition, as illustrated in FIG. 45, a second stacked substrate 80 in which the plurality of semiconductor elements 14 are provided is prepared. In the second stacked substrate 80, a release functional layer 84 and the anisotropic conductive member 20 are stacked on a surface 82a of a second substrate 82. The plurality of semiconductor elements 14 are provided on the anisotropic conductive member 20. A hydrophilic or hydrophobic film 85 is provided in a region of the anisotropic conductive member 20 where the semiconductor elements 14 are not provided.

In the second stacked substrate 80, the back surface 14b of the semiconductor element 14 is a surface on the second substrate 82 side, and the surface 14a thereof is a surface opposite to the surface on the second substrate 82 side. As the semiconductor element 14, for example, a non-defective semiconductor element that is inspected and selected is used.

The release functional layer 84 is configured with, for example, an adhesive layer of which the adhesiveness deteriorates by heating or light irradiation. Examples of the adhesive layer of which the adhesiveness deteriorates by heating include REVALPHA (registered trade name: manufactured by Nitto Denko Corporation) and SOMATAC (registered trade name; manufactured by Somar Corporation). Examples of the adhesive layer of which the adhesiveness deteriorates by light irradiation include materials that can be used as a general dicing tape and a light release layer (manufactured by 3M).

Figure 46:
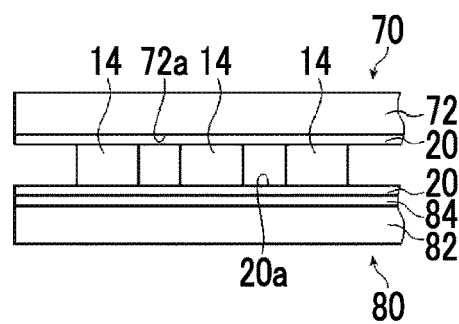
FIG. 46 is a schematic diagram illustrating one step of the seventh example of the method of manufacturing the stacked device according to the embodiment of the present invention.

Next, as illustrated in FIG. 46, the first stacked substrate 70 and the second stacked substrate 80 are temporarily bonded. A method of the temporary bonding is as described above. In addition, for the temporary bonding, a device such as a flip chip bonder can be used.

Figure 47:
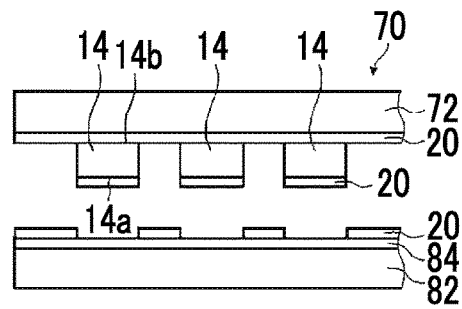
FIG. 47 is a schematic diagram illustrating one step of the seventh example of the method of manufacturing the stacked device according to the embodiment of the present invention.

Next, as illustrated in FIG. 47, the second substrate 82 is removed from the second stacked substrate 80. In this case, the semiconductor elements 14 are temporarily bonded to the anisotropic conductive member 20 of the semiconductor wafer 72, and the anisotropic conductive member 20 is transferred to the surfaces 14a of the semiconductor elements 14.

The second substrate 82 is removed by deteriorating the adhesiveness of release functional layer 84 by heating or light irradiation.

Figure 48:
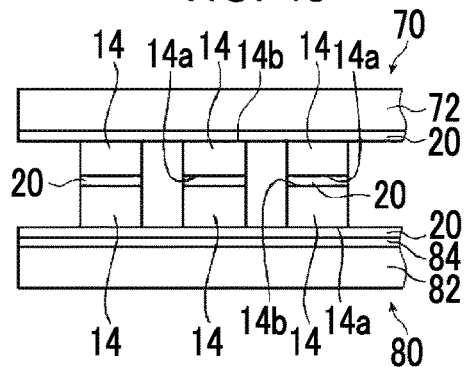
FIG. 48 is a schematic diagram illustrating one step of the seventh example of the method of manufacturing the stacked device according to the embodiment of the present invention.

Next, as illustrated in FIG. 48, another second stacked substrate 80 is temporarily bonded to the anisotropic conductive member 20 on the surfaces 14a side of the semiconductor elements 14 such that positions of the semiconductor elements 14 are aligned. In this case, the back surfaces 14b of the semiconductor elements 14 of the other second stacked substrate 80 are temporarily bonded to the anisotropic conductive member 20 on the surfaces 14a side of the semiconductor elements 14 that are temporarily bonded to the semiconductor wafer 72. A method of the temporary bonding is as described above.

Figure 49:
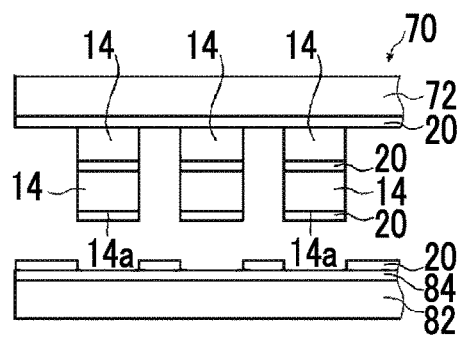
FIG. 49 is a schematic diagram illustrating one step of the seventh example of the method of manufacturing the stacked device according to the embodiment of the present invention.

Next, as illustrated in FIG. 49, the second substrate 82 is removed from the other second stacked substrate 80. A method of removing the second substrate 82 is as described above.

As illustrated in FIG. 49, the semiconductor elements 14 are temporarily bonded to the anisotropic conductive member 20 of the semiconductor elements 14 on the semiconductor wafer 72 side, and the anisotropic conductive member 20 is transferred to the surfaces 14a of the semiconductor elements 14. FIG. 49 illustrates a configuration in which two layers of the semiconductor elements 14 are provided. This way, by repeating the temporary bonding of the second stacked substrate 80, the number of stacked layers of the semiconductor element 14 can be controlled.

Figure 50:
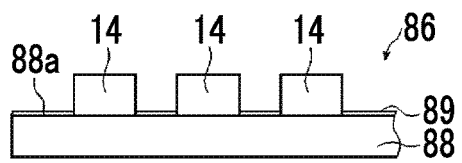
FIG. 50 is a schematic diagram illustrating one step of the seventh example of the method of manufacturing the stacked device according to the embodiment of the present invention.

Here, a third complex stacked structure 86 illustrated in FIG. 50 is prepared. The third complex stacked structure 86 includes a third substrate 88, and a hydrophilic or hydrophobic film 89 is formed in a specific pattern on a surface 88a of the third substrate 88. In addition, the semiconductor elements 14 are provided on the surface 88a of the third substrate 88, that is, on a region where the hydrophilic or hydrophobic film 89 is not provided. Even in this case, as the semiconductor element 14, for example, a non-defective semiconductor element that is inspected and selected is used.

The hydrophilic or hydrophobic film 89 can be formed in a specific pattern, for example, by applying a water-repellent material through a mask to form a desired pattern. As the water-repellent material, a compound such as alkylsilane or fluoroalkylsilane can be used. As the water-repellent material, a material that exhibits a water repellent effect due to its shape, for example, a phase-separated structure such as isotactic polypropylene (i-PP) can be used.

Figure 51:
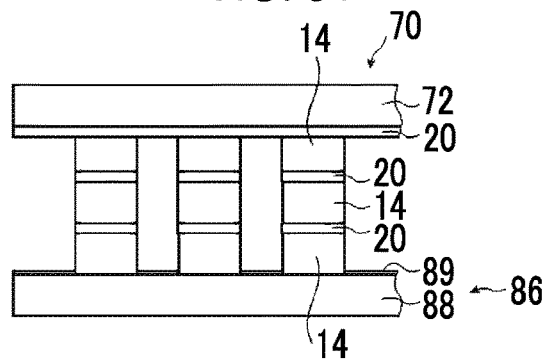
FIG. 51 is a schematic diagram illustrating one step of the seventh example of the method of manufacturing the stacked device according to the embodiment of the present invention.

Next, as illustrated in FIG. 51, the third complex stacked structure 86 is temporarily bonded to the anisotropic conductive member 20 on the surfaces 14a side of the semiconductor elements 14 in the first stacked substrate 70 in which two layers of the semiconductor elements 14 are provided such that positions of the semiconductor elements 14 are aligned. As a result, three layers of the semiconductor elements 14 are provided.

Figure 52:
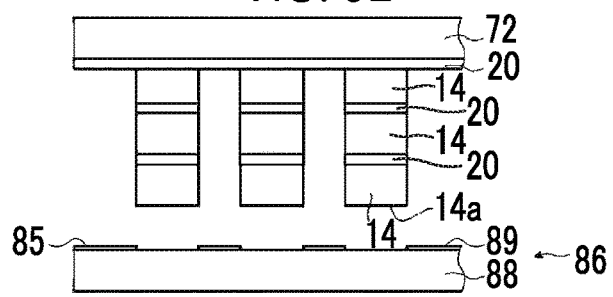
FIG. 52 is a schematic diagram illustrating one step of the seventh example of the method of manufacturing the stacked device according to the embodiment of the present invention.

Next, as illustrated in FIG. 52, the third substrate 88 is removed from the third complex stacked structure 86. A method of removing the third substrate 88 is the same as the method of removing the second substrate 82.

Figure 53:
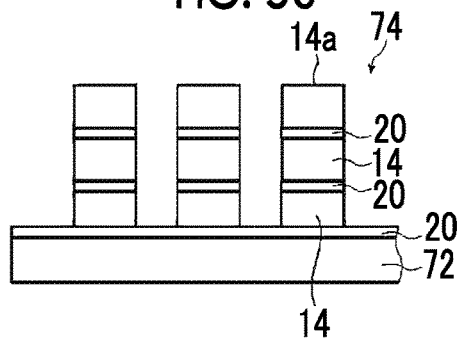
FIG. 53 is a schematic diagram illustrating one step of the seventh example of the method of manufacturing the stacked device according to the embodiment of the present invention.

Next, the layers are collectively treated for main bonding under conditions of a higher pressure and a higher temperature than those of the conditions used in the temporary bonding such that the semiconductor elements 14, the anisotropic conductive members 20, and the semiconductor wafer 72 are mainly bonded to each other. As a result, a 3D bonding structure 74 illustrated in FIG. 53 is obtained. A process such as thinning, re-distribution, or electrode formation may be performed on the 3D bonding structure 74.

Next, the semiconductor wafer 72 and the anisotropic conductive member 20 of the 3D bonding structure 74 are cut and singulated as illustrated in FIG. 54. As a result, the stacked device 10 in which the three semiconductor elements 14 are bonded to each other through the anisotropic conductive members 20 can be obtained. As a method of singulation, the above-described method can be appropriately used.

As illustrated in FIG. 55, the second stacked substrate 80 illustrated in FIG. 45 is formed by stacking the release functional layer 84 and the anisotropic conductive member 20 on the surface 82a of the second substrate 82.

Next, as illustrated in FIG. 56, the hydrophilic or hydrophobic film 85 is formed in a specific pattern on the anisotropic conductive member 20.

The hydrophilic or hydrophobic film 85 is formed in a pattern on the anisotropic conductive member 20 using a method such as a lithography method or a self-organization method. Examples of a hydrophilic material for forming a hydrophilic pattern of the hydrophilic or hydrophobic film 85 include a hydrophilic polymer such as a polyvinyl alcohol.

In addition, the hydrophilic or hydrophobic film 85 can also be formed using the material used for the above-described hydrophilic or hydrophobic film 89. The hydrophilic or hydrophobic film 85 can also be formed in a specific pattern by exposure development using a resist material including a fluorine material.

In addition, as illustrated in FIG. 57, the semiconductor elements 14 are provided in a region where the hydrophilic or hydrophobic film 85 is not provided. As a result, the second stacked substrate 80 illustrated in FIG. 45 is obtained.

Examples of a method of providing the semiconductor elements 14 that can be used include a method including: forming liquid droplets including an activator in the region where the hydrophilic or hydrophobic film 85 is not provided; placing and aligning the semiconductor elements 14 on the liquid droplets; drying the liquid droplets; bonding the semiconductor elements 14 and the second substrate 82 to each other through a curable resin layer; and cleaning the activator.

In the third complex stacked structure 86 illustrated in FIG. 50, the third substrate 88 is prepared as illustrated in FIG. 58. Next, as illustrated in FIG. 59, the hydrophilic or hydrophobic film 89 is formed in a specific pattern on the surface 88a of the third substrate 88. The hydrophilic or hydrophobic film 89 has the same configuration as that of the above-described hydrophilic or hydrophobic film 85 and can be formed using the same method.

Next, the semiconductor elements 14 are provided in a region where the hydrophilic or hydrophobic film 89 is not provided. Examples of a method of providing the semiconductor elements 14 that can be used include a method including: forming liquid droplets including an activator in the region where the hydrophilic or hydrophobic film 89 is not provided; placing and aligning the semiconductor elements 14 on the liquid droplets; drying the liquid droplets; bonding the semiconductor elements 14 and the third substrate 88 to each other through a curable resin layer; and cleaning the activator. As a result, the third complex stacked structure 86 illustrated in FIG. 50 is obtained.

In addition, the embodiment is also applicable to a new method in which a TSV is not used. There may be a case where 3D mounting does not require bonding having the one-to-plurality configuration or the plurality-to-plurality configuration. At this time, normally, it is necessary to impart an interposer function to any device in advance. However, in a case where a heterogeneous bonding environment is taken into consideration, it is not preferable to design individual devices to be assembled in advance.

As a method of solving the above-described problem, a method of using the re-distribution layer (RDL) alone is proposed. By bonding the re-distribution layer having an interposer function that connects various devices to each other to the anisotropic conductive film to be embedded therein, a reduction in height and a TSV-free configuration can be realized irrespective of individual device designs.

A stack in which a plurality of devices are stacked in an organic substrate can also be provided using the above-described method.

Examples of the assembly are illustrated in FIGS. 60 to 77. Of course, a specific method of the assembly is not limited to those illustrated in FIGS. 60 to 77.

Figure 60:
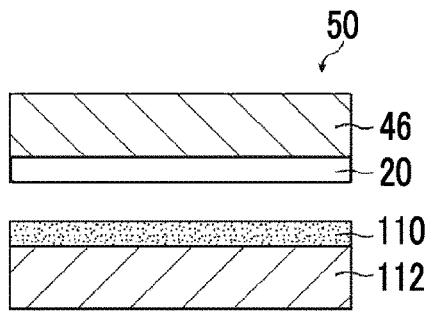
FIG. 60 is a schematic diagram illustrating one step of an eighth example of the method of manufacturing the stacked device according to the embodiment of the present invention.
Figure 71:
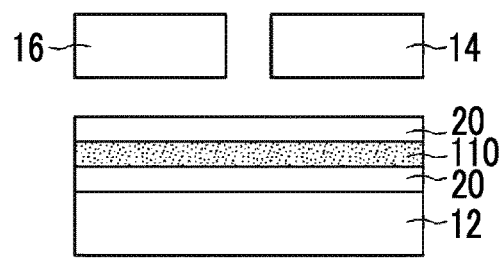
FIG. 71 is a schematic diagram illustrating one step of the eighth example of the method of manufacturing the stacked device according to the embodiment of the present invention.
Figure 72:
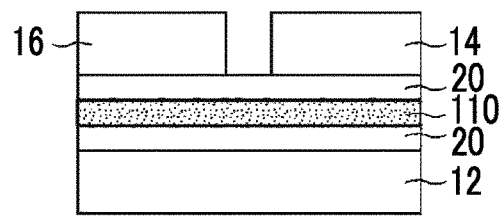
FIG. 72 is a schematic diagram illustrating one step of the eighth example of the method of manufacturing the stacked device according to the embodiment of the present invention.
Figure 73:
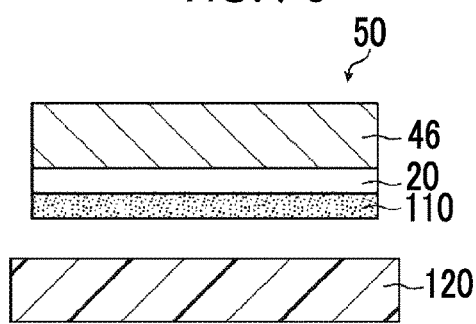
FIG. 73 is a schematic diagram illustrating one step of a ninth example of the method of manufacturing the stacked device according to the embodiment of the present invention.
Figure 76:
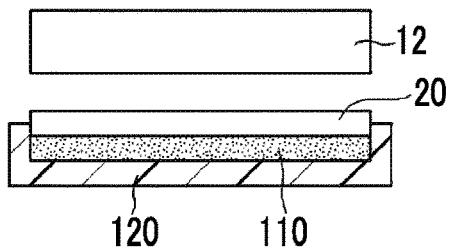
FIG. 76 is a schematic diagram illustrating one step of the ninth example of the method of manufacturing the stacked device according to the embodiment of the present invention.
Figure 77:
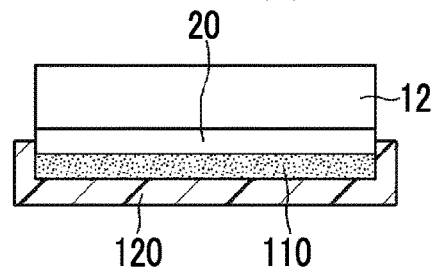
FIG. 77 is a schematic diagram illustrating one step of the ninth example of the method of manufacturing the stacked device according to the embodiment of the present invention.

FIGS. 60 and 72 are schematic diagrams illustrating an eighth example of the method of manufacturing the stacked device according to the embodiment of the present invention in the order of steps. FIGS. 73 and 77 are schematic diagrams illustrating a ninth example of the method of manufacturing the stacked device according to the embodiment of the present invention in the order of steps. In FIGS. 60 to 77, the same structures in the anisotropic conductive material 50 illustrated in FIG. 12 and the stacked device 10 illustrated in FIG. 13 are represented by the same reference numerals, and the detailed description thereof will not be repeated.

First, the anisotropic conductive material 50 including the support 46 and the anisotropic conductive member 20 and a wafer 112 in which a re-distribution layer 110 is provided are prepared. The re-distribution layer 110 has the above-described interposer function. In addition, the re-distribution layer 110 can also be made to have the same configuration as that of the above-described re-distribution layer 34.

Figure 61:
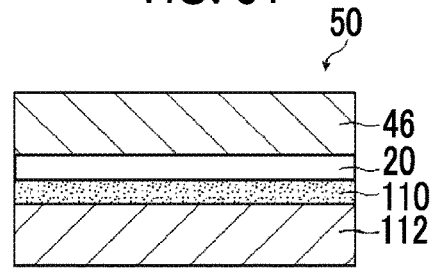
FIG. 61 is a schematic diagram illustrating one step of the eighth example of the method of manufacturing the stacked device according to the embodiment of the present invention.

As illustrated in FIG. 60, the re-distribution layer 110 is arranged to face the anisotropic conductive member 20, and the anisotropic conductive member 20 and the re-distribution layer 110 are bonded and electrically connected to each other as illustrated in FIG. 61.

Figure 62:
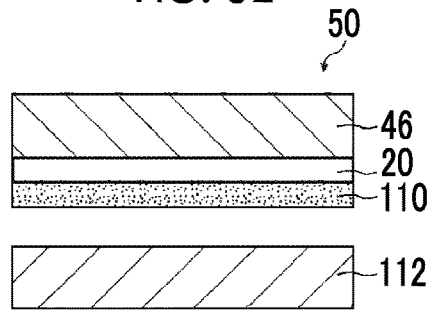
FIG. 62 is a schematic diagram illustrating one step of the eighth example of the method of manufacturing the stacked device according to the embodiment of the present invention.

Next, as illustrated in FIG. 62, the wafer 112 is separated from the re-distribution layer 110.

Figure 63:
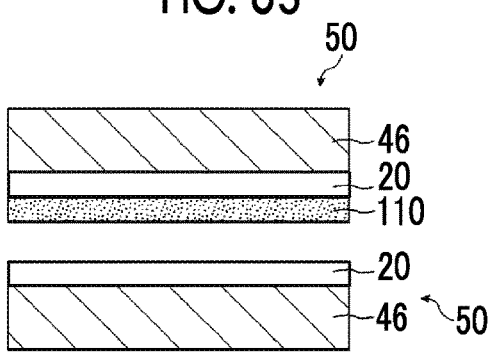
FIG. 63 is a schematic diagram illustrating one step of the eighth example of the method of manufacturing the stacked device according to the embodiment of the present invention.

Next, as illustrated in FIG. 63, the anisotropic conductive material 50 is arranged such that the anisotropic conductive member 20 faces the re-distribution layer 110.

Figure 64:
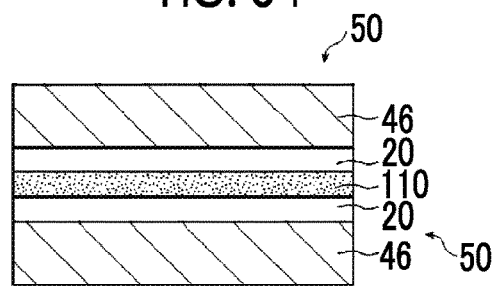
FIG. 64 is a schematic diagram illustrating one step of the eighth example of the method of manufacturing the stacked device according to the embodiment of the present invention.
Figure 65:
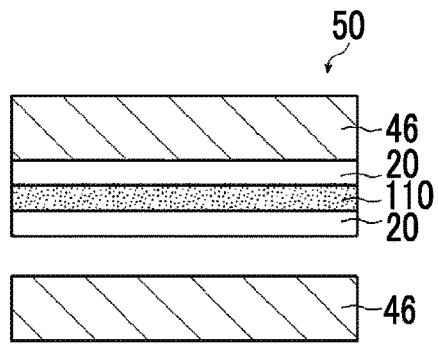
FIG. 65 is a schematic diagram illustrating one step of the eighth example of the method of manufacturing the stacked device according to the embodiment of the present invention.

Next, the re-distribution layer 110 and the anisotropic conductive member 20 are bonded to each other as illustrated in FIG. 64, and one support 46 is separated as illustrated in FIG. 65.

Figure 66:
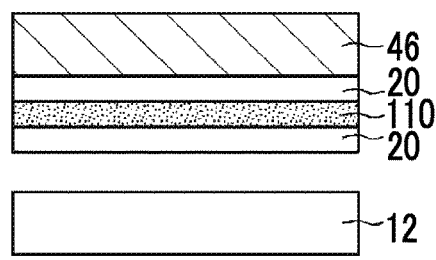
FIG. 66 is a schematic diagram illustrating one step of the eighth example of the method of manufacturing the stacked device according to the embodiment of the present invention.
Figure 67:
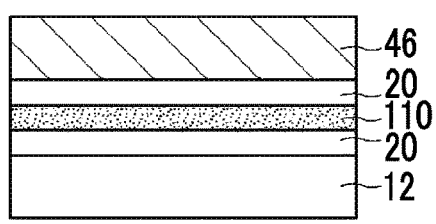
FIG. 67 is a schematic diagram illustrating one step of the eighth example of the method of manufacturing the stacked device according to the embodiment of the present invention.
Figure 68:
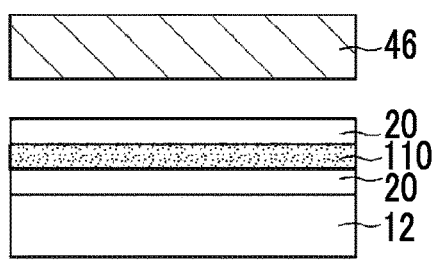
FIG. 68 is a schematic diagram illustrating one step of the eighth example of the method of manufacturing the stacked device according to the embodiment of the present invention.

Next, as illustrated in FIG. 66, the semiconductor element 12 is arranged to face the anisotropic conductive member 20 from which the one support 46 is separated. Next, as illustrated in FIG. 67, the anisotropic conductive member 20 and the semiconductor element 12 are bonded and electrically connected to each other. Next, as illustrated in FIG. 68, the remaining support 46 is separated.

Figure 69:
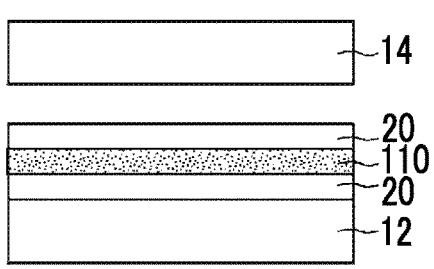
FIG. 69 is a schematic diagram illustrating one step of the eighth example of the method of manufacturing the stacked device according to the embodiment of the present invention.

Next, as illustrated in FIG. 69, the semiconductor element 14 is arranged to face the anisotropic conductive member 20 from which the remaining support 46 on the side where the semiconductor element 12 is not provided is separated.

Figure 70:
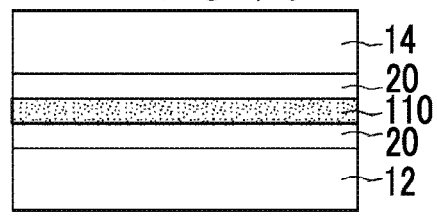
FIG. 70 is a schematic diagram illustrating one step of the eighth example of the method of manufacturing the stacked device according to the embodiment of the present invention.

Next, as illustrated in FIG. 70, the anisotropic conductive member 20 and the semiconductor element 14 are bonded and electrically connected to each other. As a result, the semiconductor element 12 and the semiconductor element 14 can be stacked without using a TSV.

In FIG. 69, the semiconductor element 14 is arranged, but the embodiment is not limited thereto. As illustrated in FIG. 71, the semiconductor element 14 and the semiconductor element 16 may be arranged with respect to the one semiconductor element 12. In this case, as illustrated in FIG. 72, the plurality of semiconductor elements 14 and the plurality of semiconductor elements 16 are arranged with respect to the one semiconductor element 12. Even in this case, the semiconductor element 14 and the semiconductor element 16 can be stacked on the semiconductor element 12 without using a TSV.

In addition, the re-distribution layer 110 is not limited to being used alone and can also be embedded in an organic substrate and used.

In this case, as illustrated in FIG. 73, an organic substrate 120 is arranged to face the re-distribution layer 110 with respect to the anisotropic conductive material 50 in which the re-distribution layer 110 is provided. For example, the organic substrate 120 functions as an interposer.

Figure 74:
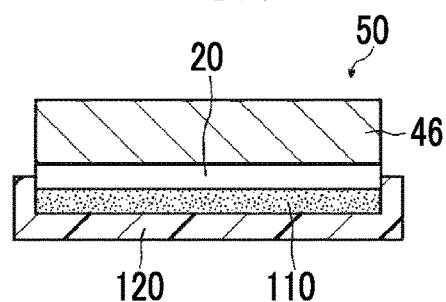
FIG. 74 is a schematic diagram illustrating one step of the ninth example of the method of manufacturing the stacked device according to the embodiment of the present invention.

Next, as illustrated in FIG. 74, the organic substrate 120 is electrically connected to the re-distribution layer 110, for example, using a solder. In this case, the re-distribution layer 110 may be embedded in the organic substrate 120.

Figure 75:
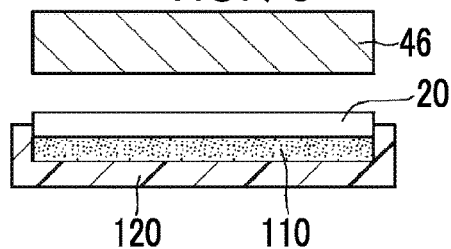
FIG. 75 is a schematic diagram illustrating one step of the ninth example of the method of manufacturing the stacked device according to the embodiment of the present invention.

Next, as illustrated in FIG. 75, the support 46 is separated. Next, as illustrated in FIG. 76, the semiconductor element 12 is arranged to face the anisotropic conductive member 20.

Next, as illustrated in FIG. 77 the semiconductor element 12 is bonded and electrically connected to the anisotropic conductive member 20. As a result, the stacked device in which the re-distribution layer 110 and the semiconductor element 12 are stacked can be obtained.

In the above description, a semiconductor element is used as an example, but the embodiment is not limited thereto. A semiconductor wafer may be used instead of a semiconductor element.

In addition, the configuration of the semiconductor element is not particularly limited, and the above-described examples can be appropriately used.

Hereinafter, the anisotropic conductive member 20 will be described in more detail.

[Insulating Substrate]

The insulating substrate is not particularly limited as long as it is formed of an inorganic material and has the same level of electrical resistivity (about $10^{14}$ Ω·cm) as that of an insulating substrate constituting a well-known anisotropic conductive film of the related art.

"Being formed of an inorganic material" is an expression for distinguishing from a polymer material constituting a resin layer described below, is not limited to being formed of only an inorganic material, and represents containing an inorganic material as a major component (50 mass % or higher).

Examples of the insulating substrate include a metal oxide substrate, a metal nitride substrate, a glass substrate, a ceramic substrate such as silicon carbide or silicon nitride, a carbon substrate such as diamond-like carbon, a polyimide substrate, and a composite material thereof. In addition to the above examples, the insulating substrate may be formed on an organic base having through holes using an inorganic material including 50 mass % or higher of a ceramic material or a carbon material.

As the insulating substrate, from the viewpoint that micropores having a desired average opening size are formed as through holes and conductive paths described below are likely to be formed, a metal oxide substrate is preferable, and an anodic oxidation film formed of valve metal is more preferable.

Here, specific examples of the valve metal include aluminum, tantalum, niobium, titanium, hafnium, zirconium, zinc, tungsten, bismuth, and antimony. Among these, from the viewpoint of higher dimension stability and a relatively low cost, an aluminum anodic oxidation film (substrate) is preferable.

The interval between the respective conductive paths in the insulating substrate is preferably 5 nm to 800 nm, more preferably 10 nm to 200 nm, and still more preferably 50 nm to 140 nm. In a case where the interval between the respective conductive paths in the insulating substrate is in the above-described range, the insulating substrate sufficiently functions an insulating partition wall.

Here, the interval between the respective conductive paths refers to a width w between conductive paths adjacent to each other and refers to an average value that is obtained by observing a cross-section of the anisotropic conductive member using a field emission scanning electron microscope at a magnification of 200,000-power, measuring widths between conductive paths adjacent to each other at 10 points, and obtaining the average of the measured widths,

[Conductive Path]

A plurality of conductive paths penetrate the insulating substrate in the thickness direction, are provided in a state where the conductive paths are electrically insulated from each other, and are formed of a conductive material.

The conductive path includes a protrusion portion that protrudes from the surface of the insulating substrate, and an end portion of the protrusion portion of each of the conductive paths may be buried in a resin layer described below.

<Conductive Material>

The conductive material constituting the conductive path is not particularly limited as long as it is a material having an electrical resistivity of $10^3$ Ω·cm or lower, and preferable specific examples thereof include gold (Au), silver (Ag), copper (Cu), aluminum (Al), magnesium (Mg), nickel (Ni), and tin oxide doped with indium (ITO).

Among these, from the viewpoint of electrical conductivity, copper, gold, aluminum, or nickel is preferable and copper or gold is more preferable.

<Protrusion Portion>

The protrusion portion of the conductive path is a portion of the conductive path that protrudes from the surface of the insulating substrate, and an end portion of the protrusion portion is buried in the resin layer.

From the viewpoint that, in a case where the anisotropic conductive member and an electrode are electrically or physically connected to each other using a method such as pressure bonding and the protrusion portion is collapsed, the insulating characteristics in a plane direction can be sufficiently secured, an aspect ratio (the height of the protrusion portion/the diameter of the protrusion portion) of the protrusion portion of the conductive path is preferably 0.5 or higher and lower than 50, more preferably 0.8 to 20, and still more preferably 1 to 10.

In addition, from the viewpoint of conformability of a connection target to a surface shape of a semiconductor chip or a semiconductor wafer, as described above, the height of the protrusion portion of the conductive path is preferably 20 nm or higher and more preferably 100 nm to 500 nm.

The height of the protrusion portion of the conductive path refers to an average value that is obtained by observing a cross-section of the anisotropic conductive member using a field emission scanning electron microscope at a magnification of 20,000-power and measuring the height of the protrusion portion of the conductive path at 10 points, and obtaining the average of the measured heights.

The diameter of the protrusion portion of the conductive path refers to an average value that is obtained by observing a cross-section of the anisotropic conductive member using a field emission scanning electron microscope, measuring the diameter of the protrusion portion of the conductive path at 10 points, and obtaining the average of the measured heights.

<Other Shapes>

The conductive paths have a columnar shape, and like the diameter of the protrusion portion, a diameter d of the conductive path is preferably more than 5 nm and 10 μm or less, more preferably 20 nm to 1000 nm, and still more preferably 100 nm or less.

In addition, the conductive paths are present in a state where they are electrically insulated from each other by the insulating substrate, and the density thereof is preferably 20,000 pieces/mm$^2$ or more, more preferably 2,000,000 pieces/mm$^2$ or more, still more preferably 10,000,000 pieces/mm$^2$ or more, still more preferably 50,000,000 pieces/mm$^2$ or more, and most preferably 100,000,000 pieces/mm$^2$ or more.

Further, a distance p between the centers of the respective conductive paths adjacent to each other is preferably 20 nm to 500 nm, more preferably 40 nm to 200 nm, and still more preferably 50 nm to 140 nm.

[Resin Layer]

The resin layer is provided in the surface of the insulating substrate, and the above-described conductive paths are buried in the resin layer. That is, the resin layer covers the surface of the insulating substrate and the end portions of the conductive paths that protrude from the insulating substrate.

The resin layer imparts bondability to a connection target. It is preferable that the resin layer shows fluidity, for example, in a temperature range of 50° C. to 200° C. and is cured at 200° C. or higher.

Hereinafter, the composition of the resin layer will be described. The resin layer includes a polymer material. The resin layer may include an antioxidation material.

<Polymer Material>

The polymer material included in the resin layer is not particularly limited and is preferably a thermosetting resin from the viewpoint that it can fill a gap between a semiconductor chip or a semiconductor wafer and the anisotropic conductive member and can further improve adhesiveness with a semiconductor chip or a semiconductor wafer.

Specific examples of the thermosetting resin include an epoxy resin, a phenolic resin, a polyimide resin, a polyester resin, a polyurethane resin, a bismaleimide resin, a melamine resin, and an isocyanate resin.

Among these, from the viewpoint of further improving insulating reliability and obtaining excellent chemical resistance, it is preferable that a polyimide resin and/or an epoxy resin is used.

<Antioxidation Material>

Specific examples of the antioxidation material included in the resin layer include 1,2,3,4-tetrazole, 5-amino-1,2,3,4-tetrazole, 5-amino-1,2,3,4-tetrazole, 1H-tetrazole-5-acetic acid, 1H-tetrazole-5-succinic acid, 1,2,3-triazole, 4-amino-1,2,3-triazole, 4,5-diamino-1,2,3-triazole, 4-carboxy-1H-1,2,3-triazole, 4,5-dicarboxy-1H-1,2,3-triazole, 1H-1,2,3-triazole-4-acetic acid, 4-carboxy-5-carboxymethyl-1H-1,2,3-triazole, 1,2,4-triazole, 3-amino-1,2,4-triazole, 3,5-diamino-1,2,4-triazole, 3-carboxy-1,2,4-triazole, 3,5-dicarboxy-1,2,4-triazole, 1,2,4-triazole-3-acetic acid, 1H-benzotriazole, 1H-benzotriazole-5-carboxylic acid, benzofuroxan, 2,1,3-benzothiazole, o-phenylenediamine, m-phenylenediamine, catechol, o-aminophenol, 2-mercaptobenzothiazole, 2-mercaptobenzimidazole, 2-mercaptobenzoxazole, melamine, and derivatives thereof.

Among these, benzotriazole or a derivative thereof is preferable.

Examples of the benzotriazole derivative include a substituted benzotriazole having a hydroxyl group, an alkoxy group (for example, a methoxy group or an ethoxy group), an amino group, a nitro group, an alkyl group (for example, a methyl group, an ethyl group, or a butyl group), or a halogen atom (for example, fluorine, chlorine, bromine, or iodine) in a benzene ring of benzotriazole. In addition, naphthalene triazole, naphthalene bistriazole, a substituted naphthalene triazole that is substituted as described above, or a substituted naphthalene bistriazole that is substituted as described above can also be used.

In addition, other examples of the antioxidation material included in the resin layer include general antioxidants such as higher fatty acid, higher fatty acid copper, a phenol compound, alkanolamine, hydroquinones, a copper chelating agent, an organic amine, and an organic ammonium salt.

The content of the antioxidation material included in the resin layer is not particularly limited and, from the viewpoint of an anticorrosive effect, is preferably 0.0001 mass % or higher and more preferably 0.001 mass % or higher with respect to the total mass of the resin layer. In addition, from the viewpoint of obtaining an appropriate electrical resistance in the main bonding process, the content of the antioxidation material is preferably 5.0 mass % or lower and more preferably 2.5 mass % or lower.

<Migration Inhibiting Material>

It is preferable that the resin layer includes a migration inhibiting material from the viewpoint that the migration inhibiting material can further improve insulating reliability by trapping a metal ion or a halogen ion that may be included in the resin layer and a metal ion derived from a semiconductor chip or a semiconductor wafer.

As the migration inhibiting material, for example, an ion exchanger, specifically, a mixture of a cation exchanger and an anion exchanger or only a cation exchanger can be used.

Here, each of the cation exchanger and the anion exchanger can be appropriately selected from an inorganic ion exchanger and an organic ion exchanger described below.

(Inorganic Ion Exchanger)

Examples of the inorganic ion exchanger include a metal hydrous oxide such as hydrous zirconium oxide.

As the kind of the metal, for example, in addition to zirconium, iron, aluminum, tin, titanium, antimony, magnesium, beryllium, indium, chromium, bismuth, or the like is known.

Among these, hydrous zirconium oxide has exchange capacity for $Cu^{2+}$ and $Al^{3+}$ as a cation. In addition, hydrous iron oxide has exchange capacity for $Ag^+$ and $Cu^{2+}$. Likewise, hydrous tin oxide, hydrous titanium oxide, and hydrous antimony oxide are cation exchangers.

On the other hand, hydrous bismuth oxide has exchange capacity for $Cl^-$ as an anion.

In addition, hydrous zirconium oxide has exchange capacity for an anion depending on manufacturing conditions. The same can be applied to hydrous aluminum oxide and hydrous tin oxide.

As an inorganic ion exchanger other than the above-described examples, a polyvalent metal acid salt such as zirconium phosphate or a heteropolyacid salt such as ammonium molybdophosphate, or a synthetic product such as insoluble ferrocyanide is known.

Some of the inorganic ion exchangers are already commercially available. For example, various grades of trade name "IXE" (manufactured by Toagosei Co., Ltd.) are known.

In addition to the synthetic products, natural zeolite or inorganic ion exchanger powder such as montmorillonite can be used.

(Organic Ion Exchanger)

Examples of a cation exchanger as the organic ion exchanger include a crosslinked polystyrene having a sulfonate group, a carboxylate group, a phosphonate group, or a phosphinate group.

In addition, examples of an anion exchanger as the organic ion exchanger include a crosslinked polystyrene having a quaternary ammonium group, a quaternary phosphonium group, or a tertiary sulfonium group.

The inorganic ion exchanger or the organic ion exchanger may be appropriately selected in consideration of a cation or an anion to be trapped and the exchange capacity of the ion. Of course, a mixture of the inorganic ion exchanger and the organic ion exchanger may also be used.

Steps of manufacturing an electronic element include a heating process, the inorganic ion exchanger is preferable.

In addition, regarding a mixing ratio between the migration inhibiting material and the polymer material, for example, from the viewpoint of mechanical strength, the content of the migration inhibiting material is preferably 10 mass % or lower, more preferably 5 mass % or lower, and still more preferably 2.5 mass % or lower. In addition, from the viewpoint of suppressing migration in a case where a semiconductor chip or a semiconductor wafer and the anisotropic conductive member are bonded to each other the content of the migration inhibiting material is preferably 0.01 mass % or higher.

<Inorganic Filler>

It is preferable that the resin layer includes an inorganic filler.

The inorganic filler is not particularly limited and can be appropriately selected from well-known inorganic fillers. Examples of the inorganic filler include kaolin, barium sulfate, barium titanate, silicon oxide powder, pulverized silicon oxide, gas-phase silica, amorphous silica, crystalline silica, fused silica, spherical silica, talc, clay, magnesium carbonate, calcium carbonate, aluminum oxide, aluminum hydroxide, mica, aluminum nitride, zirconium oxide, yttrium oxide, silicon carbide, and silicon nitride.

From the viewpoint of preventing the inorganic filler from entering a gap between the conductive paths and further improving conductivity reliability, the average particle size of the inorganic filler is preferably more than the interval between the respective conductive paths.

The average particle size of the inorganic filler is preferably 30 nm to 10 μm and more preferably 80 nm to 1 μm.

Here, the average particle size refers to a primary particle size measured using a laser diffraction scattering particle size distribution analyzer (MICROTRAC MT3300, manufactured by Nikkiso Co., Ltd.).

<Curing Agent>

The resin layer may include a curing agent.

In a case where the resin layer includes a curing agent, it is more preferable that the resin layer includes a curing agent that is solid at normal temperature is not used and a curing agent that is liquid at normal temperature from the viewpoint of suppressing bonding failure of a connection target to a surface shape of a semiconductor chip or a semiconductor wafer.

Here, "being solid at normal temperature" represents being solid at 25° C. and refers to a material having a melting point of higher than 25° C.

Specific examples of the curing agent include an aromatic amine such as diaminodiphenylmethane or diaminodiphenylsulfone, an aliphatic amine, an imidazole derivative such as 4-methylimidazole, dicyandiamide, tetramethylguanidine, thiourea-added amine, a carboxylic anhydride such as methylhexahydrophthalic anhydride, carboxylic acid hydrazide, carboxylic acid amide, a polyphenol compound, a novolac resin, and polymercaptan. A curing agent that is liquid at 25° C. can be appropriately selected from the above curing agents and used. As the curing agent, one kind may be used alone, or two more kinds may be used in combination.

Within a range where the properties do not deteriorate, the resin layer may include various additives such as a dispersant, a buffer agent, or a viscosity adjuster that are generally widely added to a resin insulating film of semiconductor package.

<Shape>

From the viewpoint of protecting the conductive paths of the anisotropic conductive member, the thickness of the resin layer is more than the height of the protrusion portion of the conductive path and is preferably 1 μm to 5 μm.

<Transparent Insulator>

A transparent insulator is formed of a material having a visible transmittance of 80% or higher among the materials described in [Resin Layer]. Therefore, the detailed description of each of the materials will not be repeated.

It is preferable that a major component (polymer material) of the transparent insulator is the same as that of [Resin Layer] because adhesiveness between the transparent insulator and the resin layer is excellent.

Since the transparent insulator forms a portion where an electrode and the like are not formed, it is preferable that the transparent insulator does not include <Antioxidation Material> of {Resin Layer] and <Migration Inhibiting Material> of [Resin Layer].

In a case where the coefficient of linear expansion (CTE) of the transparent insulator is close to that of the support such as silicon, the warping of the anisotropic conductive material is low. Therefore, it is preferable that the transparent insulator does not include <Inorganic Filler> of [Resin Layer].

It is preferable that a polymer material and a curing agent of the transparent insulator are the same as those of [Resin Layer] because curing conditions such as a temperature and a time are the same.

Visible transmittance being 80% or higher represents that a light transmittance in a visible wavelength range of 400 to 800 nm is 80% or higher. The light transmittance is measured using "Plastics—Determination of Total Luminous Transmittance And Reflectance" defined by Japanese Industrial Standards (JIS) K 7375:2008.

[Method of Manufacturing Anisotropic Conductive Member]

A method of manufacturing the anisotropic conductive member is not particularly limited, and examples thereof include a method including: a conductive path forming step of forming conductive paths by causing a conductive material to be present in through holes provided in an insulating substrate; a trimming step of causing portions of the conductive paths to protrude by removing a part of only a surface of the insulating substrate after the conductive path forming step; and a resin layer forming step of forming a resin layer on the surface of the insulating substrate and the protrusion portions of the conductive paths after the trimming step.

[Preparation of Insulating Substrate]

As the insulating substrate, for example, a glass substrate (through glass via: TGV) having through holes can be used as it is. However, from the viewpoint of adjusting the opening size of the conductive path and the aspect ratio of the protrusion portion to be in the above-described ranges, a substrate that is formed by performing an anodic oxidation treatment on valve metal is preferable.

For example, in a case where the insulating substrate is an aluminum anodic oxidation film, the aluminum anodic oxidation film can be formed by performing an anodic oxidation treatment of anodically oxidizing an aluminum substrate and a penetration treatment of forming through-holes from micropores formed by the anodic oxidation to obtain the insulating substrate after the anodic oxidation treatment.

Regarding the aluminum substrate used for the preparation of the insulating substrate and each of the treatment steps that are performed on the aluminum substrate, the same conditions described in paragraphs "0041" to "0121" of JP2008-270158A can be adopted.

[Conductive Path Forming Step]

In the conductive path forming step, a conductive material is caused to be present in through holes provided in an insulating substrate.

Here, examples of a method of causing metal to be present in through holes include the same method as each method (an electroplating method or an electroless plating method) described in paragraphs "0123" to "0126" and FIG. 4 of JP2008-270158A.

In addition, in the electroplating method and the electroless plating method, it is preferable that an electrode layer formed of gold, nickel, copper, or the like is provided in advance. Examples of a method of forming the electrode layer include a gas phase treatment such as sputtering, a liquid phase treatment such as electroless plating, and a combination thereof.

Through a metal filling step, anisotropic conductive member on which the protrusion portions of the conductive paths are not formed is obtained.

On the other hand, instead of the method described in JP2008-270158A, the conductive path forming step may be performed using a method including: an anodic oxidation treatment step of anodically oxidizing one side surface (hereinafter, also referred to as "single surface") of an aluminum substrate to form an anodic oxidation film on the single surface of the aluminum substrate, the anodic oxidation film including micropores, which are present in a thickness direction, and a barrier layer which is present in a bottom portion of the micropores; a barrier layer removal step of removing the barrier layer of the anodic oxidation film after the anodic oxidation treatment step; a metal filling step of filling the inside of the micropores with metal through an electroplating treatment after the barrier layer removal step; and a substrate removal step of removing the aluminum substrate to obtain a metal-filled microstructure after the metal filling step.

<Anodic Oxidation Treatment Step>

In the anodic oxidation step, a single surface of the aluminum substrate is anodically oxidized to form an anodic oxidation film on the single surface of the aluminum substrate, the anodic oxidation film including micropores, which are present in a thickness direction, and a barrier layer which is present in a bottom portion of the micropores.

For the anodic oxidation treatment, a well-known method of the related art can be used, but it is preferable that a self-regulation method or a constant voltage treatment is used from the viewpoints of obtaining high regularity of micropore arrangement and securing the anisotropic conductivity.

Here, regarding the self-regulation method or the constant voltage treatment for the anodic oxidation treatment, the same treatment as each treatment described in paragraphs "0056" to "0108" and FIG. 3 of JP2008-270158A can be performed.

<Barrier Layer Removal Step>

In the barrier layer removal step, the barrier layer of the anodic oxidation film is removed after the anodic oxidation treatment step. By removing the barrier layer, a part of the aluminum substrate is exposed through the micropores.

A method of removing the barrier layer is not particularly limited, and examples thereof include a method of electrochemically dissolving the barrier layer at a potential lower than that in the anodic oxidation treatment of the anodic oxidation treatment step (hereinafter, also referred to as "electrolytic removal treatment"); a method of removing the barrier layer by etching (hereinafter, also referred to as "etching removal treatment"); and a combination of the above-described methods (in particular, a method of etching the barrier layer remaining after the electrolytic removal treatment).

<Electrolytic Removal Treatment>

The electrolytic removal treatment is not particularly limited as long as it is an electrolytic treatment which is performed at a potential (electrolytic potential) lower than that in the anodic oxidation treatment of the anodic oxidation treatment step.

The electrolytic dissolution treatment can be continuously performed after the anodic oxidation treatment by decreasing the electrolytic potential at the time of completion of the anodic oxidation treatment step.

In the electrolytic removal treatment, regarding conditions other than the electrolytic potential, the same electrolytic solution and treatment conditions as in the above-described well-known anodic oxidation treatment of the related art can be adopted.

In particular, in a case where the electrolytic removal treatment and the anodic oxidation treatment are continuously performed as described above, it is preferable that the same electrolytic solution is used during the treatments.

(Electrolytic Potential)

It is preferable that the electrolytic potential in the electrolytic removal treatment is decreased continuously or stepwise at a potential lower than that in the anodic oxidation treatment.

Here, in a case where the electrolytic potential is decreased stepwise, the decrease width (step width) is preferably 10 V or lower, more preferably 5 V or lower, and still more preferably 2 V or lower from the viewpoint of the withstand voltage of the barrier layer.

In addition, in a case where the electrolytic potential is decreased continuously or stepwise, the voltage decrease rate is preferably 1 V/sec or lower, more preferably 0.5 V/sec or lower, and still more preferably 0.2 V/sec or lower from the viewpoints of productivity and the like.

<Etching Removal Treatment>

The etching removal treatment is not particularly limited and may be a chemical etching treatment in which the battery layer is dissolved using an acid aqueous solution or an alkali aqueous solution or may be a dry etching treatment, (Chemical Etching Treatment)

During the removal of the barrier layer through the chemical etching treatment, for example, only the barrier layer can be selectively dissolved by bringing a surface of the anodic oxidation film on a micropore-opening side into contact with a pH (hydrogen ion exponent) buffer solution after dipping the structure having undergone the anodic oxidation treatment step in an acid aqueous solution or an alkali aqueous solution such that the inside of the micropores is filled with the acid aqueous solution and the alkali aqueous solution.

Here, in a case where the acid aqueous solution is used, it is preferable that an inorganic acid such as sulfuric acid, phosphoric acid, nitric acid, or hydrochloric acid or an aqueous solution of a mixture of the above inorganic acids is used. In addition, the concentration of the acid aqueous solution is preferably 1 mass % to 10 mass %. The temperature of the acid aqueous solution is preferably 15° C. to 80° C., more preferably 20° C. to 60° C., and still more preferably 30° C. to 50° C.

On the other hand, in a case where the alkali aqueous solution is used, it is preferable that an aqueous solution of at least one alkali selected from the group consisting of sodium hydroxide, potassium hydroxide, and lithium oxide is used. In addition, the concentration of the alkali aqueous solution is preferably 0.1 mass % to 5 mass %. The temperature of the alkali aqueous solution is preferably 10° C. to 60° C., more preferably 15° C. to 45° C., and still more preferably 20° C. to 35° C. The alkali aqueous solution may include zinc and other metal.

Specifically, for example, it is preferable that a phosphoric acid aqueous solution of 50 g/L and 40° C., a sodium hydroxide aqueous solution of 0.5 g/L and 30° C., or a potassium hydroxide aqueous solution of 0.5 g/L and 30° C. is used.

As the pH buffer solution, a buffer solution corresponding to the acid aqueous solution or the alkali aqueous solution can be appropriately used.

In addition, the time of dipping in the acid aqueous solution or the alkali aqueous solution is preferably 8 minutes to 120 minutes, more preferably 10 minutes to 90 minutes, and still more preferably 15 minutes to 60 minutes.

(Dry Etching Treatment)

In the dry etching treatment, for example, it is preferable that a gas species such as $Cl_2$/Ar mixed gas is used.

<Metal Filling Step>

In the metal filling step, the inside of the micropores in the anodic oxidation film is filled with metal through an electroplating treatment after the barrier layer removal step. Examples of the metal filling step include the same method as each method (an electroplating method or an electroless plating method) described in paragraphs "0123" to "0126" and FIG. 4 of JP2008-270158A.

In the electroplating method or the electroless plating method, the aluminum substrate that is exposed through the micropores after the barrier layer removal step can be used as an electrode.

<Substrate Removal Step>

In the substrate removal step, the aluminum substrate is removed to obtain a metal-filled microstructure after the metal filling step.

Examples of a method of removing the aluminum substrate include a method of dissolving only the aluminum substrate using a treatment liquid without dissolving the metal filled in the micropores in the metal filling step and the anodic oxidation film used as the insulating substrate.

Examples of the treatment liquid include an aqueous solution of mercury chloride, a bromine-methanol mixture, a bromine-ethanol mixture, aqua regia, a hydrochloric acid-copper chloride mixture, or the like. Among these, an aqueous solution of a hydrochloric acid-copper chloride mixture is preferable.

In addition, the concentration of the treatment liquid is preferably 0.01 mol/L to 10 mol/L and more preferably 0.05 mol/L to 5 mol/L.

In addition, the treatment temperature is preferably −10° C. to 80° C. and more preferably 0° C. to 60° C.

[Trimming Step]

In the trimming step, portions of the conductive paths are caused to protrude by removing a part of only a surface of the insulating substrate of the anisotropic conductive member after the conductive path forming step.

Here, the trimming treatment is not particularly limited as long as it is performed under conditions where the metal constituting the conductive paths is not dissolved. For example, in a case where the acid aqueous solution is used, it is preferable that an inorganic acid such as sulfuric acid, phosphoric acid, nitric acid, or hydrochloric acid or an aqueous solution of a mixture of the above inorganic acids is used. In particular, an aqueous solution not including chromic acid is preferable from the viewpoint of excellent safety. The concentration of the acid aqueous solution is preferably 1 mass % to 10 mass %. The temperature of the acid aqueous solution is preferably 25° C. to 60° C.

On the other hand, in a case where the alkali aqueous solution is used, it is preferable that an aqueous solution of at least one alkali selected from the group consisting of sodium hydroxide, potassium hydroxide, and lithium oxide is used. The concentration of the alkali aqueous solution is preferably 0.1 mass % to 5 mass %. The temperature of the alkali aqueous solution is preferably 20° C. to 50° C.

Specifically, for example, it is preferable that a phosphoric acid aqueous solution of 50 g/L and 40° C., a sodium hydroxide aqueous solution of 0.5 g/L and 30° C., or a potassium hydroxide aqueous solution of 0.5 g/L and 30° C. is used.

The time of dipping in the acid aqueous solution or the alkali aqueous solution is preferably 8 minutes to 120 minutes, more preferably 10 minutes to 90 minutes, and still more preferably 15 minutes to 60 minutes. Here, in a case where the short-term dipping treatment (trimming treatment) is repeated, the time of dipping represents the total time of all the dipping treatments. A cleaning treatment may be performed between the respective dipping treatments.

In a case where the height of the protrusion portion of the conductive path is strictly controlled in the trimming step, it is preferable that, after the conductive path forming step, the insulating substrate and the end portion of the conductive path are processed to have the same planar shape and then the insulating substrate is selectively removed (trimmed).

Here, examples of a method of processing the insulating substrate and the end portion of the conductive path to have the same planar shape include physical polishing (for example, free abrasive polishing, wafer backgrinding, a surface planar), electrochemical polishing, and a combination thereof.

In addition, after the conductive path forming step or the trimming step, a heating treatment can be performed in order to reduce strains in the conductive paths generated along with the metal filling.

From the viewpoint of suppressing oxidation of the metal, it is preferable that the heating treatment is performed in a reducing atmosphere. Specifically, it is preferable that the heating treatment is performed at an oxygen concentration of 20 Pa or lower, and it is more preferable that the heating treatment is performed in a vacuum. Here, the vacuum refers to a state where the gas density or the atmospheric pressure is lower than that of the air.

In addition, it is preferable that the heating treatment is performed while pressurizing the material.

[Resin Layer Forming Step]

In the resin layer forming step, a resin layer is formed on the surface of the insulating substrate and the protrusion portions of the conductive paths after the trimming step.

Here, examples of a method of forming the resin layer include a method including: applying a resin composition including the antioxidation material, the polymer material, and a solvent (for example, methyl ethyl ketone) to the surface of the insulating substrate and the protrusion portions of the conductive paths; drying the resin composition; and optionally calcinating the resin composition.

A method of applying the resin composition is not particularly limited. For example, a well-known coating method of the related art such as a gravure coating method, a reverse coating method, a die coating method, a blade coater, a roll coater, an air knife coater, a screen coater, a bar coater, or a curtain coater can be used.

In addition, a drying method after the application is not particularly limited, and examples thereof include a treatment of performing heating in the air at a temperature of 0° C. to 100° C. for several seconds to several tens of minutes and a treatment of performing heating under reduced pressure at a temperature of 0° C. to 80° C. for several tens of minutes to several hours.

In addition, a calcination method after drying is not particularly limited as long as it varies depending on the polymer material to be used. In a case where a polyimide resin is used, for example, a treatment of performing heating at a temperature of 160° C. to 240° C. for 2 minutes to 60 minutes can be used. In a case where an epoxy resin is used, for example, a treatment of performing heating at a temperature of 30° C. to 80° C. for 2 minutes to 60 minutes can be used.

In the manufacturing method, the above-described respective steps can also be performed per sheet, or can also be continuously performed on a web using aluminum coil as a raw sheet. In addition, in a case where the respective steps are continuously performed, it is preferable that a cleaning step and a drying step are appropriately performed between the respective steps.

Basically, the present invention is configured as described above. Hereinabove, the stacked device according to the embodiment of the present invention and the method of manufacturing the stacked device have been described in detail. However, the present invention is not limited to the above-described examples, and various improvements or modifications can be made within a range not departing from the scope of the present invention.

EXAMPLES

Hereinafter, the present invention will be described in detail using examples. Materials, chemicals, used amounts, material amounts, ratios, treatment details, treatment procedures, and the like shown in the following examples can be appropriately changed within a range not departing from the scope of the present invention. Accordingly, the scope of the present invention is not limited to the following specific examples.

In the examples, Examples 1 to 7 and Comparative Examples 1 to 8 were evaluated for bonding strength, heat dissipation, and reliability. The results of evaluating bonding strength, heat dissipation, and reliability are shown in Table 1 below.

Next, the bonding strength, the heat dissipation, and the reliability will be described.

The bonding strength was evaluated by measuring the shear strength using a multipurpose bond tester Dage-4000 (manufactured by Nordson Advanced Technology K.K.).

As the bonding strength, a bonding strength value per area of a semiconductor element was obtained from the obtained breaking load. The bonding strength was evaluated based on the following evaluation standards.

"A": 20 MPa≤bonding strength
"B": 10 MPa≤bonding strength<20 MPa
"D": bonding strength<10 MPa The heat dissipation was measured using a thermal conductivity measuring device TCM 1001 (trade name; manufactured by Rhesca Co., Ltd.) according to a steady state one-dimensional heat flow method and was evaluated using a laser flash method thermal constant measuring device TC-9000H (model number; manufactured by Advance Riko Inc.) according to a laser flash method.

In the evaluation of the heat dissipation, the average of the thermal conductivity values of a bonding portion measured using the steady state one-dimensional heat flow method and the laser flash method was used. Regarding the heat dissipation, the average value of thermal conductivity was evaluated based on the following evaluation standards.

"A": 100 W/(m·K)<thermal conductivity
"B": 10 W/(m·K)<thermal conductivity≤100 W/(m·K)
"D": 2 W/(m·K)<thermal conductivity≤10 W/(m·K)
"F": thermal conductivity≤2 W/(m·K)

Regarding the reliability, a temperature cycle test (TCT) was performed according to JESD22-A104 standard. The temperature range was set to be in −40° C. to 125° C., and Soak Mode 3 (each temperature holding time: 10 minutes) was set. The cycle time was set as 1 hour (1 cycle/hr). It is preferable that the reliability is 1 hour or longer.

After 1000 cycles of the test, the shear strength test and the heat dissipation test were performed under the above-described conditions. The reliability was evaluated based on the following evaluation standards.

"A": both of the evaluation of the shear strength test and the evaluation of the heat dissipation test were not changed
"B": any one of the evaluation of the shear strength test or the evaluation of the heat dissipation test deteriorated
"C": both of the evaluation of the shear strength test or the evaluation of the heat dissipation test deteriorated Hereinafter, Examples 1 to 7 and Comparative Examples 1 to 8 will be described.

Example 1

Figure 78:
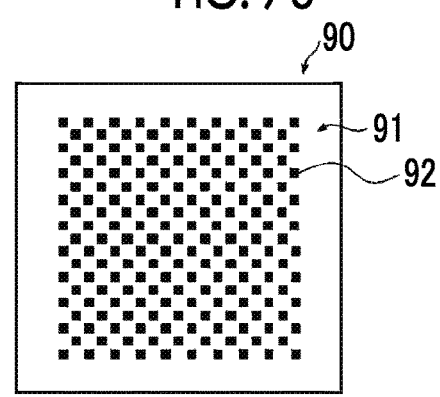
FIG. 78 is a schematic diagram illustrating a test substrate used in Examples.

In a test substrate 90 illustrated in FIG. 78, a silicon oxide insulating layer was formed on a surface of a silicon substrate, and terminals 92 were formed on the silicon oxide insulating layer as illustrated in FIG. 78 such that an area ratio of the terminals 92 on a surface 91 including the terminals 92 in a plan view was 45%. The terminals 92 were formed of copper.

The test substrate 90 was prepared through the following processes (i) to (vi).

(i) Using a photolithography method, a resist pattern of the terminals 92 was formed on the surface of the silicon substrate as illustrated in FIG. 78 such that the area ratio of the terminals 92 on the surface 91 including the terminals 92 in a plan view was 45%.

(ii) A sheet layer as a starting point of plating was provided in the resist opening (recess portion) of the resist pattern.

(iii) The resist opening was plated with metal.

(iv) The resist was stripped, and the terminals were arranged on the silicon substrate surface.

(v) A silicon oxide insulating layer was formed on the entire surface of the silicon substrate using a chemical vapor deposition (CVD) method.

(vi) The terminals were exposed and the surface was planarized by CMP polishing.

In Example 1, the two test substrates 90 illustrated in FIG. 78 were bonded using direct bond interconnect (DBI). In Example 1, an area ratio of terminals that were electrically connected to each other among the terminals 92 was 40%.

During bonding, by performing CMP polishing on bonding surfaces of the test substrate 90, the surfaces were planarized. The upper and lower test substrates 90 were aligned using alignment marks (not illustrated) provided around the test substrates 90, the bonding surfaces were pressurized at a pressure of 200 MPa, and the test substrates 90 were held in this state at a temperature of 300° C. for 2 hours.

"Recess Amount: 0" shown in the column "Recess Amount" of the following Table 1 refers to a state where the silicon oxide insulating layer including the terminals was polished such that the terminals and the silicon oxide insulating layer were flush with each other. Specifically, "Recess Amount: 0" refers to a state where as illustrated in FIG. 4, the end surfaces 30c of the terminals 30a and the end surfaces 30c of the terminals 30b matched the surface 36a of the passivation layer 36.

In the recess treatment, only the silicon oxide insulating layer was removed by dry etching using fluorine gas such that the terminals protruded. By changing the treatment time of dry etching of the recess treatment, the recess amount was controlled.

Example 2

Example 2 was the same as Example 1, except that the bonding configuration was surface activated bond (SAB).

Example 3

Example 3 was the same as Example 1, except that the recess amount was 80 nm, the bonding configuration was SAB, a sealing resin was used during the bonding of the test substrates 90. As described above, by changing the treatment time of dry etching, the recess amount was controlled. The sealing resin will be described below in detail.

Example 4

Example 4 was the same as Example 1, except that the recess amount was 200 nm, the bonding configuration was SAB, a sealing resin was used during the bonding of the test substrates 90. As described above, by changing the treatment time of dry etching, the recess amount was controlled.

Example 5

Example 5 was the same as Example 1, except that the recess amount was 200 nm, the test substrates 90 were bonded through the anisotropic conductive member, and a sealing resin was used during the bonding of the test substrates 90. As described above, by changing the treatment time of dry etching, the recess amount was controlled.

Example 61

Example 6 was the same as Example 1, except that the recess amount was 200 nm, the test substrates 90 were bonded through the anisotropic conductive member, the number of stacked layers was 5, and a sealing resin was used during the bonding of the test substrates 90. As described above, by changing the treatment time of dry etching, the recess amount was controlled.

Example 7

Example 7 was the same as Example 1, except that the recess amount was 800 nm, the test substrates 90 were bonded through the anisotropic conductive member, and a sealing resin was used during the bonding of the test substrates 90. As described above, by changing the treatment time of dry etching, the recess amount was controlled.

Comparative Example 1

Figure 79:
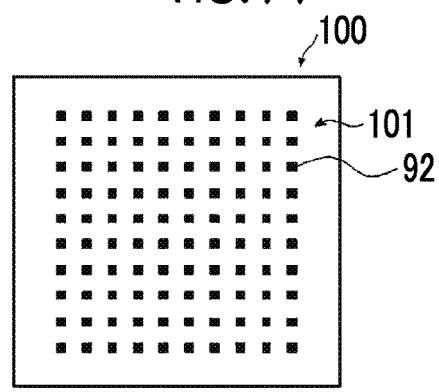
FIG. 79 is a schematic diagram illustrating a test substrate used in Comparative Examples.

In Comparative Example 1, two test substrates 100 illustrated in FIG. 79 were bonded using a solder. The test substrate 100 illustrated in FIG. 79 has the same configuration as that of the test substrate 90 illustrated in FIG. 78, except that an area ratio of the terminals 92 on a surface 101 including the terminals 92 in a plan view was 23%. In Comparative Example 1, the recess amount was 5 μm. As described above, by changing the treatment time of dry etching, the recess amount was controlled. In Comparative Example 1, an area ratio of terminals that were electrically connected to each other among the terminals 92 was 80%.

The test substrate 100 was prepared through the preparation processes (i) to (vi) of the test substrate 90, except that the area ratio of the terminals 92 on the surface 101 including the terminals 92 in a plan view was 23% in the preparation process (i) of the test substrate 90.

Comparative Example 2

Comparative Example 2 was the same as Comparative Example 1, except that a sealing resin was used during the bonding of the test substrates 100.

Comparative Example 3

Comparative Example 3 was the same as Example 2, except that the test substrates 100 were used and the area ratio of the terminals was 80%.

Comparative Example 4

Comparative Example 4 was the same as Example 1, except that the test substrates 100 were used and the area ratio of the terminals was 80%.

Comparative Example 5

Comparative Example 5 was the same as Example 5, except that the test substrates 100 were used and the area ratio of the terminals was 80%.

Comparative Example 6

Comparative Example 6 was the same as Example 5, except that a test substrate in which the area ratio of the terminals 92 on the surface 101 including the terminals 92 in a plan view was 35% was used and the area ratio of the terminals was 52%.

The test substrate in which the area ratio of the terminals 92 was 35% was prepared through the preparation processes (i) to (vi) of the test substrate 90, except that the area ratio of the terminals 92 was 35% in the preparation process (i) of the test substrate 90.

Comparative Example 7

Comparative Example 7 was the same as Example 5, except that a test substrate in which the area ratio of the terminals 92 on the surface 101 including the terminals 92 in a plan view was 45% was used and the area ratio of the terminals 92 was 52%.

The test substrate in which the area ratio of the terminals 92 was 45% was prepared through the preparation processes (i) to (vi) of the test substrate 90, except that the area ratio of the terminals 92 was 45% in the preparation process (i) of the test substrate 90.

Comparative Example 8

Comparative Example 8 was the same as Example 5, except that the test substrates 100 were used.

Hereinafter, the anisotropic conductive member will be described.

[Anisotropic Conductive Member]

<Preparation of Aluminum Substrate>

Molten metal was prepared using an aluminum alloy containing Si: 0.06 mass %, Fe: 0.30 mass %, Cu: 0.005 mass %, Mn: 0.001 mass %, Mg: 0.001 mass %, Zn: 0.001 mass %, Ti: 0.03 mass %, and a balance including Al and unavoidable impurities. Next, after the molten metal treatment and filtering, an ingot having a thickness of 500 nm and a width of 1200 mm was prepared using a DC casting method.

Next, the surface was cut off using a surface cutting machine to have an average thickness of 10 mm, the ingot was soaked and held at 550° C. for about 5 hours. In a case where the temperature decreased to 400° C., the ingot was rolled using a hot rolling mill to obtain a rolled sheet having a thickness of 2.7 mm.

Further, after a heat treatment was performed at 500° C. using a continuous annealing machine, the rolled sheet was finished by cold rolling to have a thickness of 1.0 mm. As a result, a JIS 1050 aluminum substrate was obtained.

The aluminum substrate was formed on a wafer having a diameter of 200 mm (8 inch), and the following respective treatments were performed thereon.

<Electrolytic Polishing Treatment>

An electrolytic polishing treatment was performed on the aluminum substrate using an electrolytic polishing solution having the following composition under conditions of voltage: 25 V, liquid temperature: 65° C., and liquid flow rate: 3.0 m/min.

A carbon electrode was used as a negative electrode, and GP0110-30R (manufactured by Takasago Ltd.) was used as a power supply. In addition, the flow rate of the electrolytic solution was measured using a vortex flow monitor FLM22-10PCW (manufactured by As One Corporation).

(Composition of Electrolytic Polishing Solution)

85 mass % phosphoric acid (manufactured by Wako Pure Chemical ndustries, Ltd.): 660 mL Pure water: 160 mL Sulfuric acid: 150 mL Ethylene glycol: 30 mL <Anodic Oxidation Treatment Step>

Next, an anodic oxidation treatment was performed on the aluminum substrate having undergone the electrolytic polishing treatment using a self-regulation method according to the procedure described in JP2007-204802A.

A pre-anodic oxidation treatment was performed on the aluminum substrate having undergone the electrolytic polishing treatment for 5 hours using an electrolytic solution of 0.50 mol/L of oxalic acid under conditions of voltage: 40 V, liquid temperature: 16° C., and liquid flow rate: 3.0 m/min.

Next, a film removal treatment of dipping the aluminum substrate having undergone the pre-anodic oxidation treatment in a mixed aqueous solution (liquid temperature: 50° C.) of 0.2 mol/L of chromic anhydride and 0.6 mol/L of phosphoric acid for 12 hours was performed.

Next, a re-anodic oxidation treatment was performed on the aluminum substrate having undergone the electrolytic polishing treatment for 3 hours 45 minutes using an electrolytic solution of 0.50 mol/L of oxalic acid under conditions of voltage: 40 V, liquid temperature: 16° C., and liquid flow rate: 3.0 m/min. As a result, an anodic oxidation film having a thickness of 30 μm was obtained.

In the pre-anodic oxidation treatment and the re-anodic oxidation treatment, a stainless steel electrode was used as a negative electrode, and GP0110-30R (manufactured by Takasago Ltd.) was used as a power supply. In addition, NEOCOOL BD36 (manufactured by Yamato Scientific Co., Ltd.) was used as a cooling device, and PAIR STIRRER PS-100 (manufactured by Tokyo Rikakikai Co., LTD.) was used as a stirring heating device. Further, the flow rate of the electrolytic solution was measured using a vortex flow monitor FLM22-10PCW (manufactured by As One Corporation).

<Barrier Layer Removal Step>

Next, using the same treatment liquid as in the anodic oxidation treatment under the same conditions as in the anodic oxidation treatment, an electrolytic treatment (electrolytic removal treatment) was performed while continuously decreasing the voltage from 40 V to 0V at a voltage decrease rate of 0.2 V/sec.

Next, an etching treatment (etching removal treatment) of dipping the anodic oxidation film in 5 mass % phosphoric acid at 30° C. for 30 minutes was performed. As a result, a barrier layer present in a bottom portion of micropores of the anodic oxidation film was removed, and aluminum was exposed through the micropores.

Here, the average opening size of the micropores present in the anodic oxidation film having undergone the barrier layer removal step was 60 nm. The average opening size was calculated as the average value of opening sizes measured at 50 positions after obtaining a surface image (magnification: 50,000 times) with a field emission scanning electron microscope (FE-SEM).

In addition, the average thickness of the anodic oxidation film having undergone the barrier layer removal step was 80 μm. The average thickness was calculated as the average value of thicknesses measured at 10 positions after cutting the anodic oxidation film with a focused ion beam (FIB) in a thickness direction and obtaining a surface image (magnification: 50,000 times) of a cross-section thereof with FE-SEM.

In addition, the density of the micropores present in the anodic oxidation film was about 100,000,000 pieces/mm². The density of the micropores was measured and calculated using a method described in paragraphs "0168" and "0169" of JP2008-270158A.

In addition, the degree of regularity of the micropores present in the anodic oxidation film was 92%. The degree of regularity was measured and calculated using a method described in paragraphs "0024" to "0027" of JP2008-270158A after obtaining a surface image (magnification: 20,000 times) with FE-SEM.

<Metal Filling Step>

Next, an electroplating treatment was performed by using the aluminum substrate as a negative electrode and using platinum as a positive electrode.

Specifically, constant-current electrolysis was performed using a copper plating solution having the following composition. As a result, a metal-filled microstructure was manufactured in which the inside of the micropores was filled with copper.

Here, the constant-current electrolysis was performed using a plating device (manufactured by Yamamoto-MS Co., Ltd.) and a power supply (HZ-3000, manufactured by Hokuto Denko Corp.) under the following conditions after performing cyclic voltammetry in the plating solution.

(Composition of Copper Plating Solution and Conditions)
Copper sulfate: 100 g/L
Sulfuric acid: 50 g/L
Hydrochloric acid: 15 g/L
Temperature: 25° C.
Current density: 10 A/dm²

The surface of the anodic oxidation film in which the micropores were filled with the metal was observed with FE-SEM, and whether or not 1000 micropores were sealed with the metal was determined to calculate a pore sealing ratio (the number of sealed micropores/1000). At this time the pre sealing ratio was 96%.

In addition, the anodic oxidation film in which the micropores were filled with the metal was cut using FIB in a thickness direction, a surface image (magnification: 50,000 times) of a cross-section was obtained with FE-SEM, and the inside of the micropores was observed. At this time, it was found that the inside of the sealed micropores was completely filled with the metal.

<Substrate Removal Step>

Next, the aluminum substrate was removed by dissolution by being dipped in 20 mass % mercury chloride aqueous solution (corrosive sublimate) at 20° C. for 3 hours. As a result, a metal-filled microstructure was manufactured.

<Trimming Step>

The metal-filled microstructure having undergone the substrate removal step was dipped in a sodium hydroxide aqueous solution (concentration: 5 mass %, liquid temperature: 20° C.), the time of dipping was adjusted such that the height of the protrusion portion was 500 nm, and the surface of the aluminum anodic oxidation film was selectively dissolved. Next, the metal-filled microstructure was cleaned with water and dried. As a result, a structure in which copper columns as conductive paths protruded was prepared.

<Adhesive Layer Forming Step>

By forming an adhesive layer on the structure having undergone the trimming step using the following method, an anisotropic conductive member was prepared.

<Adhesive Layer>

As a commercially available product of a polyamide acid ester solution (including dimethyl sulfoxide, trialkoxyamide carboxysilane, and an oxime derivative) in which gamma-butyrolactone was used as a solvent, LTC 9320 (manufactured by Fujifilm Electronic Materials Co., Ltd.) was used.

This solution was applied to the surface of the insulating substrate in which the conductive paths protruded, and was dried to form a film. Next, by causing an imidization reaction to progress in a nitrogen-purged reaction furnace (oxygen concentration: 10 ppm or lower) at 200° C. for 3 hours, an adhesive layer formed of a polyimide resin layer and having a thickness of 500 nm was formed. By adding a solvent (methyl ethyl ketone), the thickness of the adhesive layer was adjusted. The average thickness of the manufactured metal-filled microstructure excluding the resin layer was 30 μm.

Next, the sealing resin will be described.

<Sealing Resin>

The following components were dissolved in methyl ethyl ketone at the following ratio to prepare a resin layer coating solution having a concentration of solid contents of 60.6 wt %. During the formation of the sealing resin, the resin layer coating solution was diluted and used.

The resin layer coating solution was applied to a surface of the adhesive layer and was dried to form a sealing resin.

The thickness of the sealing resin was adjusted to 1 μm by further adding a solvent (methyl ethyl ketone) to a coating solution having the following formula.

In addition, after the application, the coating solution was dried under a reduced pressure of 400 mmHg (53.3 kPa) at a temperature of 50° C.

<Coating Solution Composition>

Elastomer an acrylic acid ester polymer (trade name: SG-28GM, manufactured by Nagase ChemteX Corporation) including a butyl acrylate-acrylonitrile copolymer as a major component: 5 parts by mass Epoxy resin 1: jER (registered trade name) 828 (manufactured by Mitsubishi Chemical Corporation), 33 parts by mass Epoxy resin 2: jER (registered trade name) 1004 (manufactured by Mitsubishi Chemical Corporation), 11 parts by mass Phenol resin: MILEX XLC-4L (manufactured by Mitsui Chemicals Inc.), 44 parts by mass Organic acid: o-anisic acid (ortho-anisic acid, manufactured by Tokyo Chemical Industry Co., Ltd.), 0.5 parts by mass Antioxidation material: refer to the following
Migration inhibiting material: refer to the following
Inorganic filler: refer to the following
Curing agent: refer to the following (Antioxidation Material)

As the antioxidation material, 0.01 mass % of 2-mercaptobenzothiazole was blended.

(Migration Inhibiting Material)

As the migration inhibiting material, 2.5 mass % of "IXE-100" (trade name, manufactured by Toagosei Co., Ltd.; median size: 1 μm, cation exchange, heat-resistance temperature: 550° C.) was blended.

(Inorganic Filler)

As the inorganic filler. 55 mass % of aluminum nitride nanoparticles (average particle size: 100 nm, manufactured by Sigma-Aldrich Co., Llc.) was blended.

(Curing Agent)

As the curing agent, 0.5 mass % of 1-cyano-2-ethyl-4-methyl imidazole (2E4MZ-CN, manufactured by Shikoku Chemicals Corporation) was blended.

TABLE 1

| | Area Ratio | Area Ratio | Recess Amount | Sealing Resin | Bonding Configuration | Number of Stacked Layers | Bonding Strength | Heat Dissipation | Reliabiltiy |
|---|---|---|---|---|---|---|---|---|---|
| Example 1 | 45% | 40% | 0 | Not Provided | DBI | 2 | A | A | B |
| Example 2 | 45% | 40% | 0 | Not Provided | SAB | 2 | A | A | B |
| Example 3 | 45% | 40% | 80 nm | Provided | SAB | 2 | B | B | C |
| Example 4 | 45% | 40% | 200 nm | Provided | SAB | 2 | B | B | A |
| Example 5 | 45% | 40% | 200 nm | Provided | Anisotropic Conductive Member | 2 | B | B | A |
| Example 6 | 45% | 40% | 200 nm | Provided | Anisotropic Conductive Member | 5 | B | B | A |
| Example 7 | 45% | 40% | 800 nm | Provided | Anisotropic Conductive Member | 2 | B | B | A |
| Comparative Example 1 | 23% | 80% | 5 μm | Not Provided | Solder Bonding | 2 | D | F | A |
| Comparative Example 2 | 23% | 80% | 5 μm | Provided | Solder Bonding | 2 | A | F | A |
| Comparative Example 3 | 23% | 80% | 0 | Not Provided | SAB | 2 | B | D | C |
| Comparative Example 4 | 23% | 80% | 0 | Not Provided | DBI | 2 | A | D | C |
| Comparative Example 5 | 23% | 80% | 200 nm | Provided | Anisotropic Conductive Member | 2 | D | B | A |
| Comparative Example 6 | 35% | 52% | 200 nm | Provided | Anisotropic Conductive Member | 2 | D | D | A |
| Comparative Example 7 | 45% | 52% | 200 nm | Provided | Anisotropic Conductive Member | 2 | B | D | A |
| Comparative Example 8 | 23% | 40% | 200 nm | Provided | Anisotropic Conductive Member | 2 | D | B | A |

As shown in Table 1, in Examples 1 to 7, excellent results were able to be obtained for the bonding strength, the heat dissipation, and the reliability as compared to Comparative Examples 1 to 8.

EXPLANATION OF REFERENCES

10: stacked device
12: semiconductor element
14: semiconductor element
14a: surface
14b: back surface
15, 17, 19, 57: stacked structure
16: semiconductor element
16a: surface
18: interposer
20: anisotropic conductive member
30: terminal
30a: terminal
30b: terminal
30c: end surface
31, 91, 101: surface
32: semiconductor layer
32a: surface
34: re-distribution layer
34a: surface
36: passivation layer
36a: surface
37: wiring
38: pad
39: resin layer
40: insulating substrate
40a: surface
42: conductive path
42a: protrusion portion
42b: protrusion portion
44: resin layer
46: support
47: release layer
48: support layer
49: release agent
50: anisotropic conductive material
52: semiconductor element
54: sensor chip
56: lens
60: first semiconductor wafer
60a: surface
61: optical waveguide
62: second semiconductor wafer
62a: surface
62b: back surface
63, 64, 65, 69, 69a: stacked device
66, 67, 71: semiconductor element
68: electrode
70: first stacked substrate
72: semiconductor wafer
72a: surface
74: 3D bonding structure
75: light-emitting element
76: light-receiving element
80: second stacked substrate
82: second substrate
82a, 88a: surface
84: release functional layer
85, 89: hydrophilic or hydrophobic film
86: third complex stacked structure
88: third substrate
89: hydrophilic or hydrophobic film
90: test substrate
92: terminal
100: test substrate
110: re-distribution layer
112: wafer
120: organic substrate
Ds: stacking direction
Ld: outgoing light
Lo: light
h: thickness
x: direction
Z: thickness direction
δ: recess amount

What is claimed is:

1. A stacked device comprising:
a stacked structure in which a plurality of semiconductors are electrically connected to each other,
wherein the semiconductor includes a surface on which a plurality of terminals are provided,
the plurality of terminals include terminals that bond and electrically connect the semiconductors to each other and terminals that bond the semiconductors to each other and do not electrically connect the semiconductors to each other,
the terminals that bond and electrically connect the semiconductors to each other are directly connected to each other,
the terminals that bond the semiconductors to each other and do not electrically connect the semiconductors to each other are directly connected each other,
the semiconductor includes an insulating layer on the surface, the plurality of terminals are formed on the insulating layer,
an area ratio of the plurality of terminals on the surface of the semiconductor is 40% or higher, and
an area ratio of the terminals that bond and electrically connect the semiconductors to each other among the plurality of terminals is lower than 50%.

2. The stacked device according to claim 1,
wherein
a height from the surface of the semiconductor to a surface of the terminal is higher than a height from the surface of the semiconductor to a surface of the insulating layer by 200 nm to 1 µm.

3. The stacked device according to claim 1,
wherein the plurality of terminals are bonded through an anisotropic conductive member having a conductive path that extends in a stacking direction, and
the conductive path has a diameter of 100 nm or less.

4. The stacked device according to claim 3,
wherein the anisotropic conductive member includes an insulating substrate and plural of the conductive paths that penetrate the insulating substrate in a thickness direction and are provided in a state where the conductive paths are electrically insulated from each other.

5. The stacked device according to claim 1, further comprising:
an interposer.

6. A stacked structure comprising:
a plurality of semiconductors that are electrically connected to each other,
wherein the semiconductor includes a surface on which a plurality of terminals are provided,
the plurality of terminals include terminals that bond and electrically connect the semiconductors to each other and terminals that bond the semiconductors to each other and do not electrically connect the semiconductors to each other, the terminals that bond and electrically connect the semiconductors to each other are directly connected to each other, the terminals that bond the semiconductors to each other and do not electrically connect the semiconductors to each other are directly connected each other, the semiconductor includes an insulating layer on the surface, the plurality of terminals are formed on the insulating layer, an area ratio of the plurality of terminals on the surface of the semiconductor is 40% or higher, and an area ratio of the terminals that bond and electrically connect the semiconductors to each other among the plurality of terminals is lower than 50%.

7. The stacked structure according to claim 6,
wherein
a height from the surface of the semiconductor to a surface of the terminal is higher than a height from the surface of the semiconductor to a surface of the insulating layer by 200 nm to 1 µm.

8. The stacked structure according to claim 6,
wherein the plurality of terminals are bonded through an anisotropic conductive member having a conductive path that extends in a stacking direction, and
the conductive path has a diameter of 100 nm or less.

9. The stacked structure according to claim 8,
wherein the anisotropic conductive member includes an insulating substrate and plural of the conductive paths that penetrate the insulating substrate in a thickness direction and are provided in a state where the conductive paths are electrically insulated from each other.

10. The stacked structure according to claim 6, further comprising:
an interposer.

11. A method of manufacturing the stacked device according to claim 1, the method comprising:
temporarily bonding the respective semiconductors; and
collectively bonding all the semiconductors.

\* \* \* \* \*